(12) United States Patent
Mochizuki et al.

(10) Patent No.: US 9,171,942 B2
(45) Date of Patent: Oct. 27, 2015

(54) SEMICONDUCTOR ELEMENT MANUFACTURING METHOD

(71) Applicant: FUJIFILM Corporation, Minato-Ku, Tokyo (JP)

(72) Inventors: Fumihiko Mochizuki, Kanagawa (JP); Masahiro Takata, Kanagawa (JP); Masashi Ono, Kanagawa (JP); Atsushi Tanaka, Kanagawa (JP); Masayuki Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/158,461

(22) Filed: Jan. 17, 2014

(65) Prior Publication Data
US 2014/0134795 A1      May 15, 2014

Related U.S. Application Data

(63) Continuation of application No. PCT/JP2012/065615, filed on Jun. 19, 2012.

(30) Foreign Application Priority Data

Jul. 29, 2011   (JP) ................. 2011-167092

(51) Int. Cl.
*H01L 21/31*        (2006.01)
*H01L 29/66*        (2006.01)
(Continued)

(52) U.S. Cl.
CPC .... *H01L 29/66969* (2013.01); *H01L 21/02565* (2013.01); *H01L 27/1225* (2013.01);
(Continued)

(58) Field of Classification Search
CPC ................. H01L 21/31695; H01L 21/76801; H01L 21/312; H01L 21/7682; H01L 23/5329
USPC ..................... 438/70, 781, 770, 785
See application file for complete search history.

(56) References Cited

U.S. PATENT DOCUMENTS 8,420,553 B2 * 4/2013 Yamazaki ............. 438/787
2010/0065844 A1   3/2010 Tokunaga
(Continued)

FOREIGN PATENT DOCUMENTS

JP   2010-73894 A    4/2010
JP   2010-183027 A   8/2010
(Continued)

OTHER PUBLICATIONS

Written Opinion, mailed Aug. 7, 2012, issued in corresponding International Application No. PCT/JP2012/065615, 10 pages in English and Japanese.
(Continued)

*Primary Examiner* — Quoc Hoang
(74) *Attorney, Agent, or Firm* — Sughrue Mion, PLLC

(57) ABSTRACT

There is provided a method of manufacturing a semiconductor element including: forming a semiconductor film of which a principal constituent is an oxide semiconductor; forming a first insulation film on a surface of the semiconductor film; applying a heat treatment in an oxidizing atmosphere; and, forming a second insulation film on a surface of the first insulation film, wherein a thickness of the first insulation film and a temperature of the heat treatment in the third step are adjusted such that, if the thickness of the first insulation film is represented by Z (nm), the heat treatment temperature is represented by T (°C.) and a diffusion distance of oxygen into the first insulation film and the semiconductor film is represented by L (nm), the relational expression $0 < Z < L = 8 \times 10^{-6} \times T^3 - 0.0092 \times T^2 + 3.6 \times T - 468 \pm 0.1$ is satisfied.

23 Claims, 35 Drawing Sheets

(51) Int. Cl.
  *H01L 29/786* (2006.01)
  *H01L 27/12* (2006.01)
  *H01L 27/146* (2006.01)
  *H01L 21/02* (2006.01)
  *H01L 27/148* (2006.01)
  *H01L 27/32* (2006.01)

(52) U.S. Cl.
  CPC .... *H01L27/14614* (2013.01); *H01L 27/14632* (2013.01); *H01L 27/14659* (2013.01); *H01L 27/14687* (2013.01); *H01L 29/7869* (2013.01); *H01L 27/148* (2013.01); *H01L 27/3262* (2013.01)

(56) References Cited

U.S. PATENT DOCUMENTS

| | | |
|---|---|---|
| 2011/0059575 A1 | 3/2011 | Tsubuku et al. |
| 2011/0133179 A1 | 6/2011 | Yamazaki |
| 2011/0133706 A1 | 6/2011 | Takahashi et al. |
| 2011/0136301 A1 | 6/2011 | Yamazaki et al. |
| 2013/0237013 A1 | 9/2013 | Yamazaki |

FOREIGN PATENT DOCUMENTS

| | | |
|---|---|---|
| JP | 2011-49550 A | 3/2011 |
| JP | 2011-77514 A | 4/2011 |
| JP | 2011-119706 A | 6/2011 |
| JP | 2011-139050 A | 7/2011 |
| JP | 2011-139627 A | 7/2011 |
| JP | 2011142309 A | 7/2011 |
| WO | 2011/001715 A1 | 1/2011 |

OTHER PUBLICATIONS

International Search Report, mailed Aug. 7, 2012, issued in corresponding International Application No. PCT/JP2012/065615, 2 pages in English.

Gekkan Display, Jan. 2011, vol. 17, No. 1, "Recent Trends and Prospects of Oxide Thin Film Transistors".

Office Action for corresponding JP Application No. 2011-167092 dated Nov. 29, 2011.

Notification of Submission of Examination Opinion, dated Aug. 22, 2015, issued in corresponding KR Application No. 10-2014-7001831, 10 pages in English and Korean.

* cited by examiner

SEMICONDUCTOR ELEMENT MANUFACTURING METHOD

CROSS-REFERENCE TO RELATED APPLICATIONS

This application is a continuation application of International Application No. PCT/JP2012/065615, filed Jun. 19, 2012, the disclosure of which is incorporated herein by reference in its entirety. Further, this application claims priority from Japanese Patent Application No. 2011-167092, filed Jul. 29, 2011, the disclosure of which is incorporated herein by reference in its entirety.

TECHNICAL FIELD

The present invention relates to a manufacturing method of a semiconductor element and a manufacturing method of a field effect transistor.

RELATED ART

In recent years, research into semiconductor elements that use oxide semiconductors, such as field effect transistors, diodes and the like, has been vigorously pursued. Among these semiconductor elements, field effect transistors are used as unit components of semiconductor memory integrated circuits, high-frequency signal amplification components, liquid crystal driving components and so forth. In particular, small-thickness field effect transistors are used as thin film transistors (TFT) in a wide range of fields.

Conventionally, silicon semiconductors and compounds thereof are often used for semiconductor channel layers (active layers) that structure field effect transistors. Monocrystalline silicon is satisfactory for high-frequency amplification components, integrated circuits and the like requiring high-speed operations, and for low-speed operations. Meanwhile, amorphous silicon is used for liquid crystal-driving devices that must be able to handle increases in area in display applications and the like. However, the capabilities of amorphous silicon are being outstripped by increases in size and definition, and TFT characteristics are being called for. Attention has also been focused in recent years on flexible displays, which are light in weight and can be curved. Resin substrates with high flexibility are principally used for flexible devices, and processes with lower temperatures than liquid crystal display processes (400° C.) are required.

In this context, In—Ga—Zn—O compounds (denoted by "IGZO" hereinafter) have been reported by Hosono et al. of Tokyo Institute of Technology as being oxide semiconductors that have better electronic characteristics than amorphous silicon and that can be manufactured by liquid crystal processes or low-temperature processes. IGZO is considered to have promise as a material for semiconductor elements for next-generation displays, and research and development toward the practical application of IGZO is being vigorously pursued by universities and manufacturers around the world. The features sought in semiconductor elements, particularly TFTs, include mobility, S-value, Vth and so forth. However, a major issue for practical applications is the property $\Delta$Vth during TFT operations (a threshold voltage shift, measured in volts). This is because oxides such as IGZO and the like have low endurance with respect to moisture, oxygen, contaminants and the like, which, in an active layer whose principal constituent is an oxide such as IGZO or the like, is a cause of the oxide deteriorating over time if exposed to the atmosphere.

Accordingly, in recent years, $\Delta$Vth has been suppressed by the formation of a protective layer on an exposed surface of an active layer whose principal constituent is IGZO, protecting the active layer from moisture and the like. That is, a protective layer is regarded as necessary for an oxide such as IGZO or the like to be reliably used as an active layer. Even in a top gate-type TFT, a gate insulation layer over the active layer is required to also function as a protective layer for the active layer.

However, when a protective layer is formed on the exposed surface of an active layer, $\Delta$Vth assumes a larger value when light is illuminated onto the active layer than during usual operations of the TFT (see Table 2 in Non-patent Reference 1: Gekkan Display, January 2011, Vol. 17, No. 1, "Sankabutsu TFT no saikin no doukou to tenbou" (trans. "Recent Trends and Prospects of Oxide Thin Film Transistors")), and there are serious questions about the stability of element characteristics such as $\Delta$Vth and the like during light illumination.

Patent Reference 1 (Japanese Patent Application Laid-Open (JP-A) No. 2010-183027) discloses a manufacturing method for a bottom gate-type TFT, in which a protective layer with a thickness of 200 µm is formed using sputtering on a portion of an exposed surface of an active layer that is formed of an IGZO film, source and drain electrodes including aperture portions are formed on other portions of the exposed surface of the active layer, and then an interlayer insulation film with a thickness of 300 nm is formed. In this manufacturing method, oxygen annealing (a heat treatment) is applied after the source and drain electrodes have been formed and before the interlayer insulation film is formed, under conditions of, for example, 300° C. in an atmosphere with a nitrogen concentration of 60% and an oxygen concentration of 40%. Thus, oxygen is supplied through the aperture portions and exposed portions of the active layer to deficient regions in which there is insufficient oxygen in the active layer or oxygen has desorbed, and the characteristics of the TFT are re-established.

Patent Reference 2 (JP-A No. 2011-49550) discloses, in a manufacturing method for a bottom gate-type TFT, a state in which at least a portion of an active layer that is formed of an IGZO film has an excess of oxygen, due to a heat treatment being applied in a state in which a portion of the active layer is exposed to an oxidizing atmosphere. This heat treatment is applied after an oxide insulation film with a thickness of at least 1 nm is formed using sputtering on a portion of an exposed surface of the active layer and before a protective insulation layer disposed over the oxide insulation film is formed.

Patent Reference 3 (WO2011/001715) discloses, in a manufacturing method for a bottom gate-type TFT, oxygen being resupplied through a protective layer to an active layer that is formed of an IGZO film, to control the oxygen content of the active layer, by a heat treatment at 220° C. or above being applied. This heat treatment is applied after the protective layer has been formed to a thickness of 100 to 700 nm using chemical vapor deposition (CVD) over the whole of an exposed surface of the active layer and before an interlayer insulation film disposed over the protective layer is formed.

As described above, a protective layer, or a gate insulation layer that also functions as a protective layer, on an exposed surface of an active layer is described as being necessary. However, the exposed surface of the active layer may be damaged by the formation of this protective layer, as a result of which surface defects may be produced that affect the value of $\Delta$Vth during light illumination. Surface defects may also be produced by etching damage, physical damage and the like when the active layer is being formed. In film formation, if a technique such as sputtering or CVD that produces plasma is used with a view to productivity and/or barrier properties, the exposed surface of the active layer is particularly susceptible to damage from the plasma, as a result of which surface defects are more numerous.

Applying a heat treatment after a protective layer has been formed in a manufacturing process, as recited in Patent References 1 to 3, is thought to be effective for repairing these surface defects.

However, in the manufacturing method of Patent Reference 1, although oxygen is supplied through the aperture portions and exposed portions of the active layer to the active layer in the heat treatment, the surface of the active layer that has been damaged by plasma in the formation of the protective layer has been covered with the 200 nm thick protective layer. Therefore, oxygen does not reach this surface in a heat treatment at around 300° C., and the surface defects in the surface of the active layer damaged by plasma may not be rectified. Therefore, it is likely that ΔVth during light illumination will not be improved even by supplying oxygen to the surface of the active layer at regions other than regions of the active layer surface damaged by plasma. In addition, because the interlayer insulation film is formed at least at the aperture portions after the heat treatment, the surface of the active layer exposed through the aperture portions may be damaged by the formation of the interlayer insulation film, and the number of surface defects may increase.

For the manufacturing method of Patent Reference 2, when the heat treatment in an oxidizing atmosphere is to be applied, there is no discussion of the temperature of the heat treatment. Moreover, the film thickness of the oxide insulation film is not discussed apart from being at least 1 nm, which is a very broad range. Nor is there any discussion of a relationship between the heat treatment temperature and the film thickness of the oxide insulation film. The surface of the active layer damaged by plasma in the formation of the oxide insulation film is covered with the at least 1 nm thick (for example, 300 nm) oxide insulation film that is formed thus. Consequently, depending on the relationship between the heat treatment temperature and the film thickness of the oxide insulation film, oxygen may not reach the surface in the heat treatment, and the surface defects in the surface of the active layer damaged by plasma may not be rectified. Note that the heat treatment is applied in a state in which a portion of the active layer is exposed, and consequently it is likely that oxygen can be supplied to the active layer only through the exposed portion.

Therefore, it is likely that ΔVth during light illumination will not be improved even by supplying oxygen to the surface of the active layer at regions other than regions of the active layer surface damaged by plasma.

Similarly, for the manufacturing method of Patent Reference 3, there is no discussion of the temperature of the heat treatment apart from it being at least 220° C., which is a very broad range, and there is no discussion of the film thickness of the protective layer apart from it being from 100 to 700 nm, which is a very broad range. Nor is there any discussion of a relationship between the heat treatment temperature and the film thickness of the protective layer. Patent Reference 3 discloses the active layer being resupplied with oxygen via the protective layer in the heat treatment to control the oxygen content of the active layer. However, the surface of the active layer damaged by plasma in the formation of the protective layer is covered with the 100 to 700 nm thick protective layer that has been formed thereon. Therefore, depending on the above-mentioned relationship between the heat treatment temperature and the film thickness of the protective layer, oxygen may not reach the surface in the heat treatment, and the surface defects of the active layer damaged by plasma may not be rectified.

There are experimental results indicating that oxygen is supplied to the active layer in this heat treatment. However, given that the thickness of the protective layer is 100 to 700 nm, it seems likely that the oxygen is being supplied to the active layer due to oxygen in the protective layer reaching the boundary face between the active layer and the protective layer, rather than oxygen in the atmosphere. Alternatively, the oxygen may be being supplied by routes other than through the protective layer. It is likely that the surface defects in the surface of the active layer damaged by plasma may not be satisfactorily rectified just by the supply of oxygen in the protective layer or the supply of oxygen by routes other than the protective layer, and thus that ΔVth during light illumination will not be improved.

SUMMARY

The present invention has been made in consideration of the circumstances described above, and an object of the invention is to provide a semiconductor element manufacturing method and field effect transistor manufacturing method that stabilize element characteristics during light illumination.

The technical problem of the present invention is solved by the following means.

<1> A semiconductor element manufacturing method including: a first step of forming a semiconductor film of which a principal constituent is an oxide semiconductor; after the first step, a second step of forming a first insulation film on a surface of the semiconductor film; after the second step, a third step of applying a heat treatment in an oxidizing atmosphere; and, after the third step, a fourth step of forming a second insulation film on a surface of the first insulation film, wherein, during the second step and the third step, a thickness of the first insulation film and a temperature of the heat treatment in the third step are adjusted such that, if the thickness of the first insulation film is represented by $Z$ (nm), the heat treatment temperature is represented by $T$ (° C.) and a diffusion distance of oxygen into the first insulation film and the semiconductor film is represented by $L$ (nm), the relational expression $0 < Z < L = 8 \times 10^{-6} \times T^3 - 0.0092 \times T^2 + 3.6 \times T - 468 \pm 0.1$ is satisfied.

<2> The semiconductor element manufacturing method recited in <1>, in which, during the second step and the third step, the thickness of the first insulation film and the heat treatment temperature are adjusted such that the relational expression $Z \leq L - 1.0$ is satisfied.

<3> The semiconductor element manufacturing method recited in <2>, in which, during the second step and the third step, the thickness of the first insulation film and the heat treatment temperature are adjusted such that the relational expression $Z \leq L - 2.0$ is satisfied.

<4> The semiconductor element manufacturing method recited in any one of <1> to <3>, in which, during the second step and the third step, the thickness of the first insulation film and the heat treatment temperature are adjusted such that the relational expression $L - 5.0 \leq Z$ is satisfied.

<5> The semiconductor element manufacturing method recited in <1> or <2>, in which, during the second step and the third step, the thickness of the first insulation film and the heat treatment temperature are adjusted such that the relational expression $L - 2.0 \leq Z$ is satisfied.

<6> The semiconductor element manufacturing method recited in any one of <1> to <5>, in which, during the second step, the thickness Z of the first insulation film is adjusted to be at least 2 nm.

<7> The semiconductor element manufacturing method recited in any one of <1> to <6>, in which, during the second step and the fourth step, the first insulation film and the second insulation film are formed using a film formation technique that produces plasma.

<8> The semiconductor element manufacturing method recited in <7>, in which, in the second step: a film formation rate is lower and a plasma potential is lower than in the film formation of the fourth step or a film formation pressure is higher than in the film formation of the fourth step, or a combination thereof.

<9> The semiconductor element manufacturing method recited in <7> or <8>, in which, in the second step, the first insulation film is formed at a film formation rate of 20 nm/minute or less.

<10> The semiconductor element manufacturing method recited in any one of <7> to <9>, in which, in the second step, the first insulation film is formed in a film formation duration that is shorter than a film formation duration in which the second insulation film is formed in the fourth step.

<11> The semiconductor element manufacturing method recited in any one of <1> to <10>, in which, in the first step, the thickness of the semiconductor film is formed to be at least 5 nm.

<12> The semiconductor element manufacturing method recited in any one of <1> to <11>, further including, after the fourth step, a fifth step of applying a heat treatment in an oxidizing atmosphere at a lower temperature than the heat treatment temperature of the third step.

<13> The semiconductor element manufacturing method recited in <12>, in which the temperature of the heat treatment of the fifth step is at least 100° C.

<14> The semiconductor element manufacturing method recited in <13>, in which the temperature of the heat treatment of the fifth step is at least 300° C.

<15> The semiconductor element manufacturing method recited in any one of <1> to <14>, in which, in the fourth step, the second insulation film is formed with a greater thickness than the first insulation film.

<16> The semiconductor element manufacturing method recited in any one of <1> to <15>, in which the oxide semiconductor is a non-crystalline oxide including at least one of indium, gallium or zinc.

<17> The semiconductor element manufacturing method recited in any one of <1> to <16>, in which the heat treatment temperature in the third step is less than 600° C.

<18> The semiconductor element manufacturing method recited in any one of <1> to <17>, in which, in the second step, the first insulation film is formed on the entire surface of the semiconductor film.

<19> The semiconductor element manufacturing method recited in any one of <1> to <18>, in which a constituent material of the second insulation film includes a metal, and the first insulation film includes both at least one metal portion of the constituent material of the second insulation film and at least one metal portion of a constituent material of the semiconductor film.

<20> A field effect transistor manufacturing method including: an electrode formation step of forming a gate electrode, a source electrode and a drain electrode; and, before or during the electrode formation step, a non-electrode formation step of, using the semiconductor element manufacturing method recited in any one of <1> to <19>, forming the semiconductor film, which serves as an active layer, and the first insulation film and the second insulation film, which serve as a protective layer, a gate insulation layer or a combination thereof.

<21> The field effect transistor manufacturing method recited in <20>, in which the electrode formation step and the non-electrode formation step are carried out in a sequence such that the gate electrode is of a bottom gate type, and the first insulation film and the second insulation film are formed to serve as the protective layer of the semiconductor film.

<22> The field effect transistor manufacturing method recited in <21>, in which a total thickness of the first insulation film and the second insulation film is at least 30 nm.

<23> The field effect transistor manufacturing method recited in any one of <20> to <22>, in which the formation of the source electrode and the drain electrode in the electrode formation step is carried out between the first step and the second step such that the source electrode and the drain electrode are of a top contact type, and a thickness of the source electrode and the drain electrode and the heat treatment temperature are adjusted such that, if the thickness of the source electrode and the drain electrode is represented by Y, the relational expression $0<Y<L=8\times10^{-6}\times T^3-0.0092\times T^2+3.6\times T-468\pm 0.1$ is satisfied.

<24> The field effect transistor manufacturing method recited in any one of <20> to <22>, in which the formation of the source electrode and the drain electrode in the electrode formation step is carried out before the first step such that the source electrode and the drain electrode are of a bottom contact type.

According to the present invention, a semiconductor element manufacturing method and field effect transistor manufacturing method that stabilize element characteristics during light illumination may be provided.

DETAILED DESCRIPTION

Figure 1A:
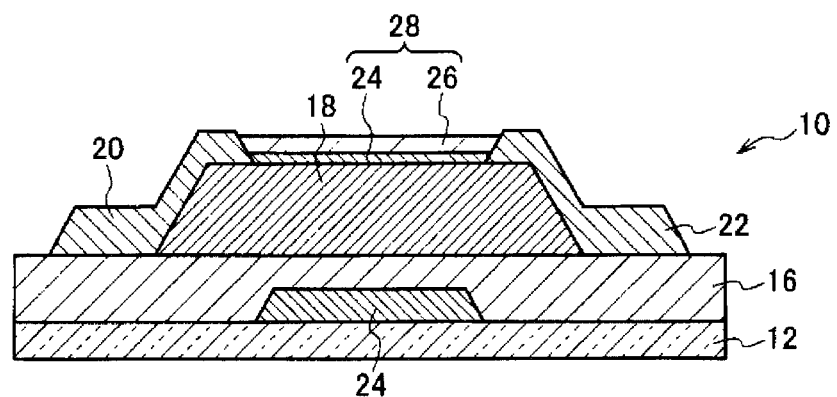
FIG. 1A is a schematic diagram showing an example of a top contact-type TFT with a bottom gate structure, which is a TFT in accordance with an exemplary embodiment of the present invention.

Herebelow, a semiconductor element manufacturing method and a field effect transistor manufacturing method in accordance with an exemplary embodiment of the present invention are described in concrete terms while referring to the attached drawings. Members (structural elements) that have the same or corresponding functions are assigned the same reference numerals in the drawings, and descriptions thereof are omitted as appropriate. Terms referring to "upper" and "lower" that are used in the following descriptions are used for convenience and are not intended to be restrictive in terms of direction.

The semiconductor element manufacturing method according to the exemplary embodiment of the present invention includes: a first step of forming a semiconductor film of which a principal constituent is an oxide semiconductor; after the first step, a second step of forming a first insulation film on a surface of the semiconductor film; after the second step, a third step of applying a heat treatment in an oxidizing atmosphere; and, after the third step, a fourth step of forming a second insulation film on a surface of the first insulation film. During the second step and the third step, a thickness of the first insulation film and a temperature of the heat treatment in the third step are adjusted such that, if the thickness of the first insulation film is represented by Z (nm), the heat treatment temperature is represented by T (° C.) and a diffusion distance of oxygen into the first insulation film and the semiconductor film is represented by L (nm), the relational expression $0<Z<L=8\times10^{-6}\times T^3-0.0092\times T^2+3.6\times T-468\pm0.1$ is satisfied. Note that the term "±0.1" in the relational expression represents a measurement error. Further, the term "semiconductor film" represents a film with a low resistance between at least $10^{-4}$ Ω·m and at most $10^4$ Ω·m, and the term "insulation film" represents a film with a high resistance above $10^4$ Ω·m.

According to this manufacturing method, in accordance with the adjustment of the thickness Z of the first insulation film and the heat treatment temperature T, oxygen in the oxidizing atmosphere is supplied through the first insulation film to inside the surface of the semiconductor film by the heat treatment of the third step. Consequently, surface defects in the semiconductor film damaged by film formation in the film formation of the second step may be satisfactorily rectified, and element characteristics such as ΔVth during light illumination and the like may be stabilized remarkably.

This manufacturing method may be employed in methods of manufacturing of various semiconductor elements, such as transistors, diodes, capacitors, integrated circuits, resistances and so forth. However, in the exemplary embodiment described below, of semiconductor elements, first a field effect transistor manufacturing method is taken as an example and specifically described, and secondly a photodiode manufacturing method is taken as an example and specifically described.

1. Semiconductor Element: General Structure of the Field Effect Transistor

Before the field effect transistor manufacturing method is described, schematics of the structure of the field effect transistor manufactured by this manufacturing method are described.

The field effect transistor according to the present exemplary embodiment of the invention is a thin film transistor (TFT), and includes at least a gate electrode, a gate insulation layer, an active layer, and a source electrode and a drain electrode. The field effect transistor is an active component with a function in which a voltage is applied to the gate electrode, current flowing in the active layer is regulated, and a current flowing between the source electrode and the drain electrode is switched.

The element structure of the TFT may be either of an inverse staggered structure (referred to as a bottom gate type) and a staggered structure (referred to as a top gate type), depending on the position of the gate electrode. Furthermore, the element structure of the TFT may be either of a top contact type and a bottom contact type, depending on contact portions between the active layer and the source electrode and drain electrode (referred to where appropriate as the source and drain electrodes).

The top gate type is a mode in which the gate electrode is disposed at an upper side of the gate insulation layer and the active layer is formed at the lower side of the gate insulation layer, and the bottom gate type is a mode in which the gate electrode is disposed at the lower side of the gate insulation layer and the active layer is formed at the upper side of the gate insulation layer. The bottom contact type is a mode in which the source and drain electrodes are formed before the active layer is formed and the lower face of the active layer is in contact with the source and drain electrodes, and the top contact type is a mode in which the active layer is formed before the source and drain electrodes are formed and the upper face of the active layer is in contact with the source and drain electrodes.

FIG. 1A is a schematic diagram showing an example of a top contact-type TFT 10 with a bottom gate structure, which is a TFT in accordance with the exemplary embodiment of the present invention. In the TFT 10 shown in FIG. 1A, a gate electrode 14, a gate insulation layer 16 and an active layer 18 are layered in this order on one principal surface of a substrate 12. A source electrode 20 and a drain electrode 22 are disposed apart from one another on a surface of the active layer 18. In the present embodiment, a first insulation layer 24 and a second insulation layer 26 are layered in this order on a surface of the active layer 18 that is exposed between the source electrode 20 and the drain electrode 22. The first insulation layer 24 and second insulation layer 26 function as a protective layer 28.

Figure 1B:
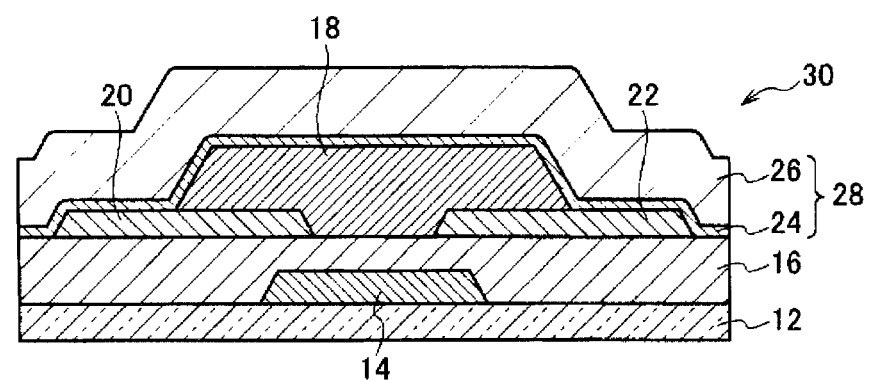
FIG. 1B is a schematic diagram showing an example of a bottom contact-type TFT with a bottom gate structure, which is a TFT in accordance with the exemplary embodiment of the present invention.

FIG. 1B is a schematic diagram showing an example of a bottom contact-type TFT with a bottom gate structure, which is a TFT in accordance with the exemplary embodiment of the present invention. In a TFT 30 shown in FIG. 1B, the gate electrode 14 and the gate insulation layer 16 are layered in this order on one principal surface of the substrate 12. The source electrode 20 and the drain electrode 22 are disposed apart from one another on a surface of the gate insulation layer 16, and the active layer 18 is layered over the source electrode 20 and drain electrode 22. In the present embodiment, the first insulation layer 24 and second insulation layer 26 that function as the protective layer 28 are layered in this order over an exposed surface of the active layer 18 and the like.

Figure 1C:
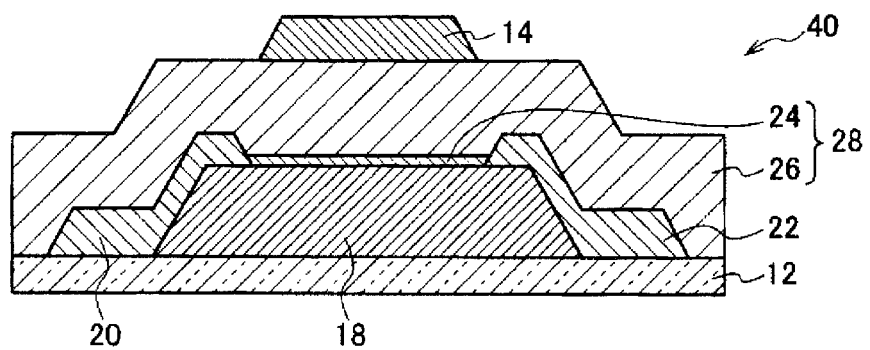
FIG. 1C is a schematic diagram showing an example of a bottom contact-type TFT with a top gate structure, which is a TFT in accordance with the exemplary embodiment of the present invention.

FIG. 1C is a schematic diagram showing an example of a bottom contact-type TFT with a top gate structure, which is a TFT in accordance with the exemplary embodiment of the present invention. In a TFT 40 shown in FIG. 1C, the active layer 18 is layered on one principal surface of the substrate 12. The source electrode 20 and the drain electrode 22 are disposed apart from one another on the active layer 18, and the gate insulation layer 16 and the gate electrode 14 are layered in this order over the source electrode 20 and drain electrode 22. In the present embodiment, the gate insulation layer 16 is formed in two layers, and the first insulation layer 24 and second insulation layer 26, which function as the gate insulation layer 16, are layered in this order on the surface of the active layer 18 that is exposed between the source electrode 20 and the drain electrode 22.

Figure 1D:
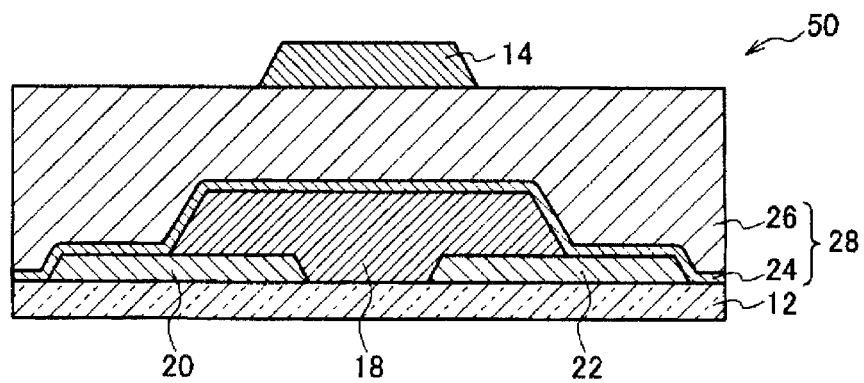
FIG. 1D is a schematic diagram showing an example of a bottom contact-type TFT with a top gate structure, which is a TFT in accordance with the exemplary embodiment of the present invention.

FIG. 1D is a schematic diagram showing an example of a bottom contact-type TFT with a top gate structure, which is a TFT in accordance with the exemplary embodiment of the present invention. In a TFT 50 shown in FIG. 1D, the source electrode 20 and the drain electrode 22 are disposed apart from one another on one principal surface of the substrate 12. The active layer 18, the gate insulation layer 16 and the gate electrode 14 are layered in this order over the principal surface of the substrate 12 and the source electrode 20 and drain electrode 22. In the present embodiment, the gate insulation layer 16 is formed in two layers, and the first insulation layer 24 and second insulation layer 26, which function as the gate insulation layer 16, are layered in this order on the exposed surface of the active layer 18.

A TFT in accordance with the present exemplary embodiment may have various structures apart from those described above, and may have, for example, a structure in which an insulation layer and the like are provided on the substrate.

2. Field Effect Transistor Manufacturing Method

A manufacturing method of a field effect transistor as described hereabove includes an electrode formation step and, before or during the electrode formation step, a non-electrode formation step. In the electrode formation step, the gate electrode 14, the source electrode 20 and the drain electrode 22 are formed. In the non-electrode formation step, the semiconductor element manufacturing method described above is used to form a semiconductor film that serves as the active layer 18 and to form the protective layer 28 or the first insulation layer 24 and second insulation layer 26 that serve as the gate insulation layer 16.

This field effect transistor manufacturing method is described taking a manufacturing method of the bottom gate structure, top contact-type TFT 10 as an example. The field effect transistor manufacturing method according to the present exemplary embodiment of the invention may be similarly applied to the manufacture of other modes of TFT.

FIG. 2A to FIG. 2F are step diagrams of the method of manufacture of the bottom gate structure, top contact-type TFT 10.

—Formation of the Gate Electrode 14—

Figure 2A:
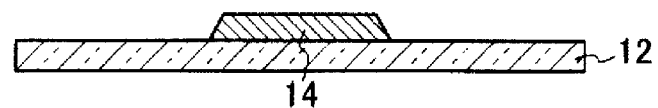
FIG. 2A is a step diagram of a method of manufacturing of a top contact-type TFT with a bottom gate structure.

First, as shown in FIG. 2A, the substrate 12 is prepared for the formation of the TFT 10, and the gate electrode 14 is formed on one principal surface of the substrate 12.

The shape, structure, size and so forth of the substrate 12 are not particularly limited provided there is a principal surface at which a film can be formed, and may be suitably selected in accordance with objectives. The structure of the substrate 12 may be a single-layer structure, and may be a layered structure.

A material of the substrate 12 is not particularly limited; for example, an inorganic substrate such as glass, YSZ (yttria-stabilized zirconia) or the like, a resin substrate or a composite material therewith, or the like may be used. Of these, a resin substrate or a composite material therewith or the like is preferable in view of being light in weight and flexible. Specifically, the following may be used: a synthetic resin substrate of polybutylene terephthalate, polyethylene terephthalate, polyethylene naphthalate, polybutylene naphthalate, a polystyrene, polycarbonate, polysulfone, polyether sulfone, polyarylate, allyldiglycol carbonate, polyamide, polyimide, polyamido-imide, polyether imide, polybenzazole, polyphenylene sulfide, polycycloolefin, norbornene resin, a fluorine-based resin such as polychlorotrifluoroethylene or the like, a liquid-crystal polymer, acrylic resin, epoxy resin, silicone resin, ionomer resin, cyanate resin, cross-linking fumarate diester, cyclic polyolefin, aromatic ester, maleimide olefin, cellulose, episulfide compound or the like; a composite plastic material with silicon oxide particles; a composite plastic material with metallic nanoparticles, inorganic oxide nanoparticles, inorganic nitride nanoparticles or the like; a composite plastic material with carbon fibers or carbon nanotubes; a composite plastic material with glass flakes, glass fibers or glass beads; a composite plastic material with particles containing clay minerals, mica-derived crystal structures or the like; a layered plastic material with at least one joining boundary between a thin glass and a single organic material mentioned above; a composite material with barrier capability including at least one joining boundary, formed by alternately layering inorganic layers and organic layers; a stainless steel substrate or a multilayer metallic substrate in which stainless steel and a different metal are layered; an aluminium substrate or an aluminium substrate with an oxide layer, in which an oxidizing treatment (for example, anodic oxidation) is applied to the surface to improve insulative properties of the surface; or the like. A resin substrate is preferable in terms of excellence of heat resistance, dimensional stability, solvent resistance, electrical insulation, machinability, low permeability or low absorbency, and the like. This resin substrate is preferably provided with layers such as a gas barrier layer for preventing permeation of water, oxygen and the like and an undercoat layer for improving flatness of the resin substrate, surface contact with a lower electrode and the like. In a case in which an undercoat layer is formed at one face of the resin substrate, warping may occur in the resin substrate due to residual internal stresses. Therefore, it is preferable to coat both faces with an undercoat layer, or control film properties to keep stresses low, or control compression/tension stresses in the layers. The undercoat layer is preferably of the material used for the gate insulation layer 16, which is described below, so as to improve barrier properties.

For the formation of the gate electrode 14, a conductive film may be formed in accordance with a method suitably selected, in consideration of the materials being used and suitability, from among, for example, wet processes such as a printing process, a coating process and the like, physical processes such as vacuum deposition, sputtering, ion plating and the like, chemical processes such as CVD, plasma CVD and the like, and the like. After the film formation, the conductive film is patterned into a predetermined shape by photolithography and etching, a lift-off process or the like. Thus, the gate electrode 14 is formed from the conductive film. Here, it is preferable if the gate electrode 14 and gate wiring are patterned at the same time.

The conductive film constituting the gate electrode 14 preferably uses a material with high conductivity. For example, the following may be used: a metal such as aluminium, molybdenum, chromium, tantalum, titanium, gold or the like; aluminium-neodymium; a silver alloy; a metal oxide conductive film of tin oxide, zinc oxide, indium oxide, indium tin oxide (ITO), indium zinc oxide (IZO) or the like; or the like.

—Formation of the Gate Insulation Layer 16—

Figure 2B:
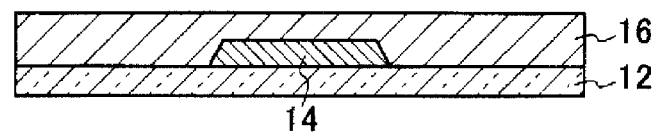
FIG. 2B is a step diagram of the TFT manufacturing method continuing from FIG. 2A.

After the gate electrode 14 has been formed, as shown in FIG. 2B, the gate insulation layer 16 is formed on the gate electrode 14 and exposed surface of the substrate 12.

For the formation of the gate insulation layer 16, an insulation film may be formed in accordance with a method suitably selected, in consideration of the materials being used and suitability, from among, for example, wet processes such as a printing process, a coating process and the like, physical processes such as vacuum deposition, sputtering, ion plating and the like, chemical processes such as CVD, plasma CVD and the like, and the like. After the film formation, the insulation film is patterned into a predetermined shape as necessary by photolithography and etching, a lift-off process or the like. Thus, the gate insulation layer 16 is formed from the insulation film.

The insulation film constituting the gate insulation layer 16 is preferably a film with high insulativity. For example, the insulation film may be formed of $SiO_2$, $SiN_x$, SiON, $Al_2O_3$, $Y_2O_3$, $Ta_2O_5$, $HfO_2$ or the like, or may contain two or more of these compounds.

The gate insulation layer 16 must have some thickness in order to reduce leakage currents and improve voltage endurance. However, if the thickness of the gate insulation layer is excessive, an increase in driving voltages will result. The thickness of the gate insulation layer 16 depends on the material, but is preferably at least 10 nm and at most 10 μm, is more preferably at least 50 nm and at most 1000 nm, and is particularly preferably at least 100 nm and at most 400 nm.

—Formation of the Active Layer 18 (First Step)—

Figure 2C:
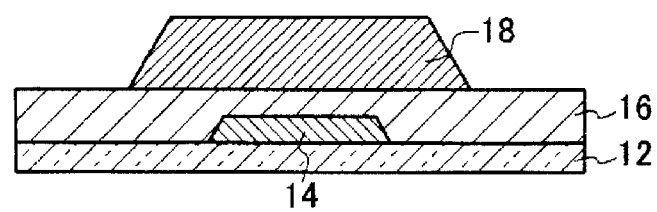
FIG. 2C is a step diagram of the TFT manufacturing method continuing from FIG. 2B.

After the gate insulation layer 16 has been formed, as shown in FIG. 2C, the active layer 18 is formed on the gate insulation layer 16 at a position corresponding with the gate electrode 14.

For the formation of the active layer 18, the first step is carried out to form a semiconductor film, of which the principal constituent is an oxide semiconductor, in accordance with a method suitably selected, in consideration of the materials being used and suitability, from among, for example, wet processes such as a printing process, a coating process and the like, physical processes such as vacuum deposition, sputtering, ion plating and the like, chemical processes such as CVD, plasma CVD and the like, and the like. Of these, vapor phase film formation techniques such as vapor deposition, sputtering, ion plating, CVD, plasma CVD and the like are preferably used with regard to ease of controlling film thickness. Of these vapor phase film formation techniques, sputtering and pulse laser deposition (PLD) are more preferable. With regard to productivity, sputtering is even more preferable. For example, the film can be formed, with a vacuum level and oxygen flow amounts being controlled, by RF magnetron sputtering film formation.

In this film formation, it is preferable if the thickness of the semiconductor film is adjusted to be at least 5 nm. This is because oxygen is to be supplied to the inside of the boundary face of the semiconductor layer (the active layer 18) that is in contact with the first insulation layer 24 in the heat treatment of the third step, which is described below. With a thickness of less than 5 nm, oxygen might be supplied to the whole of the semiconductor layer and it might be difficult for the semiconductor layer to function as a semiconductor, and even if oxygen is not supplied to the whole of the semiconductor layer, a region in which carriers move might be severely depleted. The semiconductor film is preferably at least 5 nm in order to avoid such situations. With regard to costs, it is also preferable if the thickness of the semiconductor layer is not more than 150 nm. With a view to balancing assurance of carrier mobility with suppression of costs, it is more preferable if the thickness is at least 30 nm and at most 60 nm.

After the formation of the semiconductor film, the insulation film is patterned into a predetermined shape as necessary by photolithography and etching, a lift-off process or the like. Thus, the active layer 18 is formed from the semiconductor film. Thereafter, a heat treatment for adjusting electrical resistivity and the like may be applied as appropriate. In a case in which this heat treatment is performed, the active layer 18 after the heat treatment preferably has the film thickness of a semiconductor film as described above.

It is sufficient if the principal constituent of the semiconductor film constituting the active layer 18 is an oxide semiconductor; other impurities and the like may be included. The term "principal constituent" used herein is intended to include a component of which the content is largest among components constituting the active layer 18.

The oxide semiconductor may be non-crystalline or crystalline, but it is preferable if a non-crystalline oxide semiconductor is used. When the semiconductor film is constituted by an oxide semiconductor, mobility of charges is much higher than in a semiconductor film of non-crystalline silicon, and driving at lower voltages is possible. Further, when an oxide semiconductor is used, the semiconductor film may generally be formed with a higher transparency than silicon. Moreover, an oxide semiconductor, particularly a non-crystalline oxide semiconductor, may be formed into a uniform film at a low temperature (for example, room temperature). This is particularly advantageous when using a resin substrate with flexibility, such as a plastic.

Constituent materials of the oxide semiconductor encompass publicly known conventional materials. For example, the following can be mentioned: oxides of transition metals such as indium, titanium, niobium, tin, zinc, gadolinium, cadmium, zirconium, yttrium, lanthanum, tantalum and the like; compounds such as $SrTiO_3$, $CaTiO_3$, $ZnO.Rh_2O_3$, $CuGaO_2$, $SrCu_2O_2$ and the like; and the like.

Thus, the oxide semiconductor used in the semiconductor film of the active layer 18 is not particularly limited. However, a metal oxide including at least one of indium, tin, zinc, gallium and cadmium is preferable, a metal oxide containing at least one of indium, tin, zinc and gallium is more preferable, and a metal oxide containing at least one of indium, gallium and zinc (for example, an In—O oxide) is even more preferable.

In particular, a metal oxide containing at least two of indium, gallium and zinc (for example, an In—Zn—O oxide, an In—Ga—O oxide or a Ga—Zn—O oxide) is preferable, and a metal oxide containing all of indium, gallium and zinc is more preferable. An In—Ga—Zn—O oxide semiconductor is preferably an oxide semiconductor whose composition in a crystalline state would be represented by $InGaO_3(ZnO)_m$ (m being a natural number that is less than 6), and is particularly preferably $InGaZnO_4$. A characteristic of oxide semiconductors of this composition is that electron mobility tends to increase as electrical conductivity increases. A composition ratio of the IGZO does not strictly necessarily have to be In:Ga:Zn=1:1:1. Beside $InGaZnO_4$ (IGZO), specifically, ITO (indium tin oxide), ISZO (indium silicon oxide), IGO (indium gallium oxide), ITZO (indium tin zinc oxide), IZO (indium zinc oxide), IHZO (indium hafnium zinc oxide) and the like are preferable.

A layer structure of the active layer 18 may be a structure with two layers or more. It is preferable if the active layer 18 is formed with a low-resistance layer and a high-resistance layer, the low-resistance layer being in contact with the gate insulation layer 16, and the high-resistance layer being in electrical contact with at least one of the source electrode 20 and the drain electrode 22.

—Formation of the Source and Drain Electrodes 20 and 22—

Figure 2D:
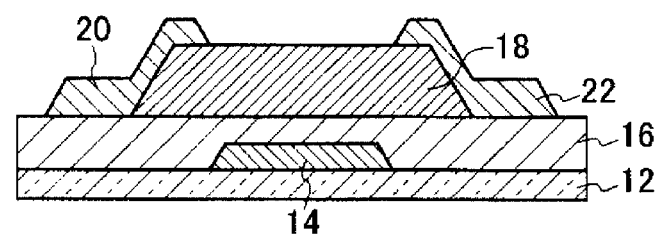
FIG. 2D is a step diagram of the TFT manufacturing method continuing from FIG. 2C.

After the active layer 18 has been formed, as shown in FIG. 2D, the source electrode 20 and drain electrode 22 are formed on the active layer 18 and the exposed surface of the gate insulation layer 16.

For the formation of the source and drain electrodes 20 and 22, a conductive film is formed in accordance with a method suitably selected, in consideration of the materials being used and suitability, from among, for example, wet processes such as a printing process, a coating process and the like, physical processes such as vacuum deposition, sputtering, ion plating and the like, chemical processes such as CVD, plasma CVD and the like, and the like. Of these, vapor phase film formation techniques such as vapor deposition, sputtering, ion plating, CVD, plasma CVD and the like are preferably used with regard to ease of controlling film thickness. Of these vapor phase film formation techniques, sputtering and pulse laser deposition (PLD) are more preferable. With regard to productivity, sputtering is even more preferable. After the film formation, the conductive film is patterned into a predetermined shape as necessary by photolithography and etching, a lift-off process or the like. Thus, the source and drain electrodes 20 and 22 are formed from the conductive film. Here, it is preferable if the source and drain electrodes 20 and 22 and gate wiring are patterned at the same time.

The conductive film constituting the source and drain electrodes 20 and 22 uses a material with high conductivity. For example, the conductive film may be formed using the following: a metal such as aluminium, molybdenum, chromium, tantalum, titanium, gold or the like; aluminium-neodymium; a silver alloy; a metal oxide conductive film of tin oxide, zinc oxide, indium oxide, indium tin oxide (ITO) indium zinc oxide (IZO) or the like; or the like. The conductive film of the source and drain electrodes 20 and 22 may use a single layer structure or a multilayer structure of two or more layers.

In consideration of film formation characteristics, characteristics of patterning by etching, lift-off or the like, conduction characteristics and so forth, the film thickness of the conductive film that is formed is preferably at least 1 nm and at most 1000 nm, and is more preferably at least 50 nm and at most 500 nm. As is described more specifically below, a film thickness is preferable with which, by the heat treatment of the third step, oxygen in an oxidizing atmosphere may be both supplied through the first insulation layer 24 to inside the boundary face of the active layer 18 that is in contact with the first insulation layer 24 and supplied through the source and drain electrodes 20 and 22 to inside the boundary face of the active layer 18 that is in contact with the source and drain electrodes 20 and 22.

—Formation of the First Insulation Film (Second Step)—

Figure 2E:
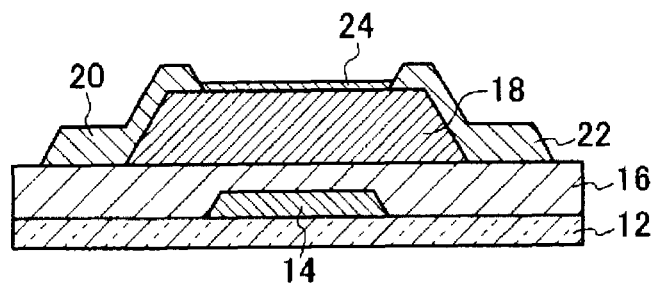
FIG. 2E is a step diagram of the TFT manufacturing method continuing from FIG. 2D.

After the source and drain electrodes 20 and 22 have been formed, which is after the first step, as shown in FIG. 2E, the second step is carried out to form the first insulation layer 24 that functions as a portion of the protective layer 28 on the exposed surface of the active layer 18.

For the formation of the first insulation layer 24, a conductive film is formed in accordance with a method suitably selected, in consideration of the materials being used and suitability, from among, for example, wet processes such as a printing process, a coating process and the like, physical processes such as vacuum deposition, sputtering, ion plating and the like, chemical processes such as CVD, plasma CVD and the like, and the like. Of these, vapor phase film formation techniques such as vapor deposition, sputtering, ion plating, CVD, plasma CVD and the like are preferably used with regard to ease of controlling film thickness. Of these vapor phase film formation techniques, sputtering, ion plating, CVD and plasma CVD are more preferable with regard to productivity and barrier properties. With regard to productivity, sputtering is particularly preferable, and with regard to barrier properties, CVD is particularly preferable. After the film formation of the first insulation layer 24, the conductive film is patterned into a predetermined shape as necessary by photolithography and etching, a lift-off process or the like.

In the second step, the film is formed on the exposed surface of the active layer 18. Therefore, the exposed surface may be damaged, as a result of which surface defects may be produced that affect the value of $\Delta V_{th}$ during light illumination. In the film formation, if a film-forming technique that produces plasma is used with a view to productivity or barrier properties, the exposed surface of the active layer 18 is particularly susceptible to damage from the plasma, as a result of which surface defects are more numerous.

Therefore, in a case in which a film-forming technique that produces plasma is used, with a view to reducing plasma damage, it is preferable if the film formation rate is lower and the plasma potential is lower than in film formation in the fourth step, or the film formation pressure in a film formation chamber is higher than in the fourth step. Herein, the protective layer 28 is divided into the first insulation layer 24 and the second insulation layer 26 in order to make the thickness of the protective layer 28 at the time of the below-described heat treatment of the third step thinner. The surface of the active layer 18 does not suffer damage in the formation of the second insulation layer 26 in the fourth step. Therefore, the film formation rate may be raised to some extent regardless of the plasma potential and, correspondingly, the film formation rate and plasma potential of the film formation of the first insulation layer 24 in the second step may be lowered, and plasma damage to the exposed surface of the active layer 18 may be reduced.

Conversely, with a view to preventing long periods of exposure to plasma and reducing plasma damage, it is preferable to form the first insulation layer 24 in a shorter film formation duration than a film formation duration of the second insulation layer 26 in the fourth step, by raising the film formation rate. In concrete terms, the film formation rate of the first insulation layer 24 is preferably not more than 20 nm/minute with regard to ease of control of the thickness.

Similarly, with a view to shortening the film formation duration and reducing plasma damage, it is preferable to perform an adjustment at the second step such that the film thickness of the first insulation layer 24 is thinner than the second insulation layer 26. However, if the thickness of the first insulation film is reduced to less than 2 nm, this may result in a state equivalent to the portion of the exposed surface of the active layer 18 on which the film is formed being left exposed, and the film may not be uniform. Therefore, it is preferable to adjust the film thickness to be at least 2 nm. Details of the adjustment of the film thickness are described below.

The film formation of the first insulation layer 24 in the second step may form the film on only a portion of the exposed surface of the active layer 18. In this case, when the second insulation layer 26 is formed on the rest of the exposed surface of the active layer 18, the rest of the exposed surface suffers damage. However, at least the boundary face of the active layer 18 that is in contact with the first insulation layer 24 (a face that was previously a portion of the exposed surface) is not damaged, and surface defects due to damage when the first insulation layer 24 is formed are rectified by the heat treatment of the third step described below. However, with a view to increasing the region that is rectified and rectifying a region in which current flows between the source and drain electrodes 20 and 22, because this region is likely to affect TFT characteristics, it is preferable to form the first insulation layer 24 at least over the whole of the exposed surface of the active layer 18 between the source and drain electrodes 20 and 22. Further, with a view to increasing the region that is rectified to the maximum extent, it is preferable to carry out film formation over the entire area of the active layer 18 in the fourth step and subsequently.

A material constituting the first insulation layer 24 is not particularly limited, but the following inorganic materials may be mentioned: metal oxides such as $SiO_2$, $SiO$, $MgO$, $Al_2O_3$, $GeO$, $NiO$, $SrO$, $Y_2O_3$, $ZrO_2$, $CeO_2$, $Rb_2O$, $Sc_2O_3$, $La_2O_3$, $Nd_2O_3$, $Sm_2O_3$, $Gd_2O_3$, $Dy_2O_3$, $Er_2O_3$, $Yb_2O_3$, $Ta_2O_3$, $Ta_2O_5$, $Nb_2O_5$, $HfO_2$, $Ga_2O_3$, $TiO_2$ and the like; metal nitrides such as $AlN$, $SiN$, $SiN_xO_y$, and the like; and the like. Of these, $SiO_2$, $Gd_2O_3$ and the like are preferable, having fast film formation rates, and $Gd_2O_3$ is the more preferable. Resistivity and the like may be altered by oxygen amount adjustment, composition adjustment, elemental doping and the like, and the first insulation layer 24 may be formed using a material the same as that of the active layer 18, such as IGZO or the like. If the constituent material of the first insulation layer 24 is an oxide, oxygen amounts in the below-described heat treatment of the third step may be altered and characteristics of the film may be altered. Therefore, apart from an oxide, it is preferable to use an insulator such as a nitride or the like with a view to preventing changes in film characteristics.

With a view to improving area contact between the active layer 18 and the protective layer 28, it is preferable if the first insulation layer 24 includes both at least one metal portion of the constituent material of the second insulation layer 26 and at least one metal portion of the constituent material of the active layer 18 (the semiconductor film).

—Heat Treatment (Third Step)—

Figure 2F:
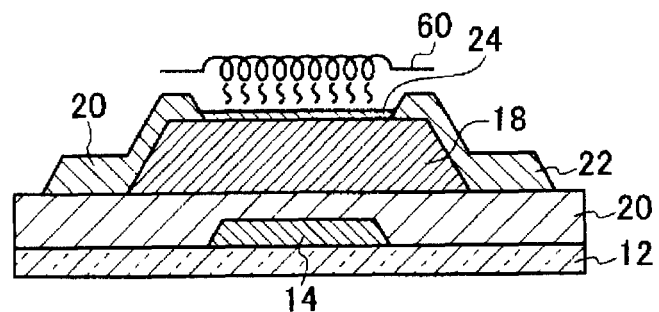
FIG. 2F is a step diagram of the TFT manufacturing method continuing from FIG. 2E.

After the second step, as shown in FIG. 2F, the third step is performed, in which a heat treatment is applied in an oxidizing atmosphere containing oxygen by the substrate 12 and the like being heated with a heater 60. Note that a heating method is not particularly limited. Apart from the heater 60, a method of localized heating by laser annealing may be used. The oxygen content of the oxidizing atmosphere is also not particularly limited, but is preferably at least 5% of the total with regard to improving TFT characteristics such as mobility and the like.

In the present exemplary embodiment, during the second step and the third step, the thickness of the first insulation layer 24 and the heat treatment temperature are adjusted such that, if the thickness of the first insulation layer 24 is represented by Z (nm), the heat treatment temperature in the third step is represented by T (° C.) and a diffusion distance of oxygen is represented by L (nm), the relational expression $0<Z<L=8\times10^{-6}\times T^3-0.0092\times T^2+3.6\times T-468\pm0.1$ is satisfied. Thus, by the heat treatment of the third step being applied subject to the adjustment of the thickness Z of the first insulation layer and the heat treatment temperature T, oxygen in the oxidizing atmosphere may be supplied through the first insulation layer 24 to inside the surface of the active layer 18. Consequently, surface defects of the active layer 18 damaged by the film formation of the second step may be satisfactorily rectified, and element characteristics such as ΔVth during light illumination and the like may be stabilized remarkably.

As described in the Examples below, if the thickness Z of the first insulation layer 24 is thickened beyond the range mentioned above and the heat treatment is at least above 300° C. as in Patent Reference 3, then rather than oxygen in the oxidizing atmosphere, oxygen in the first insulation layer 24 and/or oxygen passing through routes other than the first insulation layer 24 (side faces and the like) may be supplied to inside the boundary face of the active layer 18 that is in contact with the first insulation layer 24. This may stabilize TFT characteristics during light illumination, but this stabilization is very slight. In specific terms, if the thickness Z of the first insulation layer 24 is thinned beyond the range mentioned above, ΔVth only improves at the level of the third or fourth decimal place per nanometer of thickness (does not approaches 0 V).

However, if the thickness Z of the first insulation layer 24 is thinned within the range mentioned above, ΔVth improves (approaches 0 V) remarkably, specifically at the level of the first or second decimal place per nanometer of thickness. In particular, in a case in which light with a short wavelength of less than 400 nm is illuminated, the improvement in ΔVth per nanometer is at the level of the first decimal place, which is even more remarkable. In a case in which light with a wavelength of 700 nm or more is illuminated, ΔVth goes from negative values through zero to positive values within the above-mentioned range of thicknesses Z of the first insulation layer 24. Therefore, light illumination with wavelengths of less than 700 nm is preferable.

During the second step and the third step, it is preferable to adjust the thickness of the first insulation layer 24 and the heat treatment temperature so as to satisfy the relational expression $Z\leq(L-1.0)=8\times10^{-6}\times T^3-0.0092\times T^2+3.6\times T-468\pm0.1-1.0$. If the thickness of the first insulation layer 24 is thinned within the range mentioned above, ΔVth is even more remarkably improved, and with wavelengths of light illumination above 360 nm, ΔVth is improved to not less than −0.8 V whatever the wavelength.

During the second step and the third step, it is preferable to adjust the thickness of the first insulation layer 24 and the heat treatment temperature so as to satisfy the relational expression $Z\leq(L-2.0)=8\times10^{-6}\times T^3-0.0092\times T^2+3.6\times T-468\pm0.1-2.0$. With wavelengths of light illumination above 360 nm, ΔVth is improved to not less than −0.6 V whatever the wavelength.

During the second step and the third step, it is preferable to adjust the thickness of the first insulation layer 24 and the heat treatment temperature so as to satisfy the relational expression $(L-5.0)=8\times10^{-6}\times T^3-0.0092\times T^2+3.6\times T-468\pm0.1-5.0\leq Z$. This is in order to prevent a remarkable loss of mobility of the active layer 18 in association with the oxygen supply.

During the second step and the third step, it is preferable to adjust the thickness of the first insulation layer 24 and the heat treatment temperature so as to satisfy the relational expression $(L-2.0)=8\times10^{-6}\times T^3-0.0092\times T^2+3.6\times T-468\pm0.1-2.0\leq Z$. This is because, depending on a wavelength (for example, a wavelength of 420 nm, 440 nm or the like) mobility of the active layer 18 is hardly altered (reduced) at all.

Thus, the value of the heat treatment temperature T in the third step is adjusted in consideration of the relationship with the thickness Z of the first insulation layer 24. In a case in which an the oxide semiconductor that is used to constitute the active layer 18 is crystalline, it is preferable if the heat treatment temperature T is not more than 1000° C., depending on the kind of oxide semiconductor. This is to suppress crystal changes and melting or the like of the oxide semiconductor in the heat treatment of the third step. As oxide semiconductors that are suitable for the conditions described above, for example, non-crystalline oxides containing one or more of indium, gallium and zinc may be mentioned.

In a case in which the oxide semiconductor that is used to constitute the active layer 18 is non-crystalline, the heat treatment temperature T is preferably less than 700° C. This is because, with a high temperature of 700° C. or more, there may be strong reduction activity by the atmosphere, in which case oxygen desorption amounts increase more than oxygen supply amounts.

Further, in a case in which the oxide semiconductor that is used to constitute the active layer 18 is non-crystalline, the heat treatment temperature T is more preferably less than 600° C. This is to avoid crystallization of the oxide semiconductor in the heat treatment of the third step. Furthermore, for both non-crystalline and crystalline oxides, if the heat treatment temperature is less than 600° C., mutual interdiffusion of cations in the active layer 18 and the first insulation layer 24 and mixing of the two regions may be suppressed. As oxide semiconductors that are suitable for the conditions described above, for example, non-crystalline oxides containing one or more of indium, gallium and zinc may be mentioned.

In a case in which the oxide semiconductor that is used to constitute the active layer 18 is non-crystalline and a resin substrate is used as the substrate 12, depending on the kind of the substrate 12, it is more preferable for the heat treatment temperature to be set to not more than 450° C. This is to avoid crystallization in the heat treatment of the third step. As a resin substrate that is suitable for the conditions described above, polyimide (with a heat resistance of 450° C.) may be mentioned.

Now, the diffusion distance L of oxygen into the first insulation layer 24 and the active layer 18 is described. First, theoretical values of the diffusion distance L when the heat treatment temperature T (° C.) is altered in steps of 100° C. and substituted into the aforementioned relational expression $L=8\times10^{-6}\times T^3-0.0092\times T^2+3.6\times T-468\pm0.1$ are shown in Table 1. Measured values will be described in the Examples.

TABLE 1

| Heat treatment temperature T (° C.) | Diffusion distance L (nm) |
|---|---|
| 100 | −192 |
| 200 | −52 |
| 300 | 0 |
| 400 | 12 |
| 500 | 32 |
| 600 | 108 |
| 700 | 288 |
| 800 | 620 |
| 900 | 1152 |
| 1000 | 1932 |

As shown in Table 1, if the heat treatment of the third step is applied with a high heat treatment temperature T of 700° C. or more, the oxygen diffusion distance L is 288 nm or more. Thus, according to the relational expression Z<L, the thickness Z of the first insulation layer 24 may be thickened up to less than 288 nm, and a thickness with which the first insulation layer 24 alone functions satisfactorily as the protective layer 28 may be assured. The meaning of "a thickness that functions satisfactorily as the protective layer 28" is that a thickness of 30 nm or more is preferable in regard to suppressing the penetration of moisture into the active layer 18, a thickness of 50 nm or more is more preferable in regard to suppressing oxygen desorption from the active layer 18, and a thickness of 100 nm or more is even more preferable in regard to both avoiding the penetration of moisture into the active layer 18 and avoiding oxygen desorption from the active layer 18. In regard to reducing costs and manufacturing time, the thickness is preferably not more than 1 μm.

However, as mentioned above, with a high temperature of 700° C. or more there may be strong reduction activity by the atmosphere, in which case oxygen desorption amounts increase by more than oxygen supply amounts. Accordingly, application of the heat treatment of the third step with a heat treatment temperature T of less than 700° C. instead, and particularly with a lower heat treatment temperature T of less than 600° C., is considered. In this case, the oxygen diffusion distance L is less than 288 nm (when the temperature is less than 700° C.), and particularly is less than 108 nm (when the temperature is less than 600° C.). Thus, according to the relationship Z<L, the lower the heat treatment temperature T, the thinner the thickness Z of the first insulation layer 24 has to be. When the thickness Z of the first insulation layer 24 is made thinner accordingly, a thickness with which the first insulation layer 24 alone functions satisfactorily as the protective layer 28 may not be assured, and formation of the second insulation layer 26 to function as the protective layer 28 is advantageous.

Accordingly, in the present exemplary embodiment, the fourth step of forming the second insulation layer 26 is carried out. Naturally, a case in which the fourth step is not carried out, where it is supposed that a thickness can be assured with which the first insulation layer 24 alone satisfactorily functions as the protective layer 28, is encompassed by the present invention.

—Formation of the Second Insulation Film (Fourth Step)—

Figure 2G:
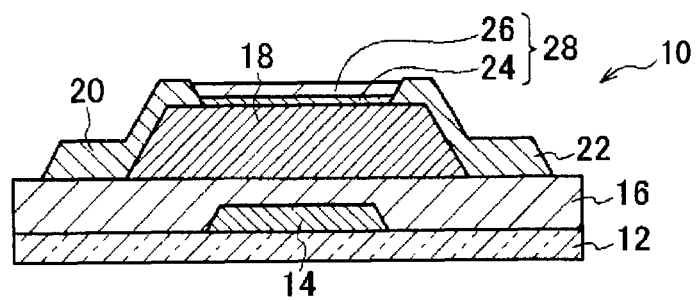
FIG. 2G is a step diagram of the TFT manufacturing method continuing from FIG. 2F.

In the fourth step, after the third step, as shown in FIG. 2G, the second insulation layer 26 is formed on the surface of the first insulation layer 24.

A film formation method of the second insulation layer 26 may be the same as the film formation method of the first insulation layer 24, and may be different. However, with regard to productivity and barrier properties, it is preferable if the film formation methods of the first insulation layer 24 and the second insulation layer 26 are both a film-forming technique that produces plasma. Similarly, the constituent material of the second insulation layer 26 may be the same as the constituent material of the first insulation layer 24 and may be different.

In a case in which the heat treatment temperature T in the third step is a low temperature of less than 600° C., the oxygen diffusion distance L is short. Therefore, with a view to supplying oxygen to inside the boundary face of the active layer 18, the thickness Z of the first insulation layer 24 must be made thinner. Conversely, because this first insulation layer 24 does not satisfactorily function as the protective layer 28, it is preferable to form the second insulation layer 26 in the fourth step with a larger thickness than the first insulation layer 24 by an amount corresponding to the thinning of the first insulation layer 24.

—Heat Treatment (Fifth Step)—

After the fourth step, a fifth step is performed as necessary, in which a heat treatment is applied in an oxidizing atmosphere at a lower temperature than the heat treatment temperature of the third step. If the heat treatment is applied at an equal or higher temperature than the heat treatment temperature of the third step, there is a risk that oxygen in the active layer 18 (oxygen supplied in the third step and the like) may be diffused to the exterior.

The heat treatment temperature in the fifth step is preferably at least 100° C. with a view to vaporizing moisture at the surface of the protective layer 28 (the second insulation layer 26). The heat treatment temperature is more preferably at least 200° C. with a view to vaporizing moisture within the protective layer 28.

The total thickness of the first insulation layer 24 and the second insulation layer 26 is preferably a thickness such that the thickness of the protective layer 28 is as described above. For example, with a view to suppressing the penetration of moisture into the active layer 18 and causing the protective layer 28 to function satisfactorily, a thickness of at least 30 nm is preferable.

By the steps described above, the TFT 10 shown in FIG. 1A may be fabricated.

According to the manufacturing method of the TFT 10 in accordance with the present exemplary embodiment, oxygen in an oxidizing atmosphere may be supplied to inside the surface of the active layer 18 via the first insulation layer 24 by the heat treatment of the third step, consequent to adjustment of the thickness Z of the first insulation layer 24 and the heat treatment temperature T. As a result, surface defects in the surface of the active layer 18 that has been damaged by the film formation of the second step may be satisfactorily rectified, and element characteristics such as ΔVth during light illumination and the like may be stabilized remarkably.

After the completion of the TFT 10, as a method for verifying whether or not a TFT is the TFT 10 manufactured using the manufacturing method according to the exemplary embodiment of the present invention (verifying whether or not the heat treatment of the third step has been applied), a composition analysis may be mentioned, such as sectional transmission electron microscopy (TEM) observation, a combination of sectional TEM and secondary ion-microprobe mass spectrometry (SIMS), a light emission analysis with inductively coupled plasma (ICP), or the like.

Specifically, in a case in which identification of the active layer 18 and the first insulation layer 24 and the like is implemented by sectional TEM observation, and zinc is included in the active layer 18, it can be found by SIMS that the zinc has diffused in the heat treatment and entered into the first insulation layer 24. Accordingly, in sectional TEM observations it is determined whether or not there is a line (or a change of contrast) in the first insulation layer 24 that indicates zinc in the corresponding region. Thus, a verification may be made as to whether the heat treatment of the third step has been applied.

Alternatively, in a case in which identification of the active layer 18 and the first insulation layer 24 and the like is implemented by sectional TEM observations, and zinc is included in the active layer 18, a determination is made from SIMS as to whether there is an intensity corresponding to zinc at a depth in the first insulation layer 24. Thus, a verification may be made as to whether the heat treatment of the third step has been applied.

A heat treatment temperature in the third step of more than 300° C. is required according to the aforementioned relational expression. However, it is known that zinc starts to be diffused by a heat treatment in an oxidizing atmosphere at 250° C. or more. Therefore, zinc in the active layer 18 necessarily diffuses when the third step is carried out.

In a case in which zinc is included in the active layer 18, if a heat treatment is applied at a temperature of 250° C. or more, a decrease in the element zinc is measured. Therefore, in the active layer 18 of a TFT to which the heat treatment has been applied at more than 300° C. in the third step, portions in which the element zinc has decreased should be apparent at the layered film surface and within the layered film. Therefore, a determination as to whether or not the TFT 10 has been manufactured using the manufacturing method according to the exemplary embodiment of the present invention may also evaluate a composition distribution in the active layer.

It is likely to be difficult to identify whether a heat treatment has been applied in the third step or applied in, for example, the fifth step. However, the thickness of the protective layer 28 in the third step (the first insulation layer 24 alone) and the thickness of the protective layer 28 in the fifth step (the thickness of the first insulation layer 24 and the second insulation layer 26) are respectively different, and the heat treatment temperatures may be respectively different. Therefore, diffusion amounts and diffusion distances of zinc may be different. Thus, when both the third step and the fifth step are carried out in the fabrication steps, plural lines in the layering direction may be seen in the first insulation layer 24, which lines indicate zinc in the corresponding regions. Accordingly, it is likely that it can be verified whether the heat treatment of the third step has been carried out.

Further, in a case in which the fifth step is carried out, an amount of moisture in the protective layer 28 (particularly the second insulation layer 26) decreases. Therefore, it is likely that, by measuring moisture amounts by thermogravimetric analysis or the like, it may be determined that the third step has been carried out in a case in which a moisture amount is large, and it may be determined that the fifth step has been carried out in a case in which a moisture amount is low.

3. Variant Examples

A particular exemplary embodiment of the present invention has been described in detail, but the present invention is not restricted to this exemplary embodiment. It will be clear to the ordinary practitioner that numerous alternative embodiments are possible within the technical scope of the invention. For example, the plural embodiments described above may be combined as appropriate, and the variant examples described below may also be combined with one another as appropriate.

For example, the fifth step may be omitted from the semiconductor element manufacturing method according to the exemplary embodiment of the present invention. Conversely, further steps in addition to the first to fifth steps may be included.

In the exemplary embodiment described above, as an example, a case is described in which the electrode formation step (of the gate electrode 14 and the source and drain electrodes 20 and 22) and the non-electrode formation step (of the gate insulation layer 16, the active layer 18, the first insulation layer 24 and the second insulation layer 26) are carried out in a sequence that forms the gate electrode 14 as a bottom gate-type gate, and the first insulation layer 24 and second insulation layer 26 are formed to serve as the protective layer 28 of the semiconductor film (the active layer 18). However, as illustrated in FIG. 1C and FIG. 1D, the electrode formation step (of the gate electrode 14 and the source and drain electrodes 20 and 22) and the non-electrode formation step (of the gate insulation layer 16, the active layer 18, the first insulation layer 24 and the second insulation layer 26) may be carried out in a sequence that forms the gate electrode 14 as a top gate-type gate, and the first insulation layer 24 and second insulation layer 26 are formed to serve as the gate insulation layer 16. In this case, the first insulation layer 24 and second insulation layer 26 are formed because a problem of the formation of the gate insulation layer 16 damaging the active layer 18 arises.

When the first insulation layer 24 and the second insulation layer 26 are formed to serve as the gate insulation layer 16, it is desirable if the total thickness of the first insulation layer 24 and the second insulation layer 26 comes to the thickness of the gate insulation layer 16 mentioned above (preferably at least 10 nm and at most 10 nm, more preferably at least 50 nm and at most 1000 nm, and particularly preferably at least 100 nm and at most 400 nm).

In the present exemplary embodiment, a case is described in which, in the electrode formation step, the formation of the source electrode 20 and the drain electrode 22 is carried out between the first step and the second step, such that the source electrode 20 and drain electrode 22 are formed as a top contact-type drain and source. In this case, it is preferable to consider damage to the active layer 18 caused by the formation of the conductive film that constitutes the source electrode 20 and drain electrode 22 as well as damage to the active layer 18 caused by the formation of the protective layer 28. Therefore, considering damage to the active layer 18 in the formation of the conductive film, it is preferable to adjust the thickness of the source electrode 20 and drain electrode 22 and the heat treatment temperature in the third step such that, if the thickness of the source electrode 20 and drain electrode 22 is represented by Y, the relational expression $0<Y<L=8\times 10^{-6}\times T^3-0.0092\times T^2+3.6\times T-468\pm 0.5$ is satisfied. The thickness Z of the first insulation layer 24 and the thickness Y of the source electrode 20 and drain electrode 22 may be the same and may be different. It is preferable if these thicknesses are the same with regard to ease of controlling characteristics, with the level of rectification of surface defects of the active layer 18 being substantially the same at the boundary face thereof that is in contact with the first insulation layer 24 and the boundary faces that is in contact with the source electrode 20 and drain electrode 22.

In a case in which the thickness Y of the source electrode 20 and drain electrode 22 is insufficient in regard to conductivity and the like, an additional conductive film for the source electrode 20 and drain electrode 22 may be formed after the third step.

Alternatively, if, as illustrated in FIG. 1B and FIG. 1D, in the electrode formation step the formation of the source electrode 20 and the drain electrode 22 is carried out before the first step, such that the source electrode 20 and drain electrode 22 are formed as a bottom contact-type source and drain, there is no need to consider damage to the active layer 18 in the formation of the conductive film that constitutes the source electrode 20 and drain electrode 22.

The disclosures of Japanese Patent Application No. 2011-167092 are incorporated into the present specification by reference in their entirety.

All references, patent applications and technical specifications cited in the present specification are incorporated by reference into the present specification to the same extent as if the individual references, patent applications and technical specifications were specifically and individually recited as being incorporated by reference.

4. Applications

Application is not particularly limited to the TFT of the present exemplary embodiment described hereabove. The present invention may be applied to, for example, driving elements of electro-optic devices (display devices such as liquid crystal display devices, organic electroluminescent (EL) display devices, inorganic EL display devices and the like) and so forth, and particularly excellently to cases of use in large-area devices.

Further, the TFT of the exemplary embodiment is particularly excellent for devices using resin substrates that can be manufactured by low-temperature processes (for example, flexible displays and the like), and can also be excellently used as driving elements (driving circuits) in various sensors such as X-ray sensors and the like, and various electronic devices such as microelectromechanical systems (MEMS) and so forth.

5. Electro-Optic Devices and Sensors

An electro-optic device or sensor according to the present exemplary embodiment is equipped with thin film transistors according to the present invention as described above.

Examples of the electro-optic device include display devices (for example, liquid crystal display devices, organic EL display devices, inorganic EL display devices and so forth).

Excellent examples of the sensor include image sensors such as charge coupled devices (CCD), complementary metal oxide semiconductor (CMOS) devices and the like, and X-ray sensors and the like.

Any electro-optic device or sensor using the TFTs according to the present exemplary embodiment has high uniformity of characteristics within a screen. The term "characteristics" as used here is intended to include display characteristics in the case of an electro-optic device (a display device) and sensitivity characteristics in the case of a sensor.

Herebelow, a liquid crystal display device, an organic EL display device and an X-ray sensor are described as representative examples of electro-optic devices and sensors that are equipped with thin film transistors fabricated in accordance with the present exemplary embodiment.

6. Liquid Crystal Display Device

Figure 3:
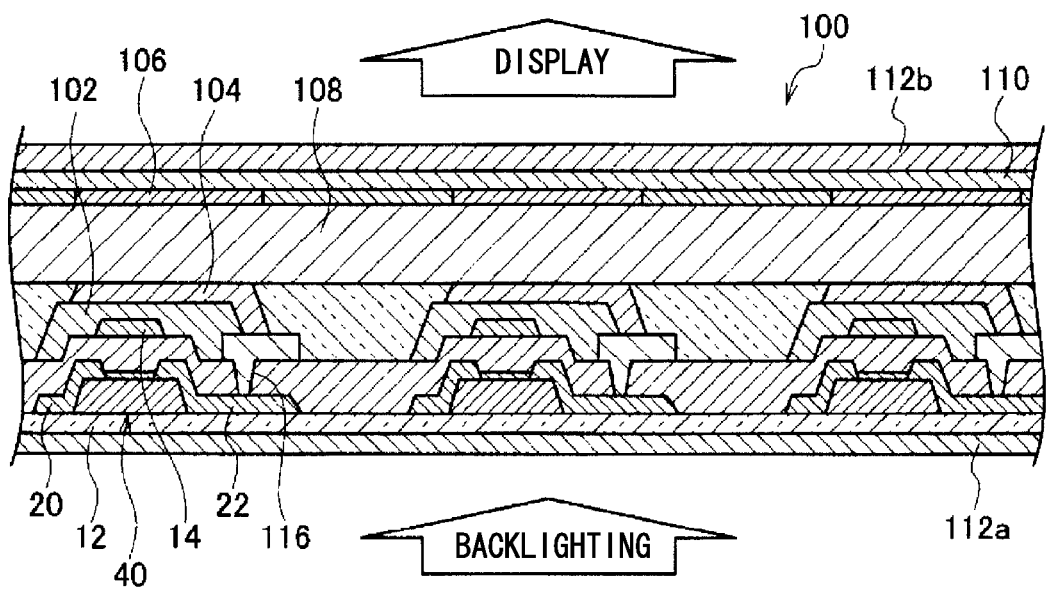
FIG. 3 is a diagram showing a schematic sectional diagram of a portion of a liquid crystal display device in accordance with an exemplary embodiment of an electro-optic device according to the present invention.
Figure 4:
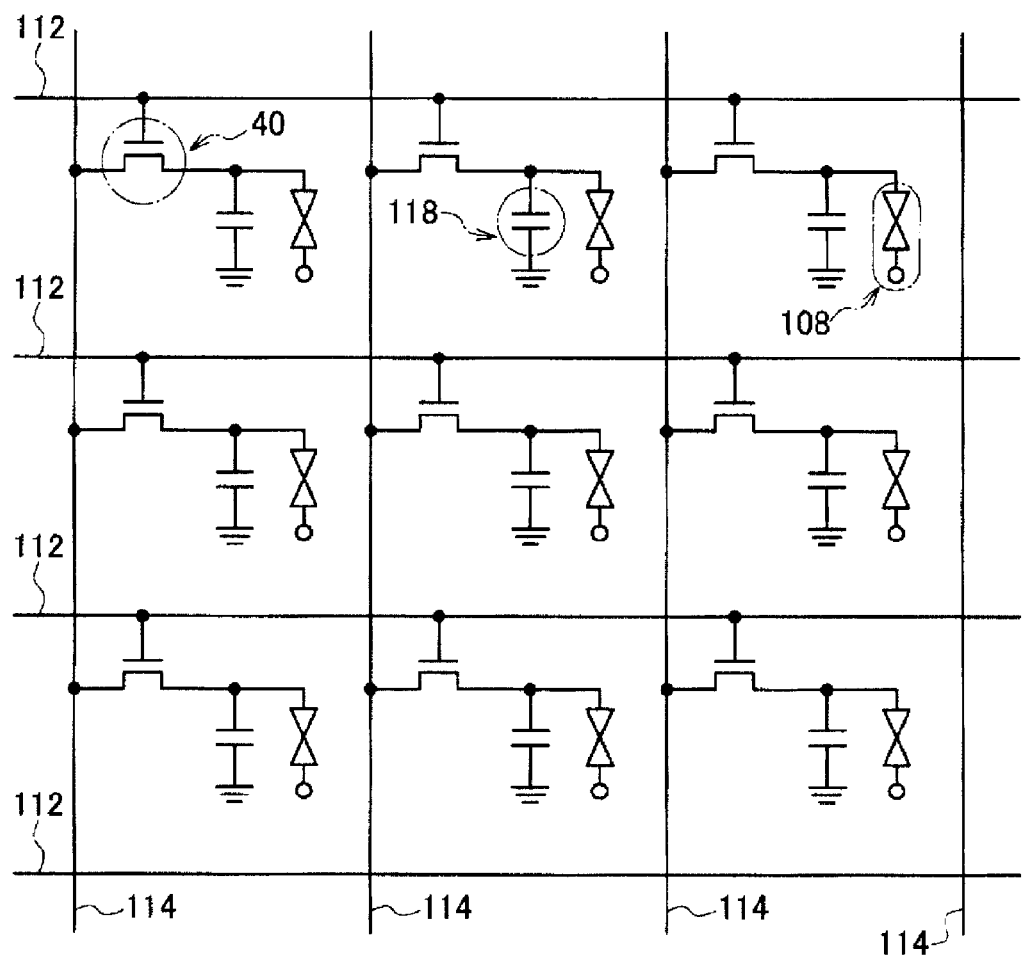
FIG. 4 is a schematic sectional diagram of electronic wiring of the liquid crystal display device shown in FIG. 3.

FIG. 3 shows a schematic sectional diagram of a portion of a liquid crystal display device in accordance with an exemplary embodiment of an electro-optic device according to the present invention, and FIG. 4 shows a schematic sectional diagram of electronic wiring of the liquid crystal display device.

As shown in FIG. 3, a liquid crystal display device 100 according to the present exemplary embodiment is equipped with the top gate structure, top contact-type TFT 40 shown in FIG. 1C, a liquid crystal layer 108 and an RGB color filter 110. The liquid crystal layer 108 is sandwiched between a pixel lower electrode 104 over the gate electrode 14, which is protected by a passivation layer 102 of the TFT 40, and an opposing upper electrode 106. The RGB color filter 110 is provided in correspondence with respective pixels and colors the pixels with different colors. The liquid crystal display device 100 is also equipped with polarizing plates 112a and 112b, at the substrate 12 side of the TFT 40 and over the RGB color filter 110, respectively.

As shown in FIG. 4, the liquid crystal display device 100 according to the present exemplary embodiment is equipped with a plural number of gate lines 112 in parallel with one another, and data lines 114 that are parallel with one another and cross the gate lines 112. The gate lines 112 and data lines 114 are electrically insulated from one another. The TFTs 40 are provided at vicinities of intersection portions of the gate lines 112 and data lines 114.

The gate electrode 14 of each TFT 40 is connected to one of the gate lines 112, and the source electrode 20 of the TFT 40 is connected to one of the data lines 114. The drain electrode 22 of the TFT 40 is connected to the pixel lower electrode 104 via a contact hole 116 formed in the gate insulation layer 16 (the contact hole 116a being filled with a conductor). The pixel lower electrode 104 structures a capacitor 118 together with the opposing upper electrode 106, which is connected to earth.

In the liquid crystal device according to the present exemplary embodiment shown in FIG. 3, the top gate structure TFT 40 is provided. However, TFTs that are used in a liquid crystal device that is a display device in accordance with the present invention are not limited to the top gate structure and may be bottom gate structure TFTs.

Because the TFT of the present exemplary embodiment has unusually high stability at times of light illumination, reliability of the liquid crystal display device is improved.

7. Organic EL Display Device

Figure 5:
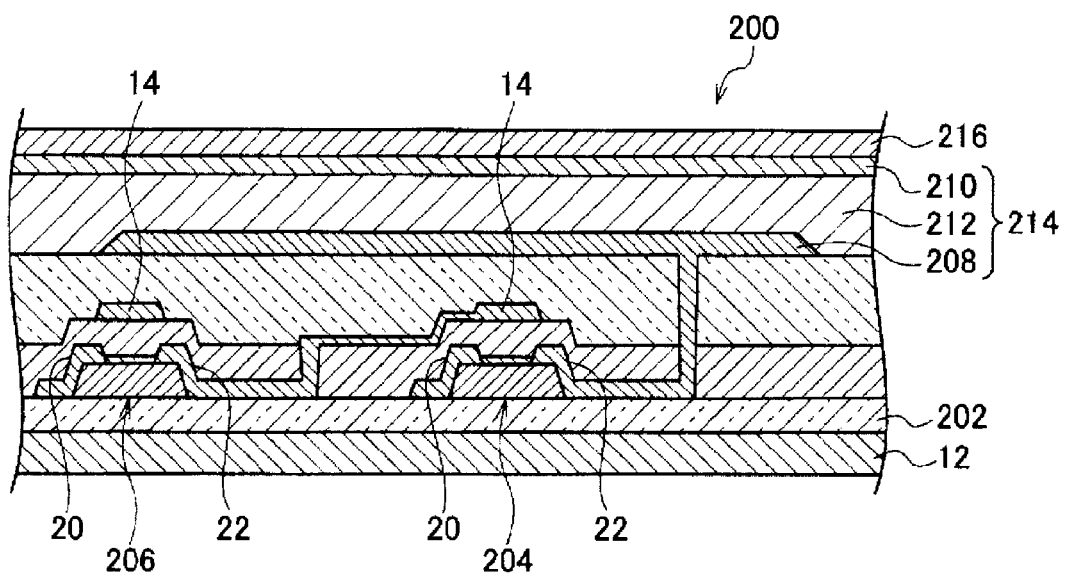
FIG. 5 is a diagram showing a schematic sectional diagram of a portion of an active matrix system organic electroluminescent display device in accordance with an exemplary embodiment of an electro-optic device according to the present invention.
Figure 6:
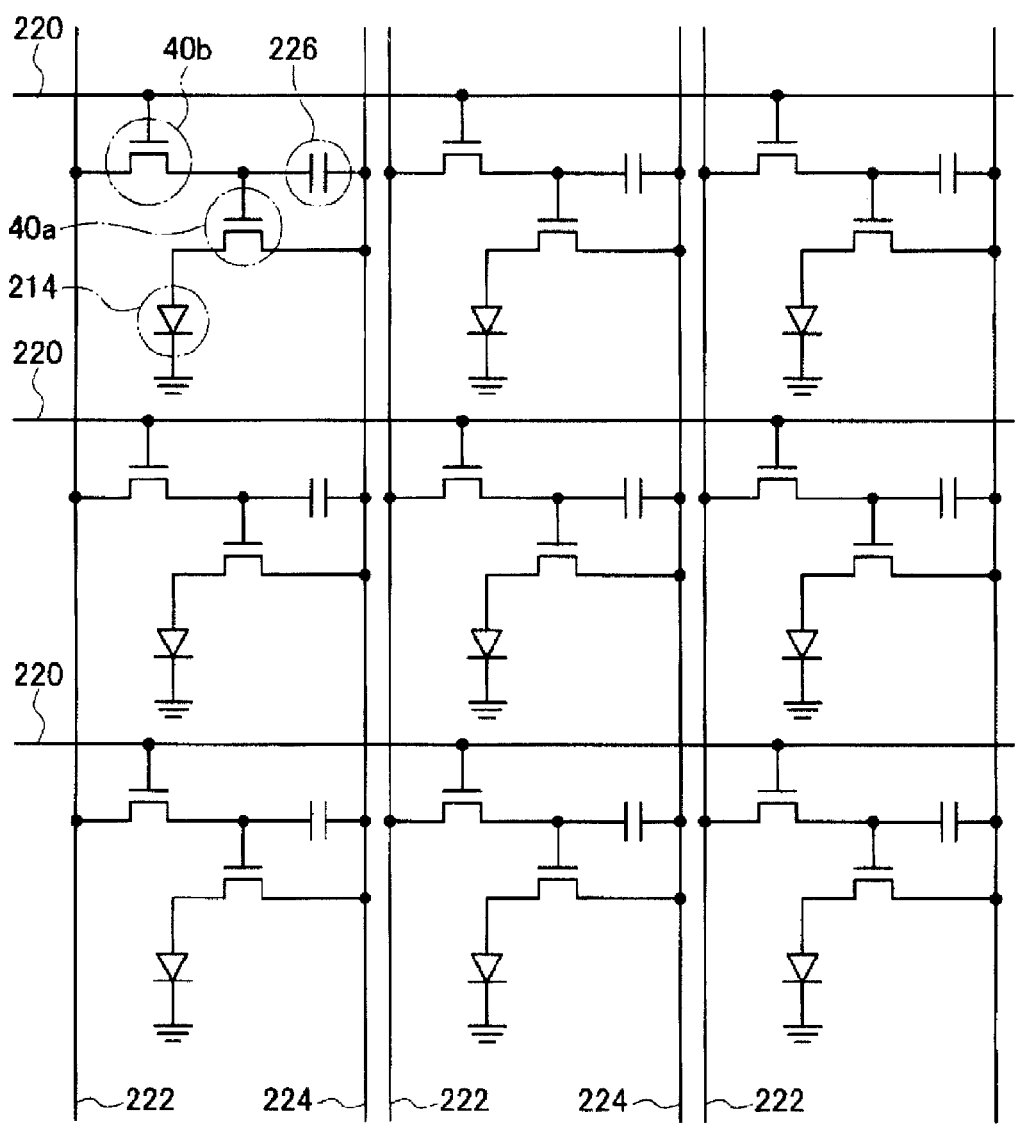
FIG. 6 is a schematic sectional diagram of electronic wiring of the organic electroluminescent display device shown in FIG. 5.

FIG. 5 shows a schematic sectional diagram of a portion of an active matrix-type organic EL display device in accordance with an exemplary embodiment of an electro-optic device according to the present invention, and FIG. 6 shows a schematic sectional diagram of electronic wiring of the organic EL display device.

There are two kinds of driving system for organic EL display devices, passive matrix systems and active matrix systems. A passive matrix system has the advantage that it may be manufactured at low cost. However, scanning lines are selected one at a time and the pixels of each line caused to emit light. Therefore, the number of scanning lines and the light emission duration per scanning line are inversely proportional. This makes it difficult to increase resolution and increase area. In an active matrix system, a transistor and capacitor and suchlike are formed at each pixel. Therefore, manufacturing costs are higher. However, the problems of increasing numbers of scanning lines as in the passive matrix type are absent, which is excellent for increasing resolution and increasing area.

In an active matrix system organic EL display device 200 according to the present exemplary embodiment, the top gate structure TFTs 40 as shown in FIG. 1C are disposed on the substrate 12, which is provided with a passivation layer 202. The TFTs 40 serve as a driving TFT 204 and a switching TFT 206. The organic EL display device 200 is provided with an organic EL light emission element 214 over the TFT 204 and switching TFT 206, which is formed of an organic light emission layer 212 sandwiched between a lower electrode 208 and an upper electrode 210. An upper face of the organic EL light emission element 214 is protected by a passivation layer 216.

As shown in FIG. 6, the organic EL display device 200 according to the present exemplary embodiment is equipped with a plural number of gate lines 220 in parallel with one another, and data lines 222 and driving lines 224 that are parallel with one another and cross the gate lines 220. The gate lines 220, data lines 222 and driving lines 224 are electrically insulated from one another. The gate electrode 14 of each switching TFT 40b is connected to one of the gate lines 220, and the source electrode 20 of the switching TFT 40b is connected to one of the data lines 222. The drain electrode 22 of the switching TFT 40b is connected to the gate electrode 14 of the driving TFT 40 and, using a capacitor 226, holds the driving TFT 40a in the "on" state. The source electrode 20 of the driving TFT 40a is connected to one of the driving lines 224, and the drain electrode 22 is connected to the organic EL light emission element 214.

In the organic EL device according to the present exemplary embodiment that is shown in FIG. 5, the top gate structure TFTs 40a and 40b are provided. However, TFTs that are used in an organic EL device that is a display device in accordance with the present invention are not limited to the top gate structure and may be bottom gate structure TFTs.

Because TFTs manufactured in accordance with the present invention have unusually high stability at times of light illumination, these TFTs are suitable for the manufacture of EL display devices with high reliability.

The organic EL display device shown in FIG. 5 may be a top emission-type display device with the upper electrode 210 being a transparent electrode, or may be made to be a bottom emission-type display device by making the lower electrode 208 and the respective electrodes of the TFTs transparent electrodes.

8. X-Ray Sensor

Figure 7:
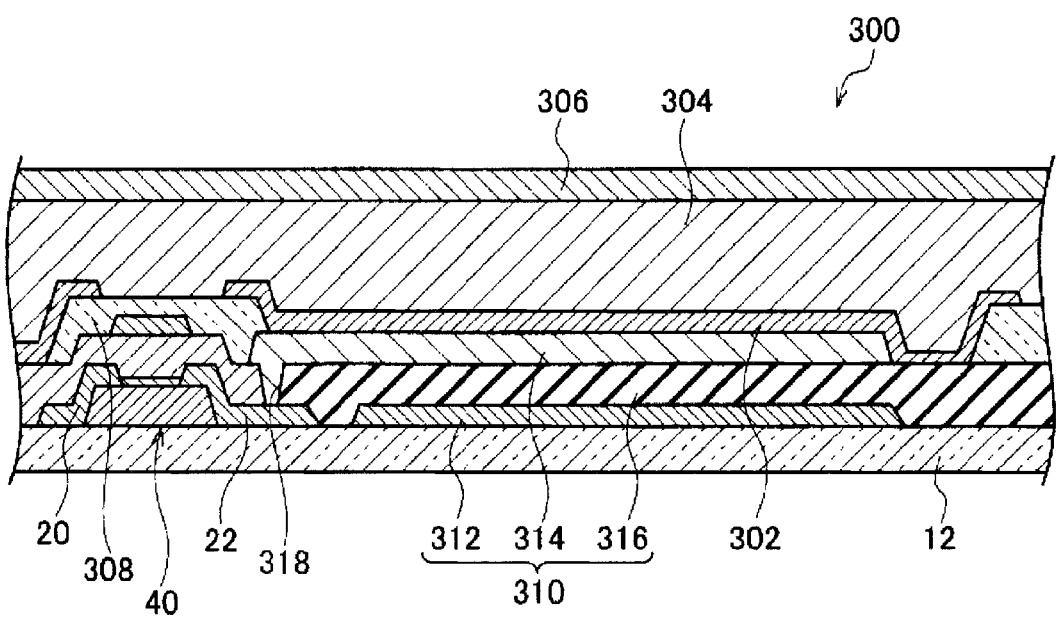
FIG. 7 is a diagram showing a schematic sectional view of a portion of an X-ray sensor in accordance with an exemplary embodiment of a sensor according to the present invention.
Figure 8:
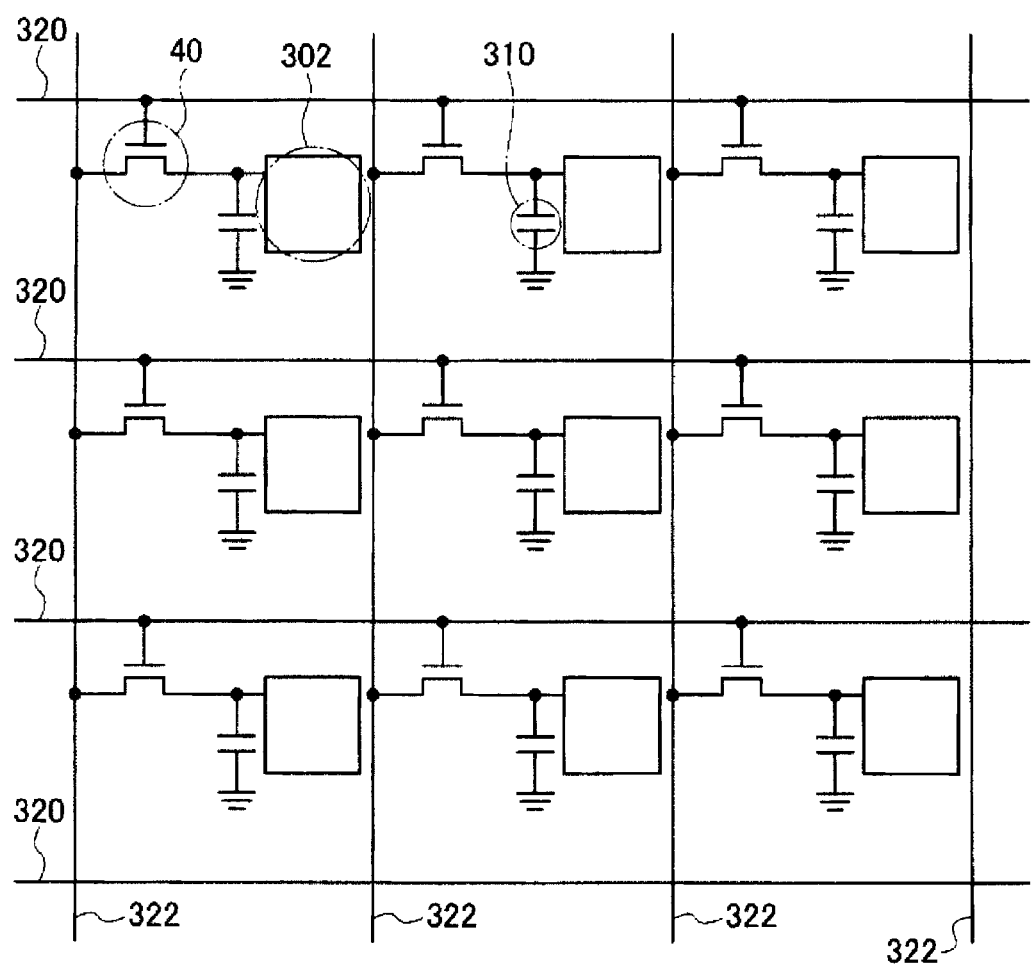
FIG. 8 is a schematic sectional diagram of electronic wiring of the X-ray sensor shown in FIG. 7.

FIG. 7 shows a schematic sectional diagram of a portion of an X-ray sensor in accordance with an exemplary embodiment of a sensor according to the present invention, and FIG. 8 shows a schematic sectional diagram of electronic wiring of the X-ray sensor.

FIG. 7 is, more specifically, a schematic sectional diagram in which a portion of an X-ray sensor array is magnified. An X-ray sensor 300 according to the present exemplary embodiment is equipped with the TFT 40 and a capacitor 310 formed on the substrate 12, a charge collection electrode 302 formed over the capacitor 310, an X-ray conversion layer 304 and an upper electrode 306. A passivation film 308 is provided over the TFT 40.

The capacitor 310 has a structure in which an insulation film 316 is sandwiched between a capacitor lower electrode 312 and a capacitor upper electrode 314. The capacitor upper electrode 314 is connected, via a contact hole 318 formed in the insulation film 316, with one or other of the source electrode 20 and drain electrode 22 of the TFT 40 (in FIG. 7, the drain electrode 22).

The charge collection electrode 302 is disposed on the capacitor upper electrode 314 of the capacitor 310, and is in contact with the capacitor upper electrode 314.

The X-ray conversion layer 304 is a layer formed of amorphous selenium, and is provided so as to cover the TFT 40 and the capacitor 310.

The upper electrode 306 is disposed on the X-ray conversion layer 304, and is in contact with the X-ray conversion layer 304.

As shown in FIG. 8, the X-ray sensor 300 according to the present exemplary embodiment is equipped with a plural number of gate lines 320 in parallel with one another, and a plural number of data lines 322 that are parallel with one another and cross the gate lines 320. The gate lines 320 and data lines 322 are electrically insulated from one another. The TFTs 40 are provided at vicinities of intersection portions of the gate lines 320 and data lines 322.

The gate electrode 14 of each TFT 40 is connected to one of the gate lines 320, and the source electrode 20 of the TFT 40 is connected to one of the data lines 322. The drain electrode 22 of the TFT 40 is connected to the charge collection electrode 302, and the charge collection electrode 302 is connected to the capacitor 310.

At the X-ray sensor 300 according to the present exemplary embodiment, X-rays are irradiated from above in FIG. 7 (the side at which the upper electrode 306 is disposed), and electron-hole pairs are produced in the X-ray conversion layer 304. The generated charges are accumulated at the capacitor 310 by a strong electric field being applied to the X-ray conversion layer 304 by the upper electrode 306. The generated charges are read out by sequential scanning of the TFTs 40.

Because the X-ray sensor 300 according to the present exemplary embodiment is equipped with the TFTs 40 that have high stability at times of light illumination, images that are excellent in uniformity may be obtained.

The X-ray sensor according to the present exemplary embodiment shown in FIG. 7 is equipped with top gate structure TFTs. However, TFTs that are used in a sensor in accordance with the present invention are not limited to the top gate structure and may be bottom gate structure TFTs.

9. Photodiode Manufacturing Method

In the above descriptions, a TFT manufacturing method is described as an example of the semiconductor element manufacturing method. A photodiode manufacturing method is briefly described herebelow as the semiconductor element manufacturing method.

A photodiode according to an exemplary embodiment of the present invention is a horizontal photodiode with metal-semiconductor-metal (MSM) comb electrodes. Although not shown in the drawings, the photodiode is structured with: a single circular photodiode region provided on a semiconductor substrate; a plural number (for example, four) of active regions formed by selective epitaxial growth on the photodiode region; comb electrodes that are provided in respective correspondence with the active regions, are linked to each other, and electrically connect the active regions; and electrodes connected thereto.

Herebelow, a method of manufacturing of the photodiode with the structure described above is described with reference to FIG. 9A to FIG. 9E.

1) First, in order to form a selective epitaxial growth mask on a surface of a silicon substrate 402, a silicon dioxide layer 404 is formed by thermal oxidation.

2) The silicon dioxide layer 404 is etched, and the silicon surface of a window region in which selective epitaxial growth is to be implemented is exposed (patterning).

Figure 9A:
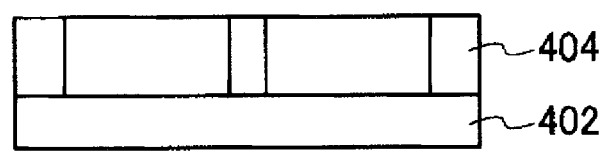
FIG. 9A is a step diagram of a method of manufacturing of a photodiode in accordance with an exemplary embodiment of the present invention.

The condition of the substrate 402 when the above steps have been completed is shown in FIG. 9A.

3) Cleaning is carried out as appropriate.

4) Selective epitaxial growth is implemented at a low temperature (360° C.) by low-pressure (ultra-high vacuum is desirable) CVD equipment, and a semiconductor film 406 that is principally constituted by an oxide semiconductor is grown (film thickness, 50 to 100 nm).

5) Selective epitaxial growth is implemented at a high temperature (700° C. to 750° C.) by low-pressure (ultra-high vacuum is desirable) CVD equipment, and the semiconductor film 406 whose principal constituent is the oxide semiconductor is grown further (film thickness, 0.4 to 1 μm). (This is the first step.)

6) A heat treatment is applied for 30 minutes at 850° C. by a furnace oven.

Figure 9B:
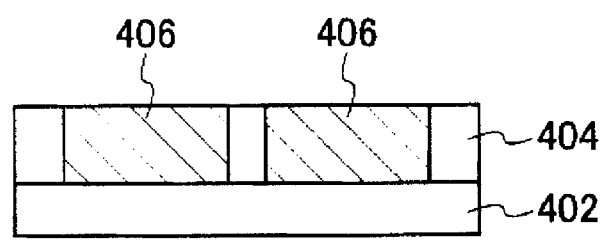
FIG. 9B is a step diagram of the photodiode manufacturing method continuing from FIG. 9A.

The condition of the substrate 402 when the above steps have been completed is shown in FIG. 9B.

7) Deposition of the silicon dioxide layer 404 is carried out.

8) The silicon dioxide layer 404 is etched into a comb electrode pattern.

9) A metal layer that is to form electrodes is formed by sputtering or the like.

10) The silicon dioxide layer 404 is etched, patterning comb electrodes 408.

11) A first insulation film 410 constituted of silicon dioxide is formed to serve as a passivation layer (the second step).

Figure 9C:
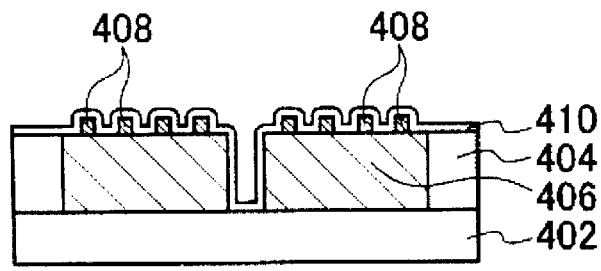
FIG. 9C is a step diagram of the photodiode manufacturing method continuing from FIG. 9B.

The condition of the substrate 402 when the above steps have been completed is shown in FIG. 9C.

Figure 9D:
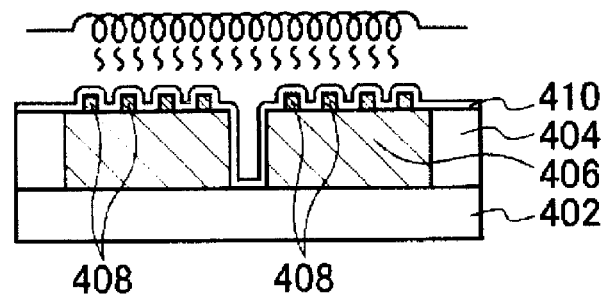
FIG. 9D is a step diagram of the photodiode manufacturing method continuing from FIG. 9C.

12) As illustrated in FIG. 9D, a heat treatment is applied in an oxidizing atmosphere by a furnace oven (the third step). During the second step and the third step, the thickness of the first insulation film 410 and the heat treatment temperature are adjusted such that, if the thickness of the first insulation film 410 is represented by P (nm), the heat treatment temperature in the third step is represented by T (° C.) and the diffusion distance of oxygen into the first insulation film 410 and the semiconductor film 406 is represented by L (nm), the relational expression $0<P<L=8\times10^{-6}\times T^3-0.0092\times T^2+3.6\times T-468\pm0.1$ is satisfied.

13) A second insulation film 412 constituted of silicon dioxide is formed to serve as a further passivation layer (the fourth step).

Figure 9E:
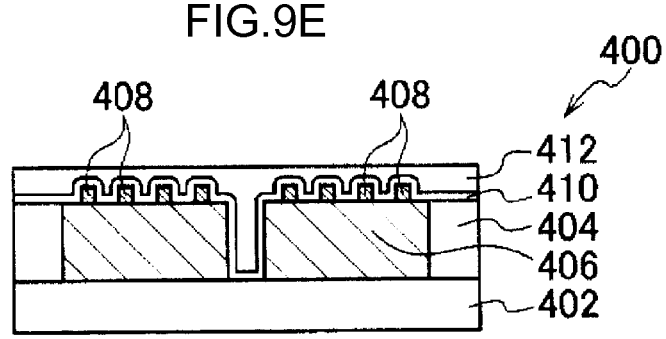
FIG. 9E is a step diagram of the photodiode manufacturing method continuing from FIG. 9D.

By the provision of the fabrication steps described hereabove, a photodiode 400 in accordance with the exemplary embodiment of the present invention is obtained, as shown in FIG. 9E.

According to the fabrication method of the photodiode 400 in accordance with the exemplary embodiment of the present invention as described hereabove, the heat treatment of the third step is applied with the thickness P of the first insulation film 410 and the heat treatment temperature T having been adjusted. Consequently, oxygen in the oxidizing atmosphere may be supplied through the first insulation film 410 to inside the surface of the semiconductor film 406. Therefore, surface defects of the semiconductor film 406 damaged by the film formation of the second step may be satisfactorily rectified, and element characteristics such as ΔVth during light illumination and the like may be stabilized remarkably.

EXAMPLES

Herebelow, Examples are described. The present invention is not restricted in any way by these Examples.

Example 1

Investigation of the Effect of the Presence of the Protective Layer on TFT Characteristics First, how TFT characteristics are affected by whether or not there is a protective layer was investigated in Example 1.

Sample Fabrication of Example 1-1

Figure 10:
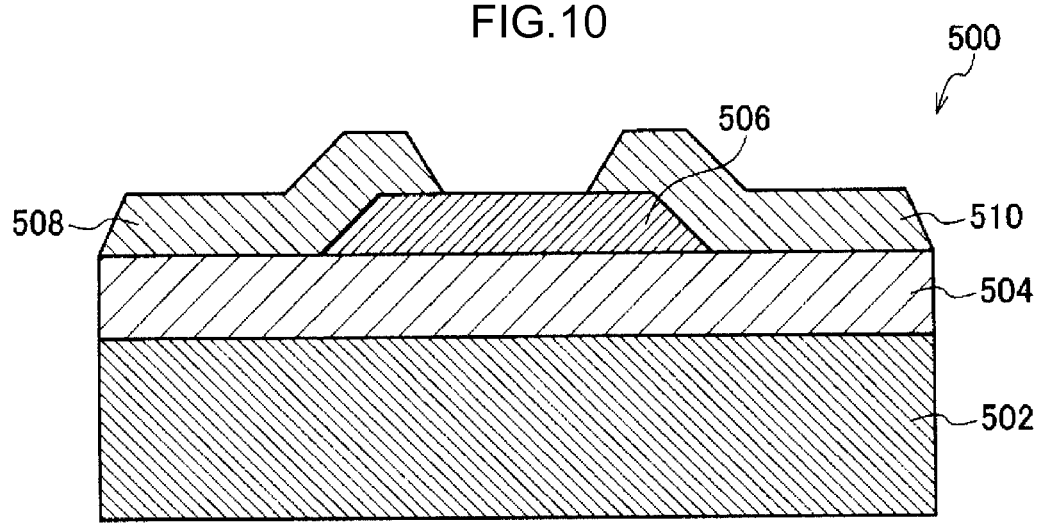
FIG. 10 is a sectional diagram of a TFT obtained by sample fabrication of an Example

FIG. 10 is a sectional diagram of a TFT 500 obtained by the sample fabrication of Example 1-1.

In Example 1, as shown in FIG. 10, a p-type silicon substrate 502 with a thermal oxide film 504 to be a gate electrode was used as the substrate (1-inch square; thickness t, 525 μm; thermal oxide film (silicon dioxide) thickness, 100 nm), and the TFT 500 was fabricated with a simple architecture using the thermal oxide film 504 as the gate insulation film (this is referred to as the sample of Example 1-1).

In concrete terms, the p-type silicon substrate 502 with the thermal oxide film was prepared by resist application and baking, removal of silicon dioxide at the rear face by etching (using BHF), pure water washing, resist removal (using sulfuric acid/hydrogen peroxide), pure water washing and rinsing, and nitrogen blowing. Due to boron doping, the silicon substrate 502 had a resistivity of 0.001 to 0.0013 Ωcm.

An IGZO film (In:Ga:Zn=1:0.9:0.7) was formed to serve as an active layer 506 by DC sputtering to a thickness of 50 nm, using a single target (TOYOSHIMA MFG CO., LTD., In:Ga:Zn=1:1:1) under the following conditions: back pressure, $5\times10^{-6}$ Pa; film formation pressure, 0.8 Pa; argon, 30 sccm ($5.07\times10^{-2}$ Pa·m$^3$/s); oxygen (O$_2$), 0.25 sccm ($4.225\times10^{-4}$ Pa·m$^3$/s); DC 50 W. Ordinarily, after the active layer 506 is formed, patterning would be carried out by photolithography and etching. However, because the effects of contamination and damage at the boundary face of the active layer 506 would be removed by photolithography and etching, patterning film formation was carried out using a metal mask in Example 1, in order to more accurately verify the effects of the present invention. X-ray diffraction measurements verified that the IGZO film was a non-crystalline film.

Then, source and drain electrodes 508 and 510 were formed by sputtering on the active layer 506 (the IGZO layer) under the following conditions: back pressure, $4\times10^{-6}$ Pa; film formation pressure, 0.8 Pa; argon, 30 sccm ($5.07\times10^{-2}$ Pa·m$^3$/s, no oxygen); DC 30 W. The source and drain electrodes 508 and 510 were fabricated by patterned film formation using a metal mask: a 10-nm film of titanium was formed and then a 40-nm film of gold was formed. The source and drain electrodes 508 and 510 were each 1 mm squares, and the electrode separation distance was 0.2 mm.

Next, a heat treatment was performed in an electric oven capable of atmosphere control. The heat treatment atmosphere was an oxidizing atmosphere of argon (80%) and oxygen (20%) at 1 atm pressure, the heat treatment temperature was 400° C., and the heat treatment duration was 1 hour.

Thus, the TFT 500 relating to Example 1-1 was fabricated.

Sample Fabrication of Example 1-2

Then the sample of Example 1-2 was fabricated.

Figure 11:
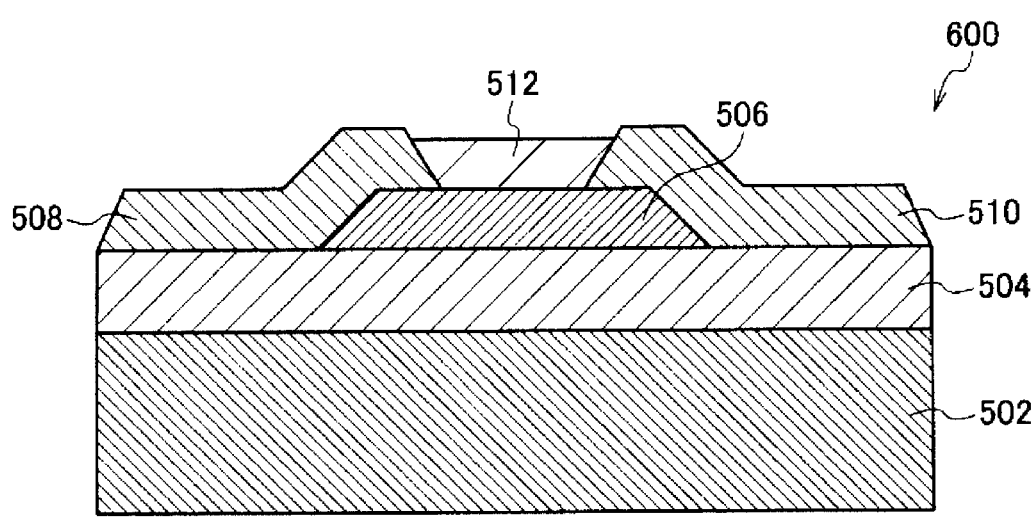
FIG. 11 is a sectional diagram of a TFT obtained by sample fabrication of an Example 1-2.

FIG. 11 is a sectional diagram of a TFT 600 obtained by the sample fabrication of Example 1-2.

In concrete terms, as shown in FIG. 11, the process of fabrication was the same as that of the TFT 500 according to Example 1-1 up to the formation of the source and drain electrodes 510 and 512. After the formation of the source and drain electrodes 508 and 510, a protective layer 512 was formed by RF sputtering on the exposed surface of the active layer 506 between the source and drain electrodes 508 and 510. The protective layer 512 was formed of a gallium oxide (Ga$_2$O$_3$) film with a thickness of 50 nm under the following conditions: back pressure, $5\times10^{-6}$ Pa; film formation pressure, 0.4 Pa; argon, 30 sccm ($5.07\times10^{-2}$ Pa·m$^3$/s); oxygen, 0.3 sccm ($5.07\times10^{-4}$ Pa·m$^3$/s); RF 50 W. This film was also formed by patterned film formation using a metal mask.

Next, the heat treatment was performed in the electric oven capable of atmosphere control. The heat treatment atmosphere was an oxidizing atmosphere of argon (80%) and oxygen (20%) at 1 atm pressure, the heat treatment temperature was 400° C., and the heat treatment duration was 1 hour.

Thus, the TFT 600 relating to Example 1-2 was fabricated.

Evaluation of Example 1

Figure 12:
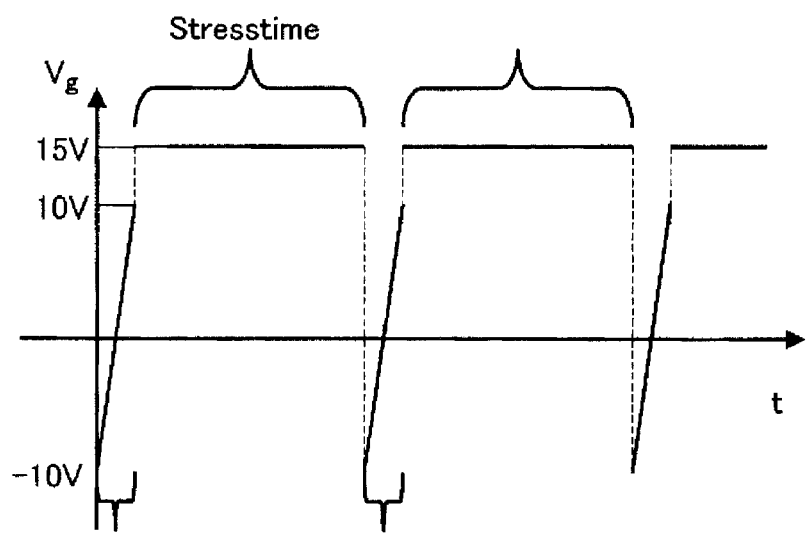
FIG. 12 is a diagram showing a stress flow when a Vg-Id characteristic is being measured.

A comparative evaluation of ΔVth was carried out by a bias stress test of the TFT 500 relating to Example 1-1 and the TFT 600 relating to Example 1-2. In the comparative evaluation, the size of the element was a channel length of 180 μm and a channel width of 1 mm, and VDS (the source-drain voltage) was fixed at 5 V and applied constantly. Vg (the gate voltage) was fixed at 15 V during stress times, Vg was applied from −10 to +10 V at measurement times between 0 and 14,400 seconds (0, 300, 600, 1200, 1800, 2400, 3000, 3600, 5400, 7200, 10800, and 14400 s), and a Vg-Id characteristic was obtained (see FIG. 12 for the stress flow). A semiconductor parameter analyzer (AGILENT TECHNOLOGIES) was used for the measurements of the Vg-Id characteristics. The measurement atmosphere was the ambient atmosphere at room temperature.

Figure 13:
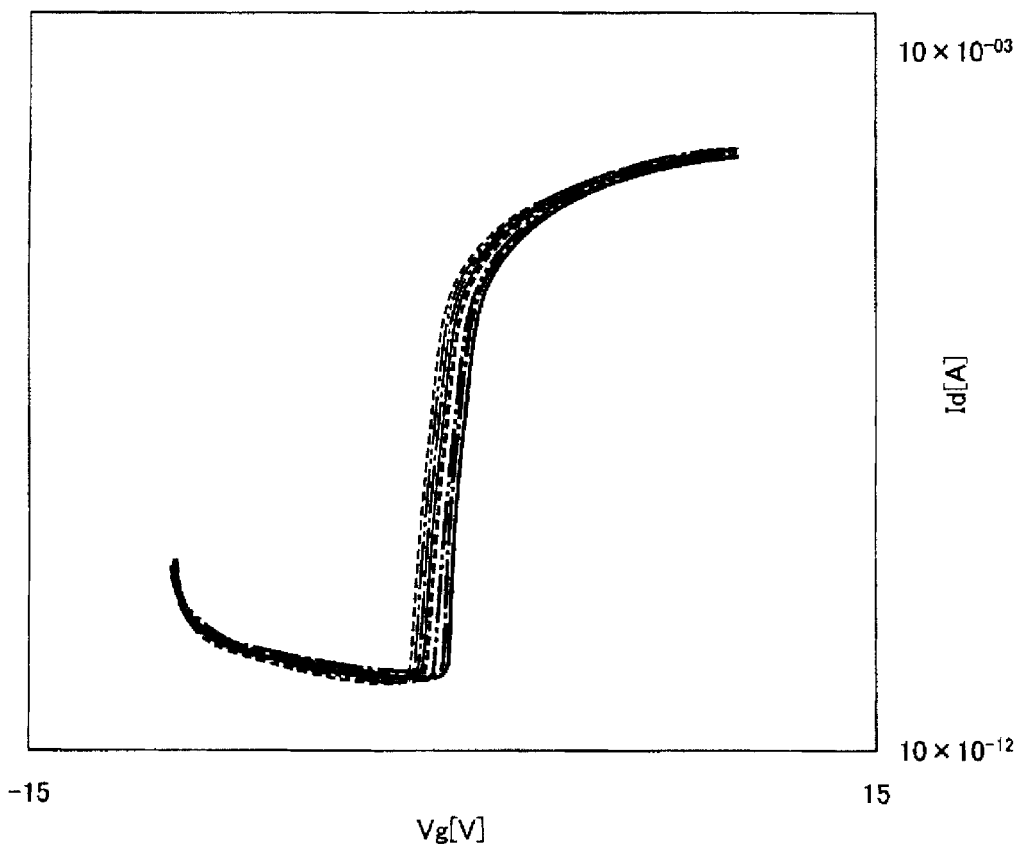
FIG. 13 is a diagram showing results of measurement of the Vg-Id characteristic of the TFT relating to Example 1-1.
Figure 14:
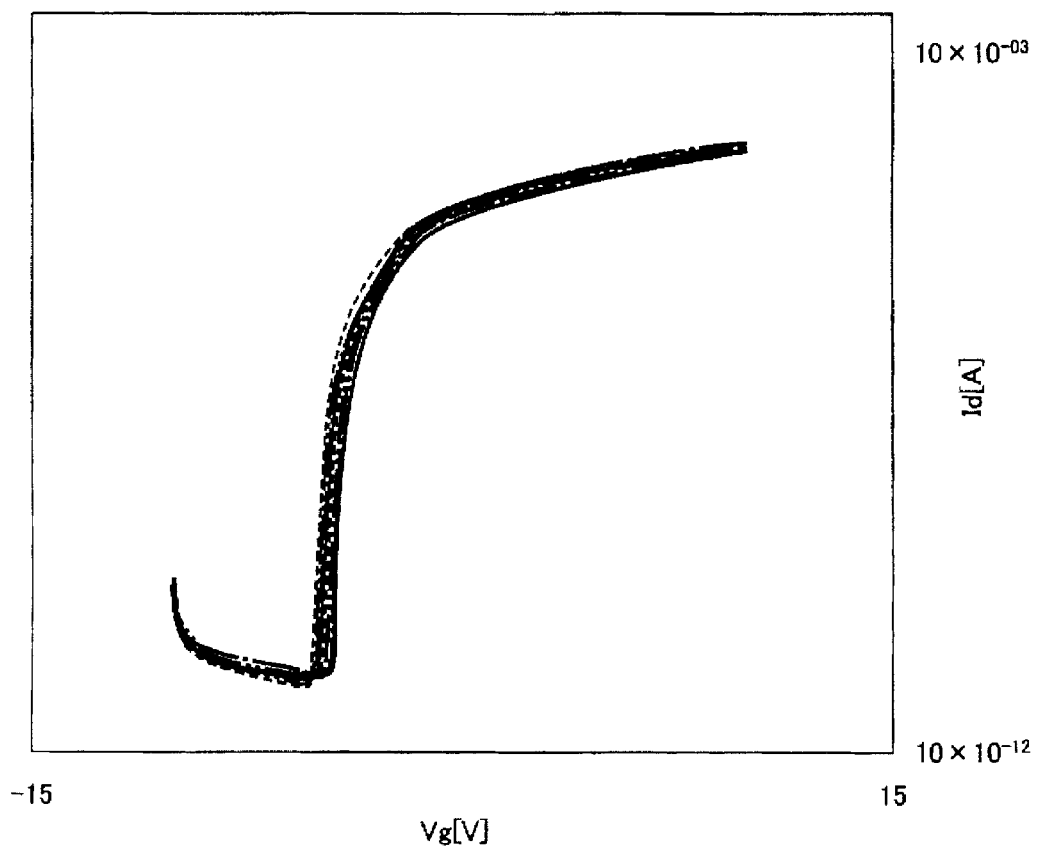
FIG. 14 is a diagram showing results of measurement of the Vg-Id characteristic of the TFT relating to Example 1-2.

FIG. 13 is a diagram showing the results of measurement of the Vg-Id characteristic of the TFT 500 relating to Example 1-1. FIG. 14 is a diagram showing the results of measurement of the Vg-Id characteristic of the TFT 600 relating to Example 1-2.

From a comparison of FIG. 13 with FIG. 14, it can be seen that TFT characteristics are more stable in FIG. 14. When respective ΔVth values (V) are calculated from these results, the TFT 500 relating to Example 1-1 had a ΔVth of 4.98 V, and the TFT 600 relating to Example 1-2 had a ΔVth of 0.66 V. Given that the only difference between the samples of Example 1-1 and Example 1-2 is the presence of the protective layer 512, it is clear that the value of ΔVth is smaller and more stable when the protective layer is present. With the effect of the protective layer, effects of moisture, oxygen and the like from the atmosphere, and of contamination and the like, may be eliminated. In other words, it could be verified that dynamic characteristics change over time if the protective layer 512 is not provided at the IGZO (oxide semiconductor), and that the protective layer 512 is a practical necessity.

Example 2

Investigation of Damage to the Active Layer in Film Formation of the Protective Layer In Example 2 and subsequent Examples, various tests are carried out with the presumption that a protective layer, the necessity of which has been verified, is formed at the oxide semiconductor.

In Example 2, a comparative evaluation was carried out for light illumination characteristics of the TFT 500 of Example 1-1 and light illumination characteristics when a protective layer, formed of a gallium oxide film with a thickness of 50 nm by the same method as in Example 1-2, had been formed on the exposed surface of the active layer 506 of the TFT 500 of Example 1-1. Thus, damage to the active layer from the film formation of the protective layer was investigated.

Figure 15:
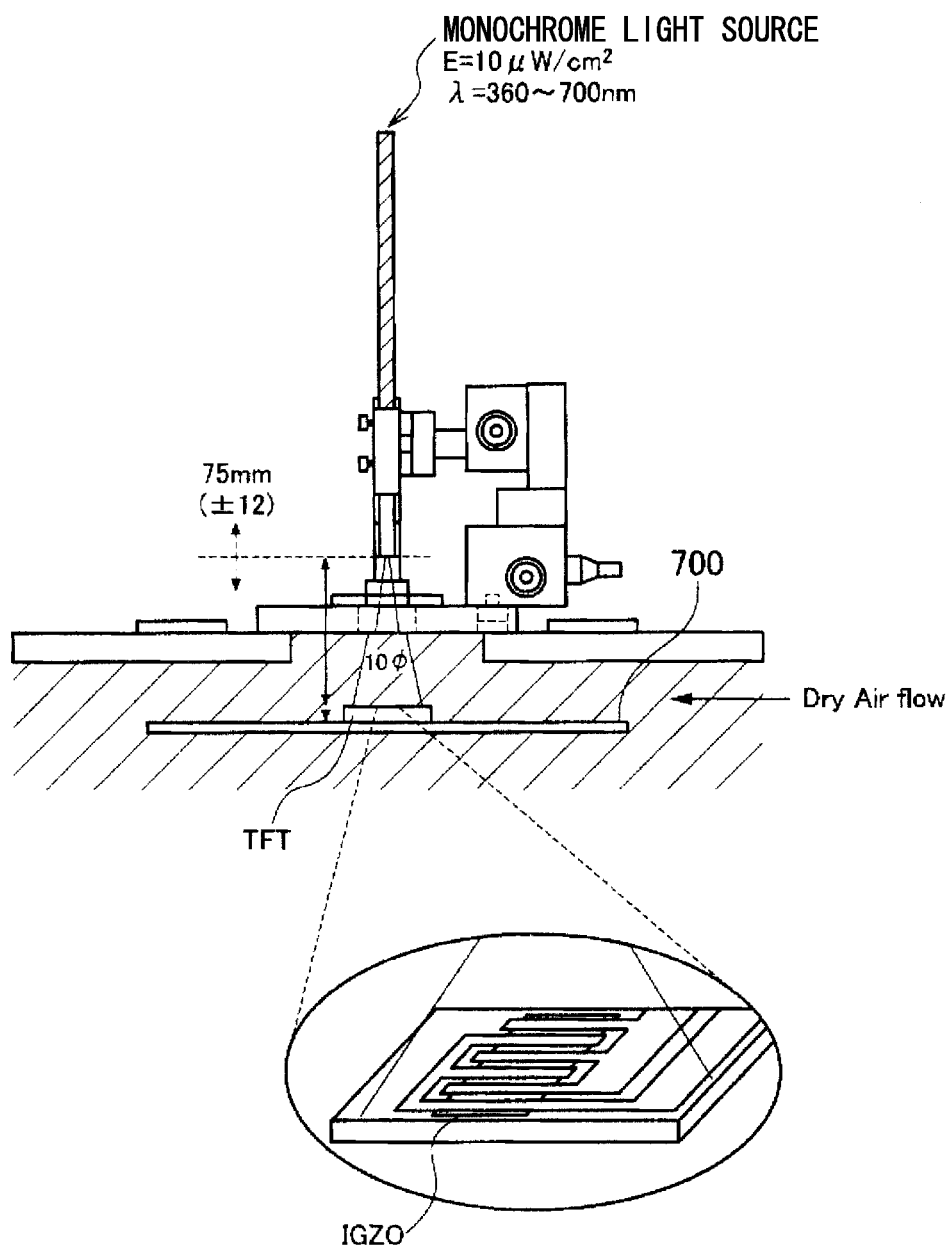
FIG. 15 is a diagram showing equipment for evaluating a light illumination characteristic.

For the evaluation of light illumination characteristics, as shown in FIG. 15, each TFT was placed on a probe stage 700, dry air was flowed for one hour duration, and then a TFT characteristic (the Vg-Id characteristic) was measured in the dry air atmosphere. The measurement conditions of the TFT characteristics during monochrome light illumination were as follows: Vds=10 V; a monochrome light source with an illumination intensity of 10 μW/cm$^2$; and a wavelength λ range of 360 to 700 nm.

Figure 16:
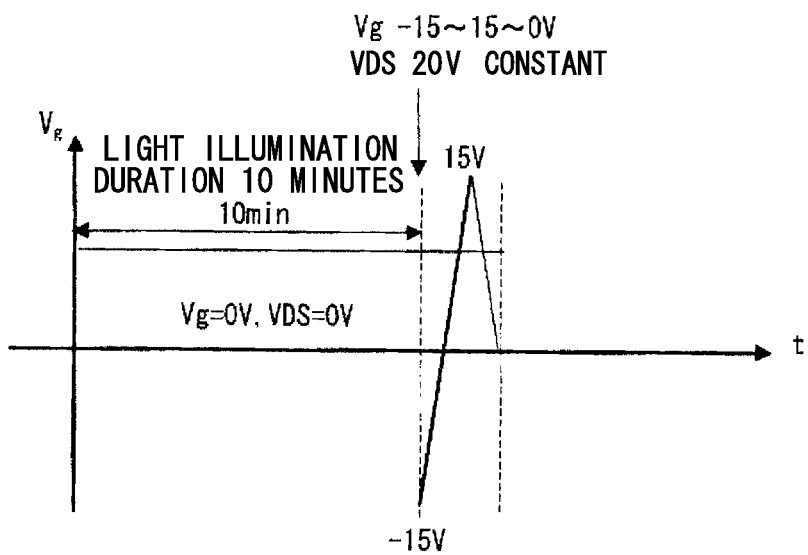
FIG. 16 is a diagram showing a flow of light illumination characteristic evaluation.

FIG. 16 is a diagram showing a flow of the light illumination characteristic evaluation. Firstly, the measurement target TFT was left for 1 hour in a dark environment (in order to eliminate the effects of roomlight in an element storage environment). Then, in a state in which no voltage was applied as Vg or VDS, light was illuminated at the TFT (light from a xenon lamp was dispersed to 10 μW/cm$^2$). After an illumination duration of 10 minutes, Vg and VDS were applied, and the Vg-Id characteristic was measured with the light illumination continuing. Vth had been calculated beforehand from a Vg-Id characteristic when no light is illuminated. For each wavelength, ΔVth was calculated by reference to the calculated Vth from the measurement results of the Vg-Id characteristic during light illumination. In order to eliminate the effects of times of light illumination of the respective measurements, when one measurement was completed (for example, 500 nm), the TFT was then left in the dark environment until the Vg-Id characteristic when no light is illuminated was reproduced. The above steps were repeated until all measurements were completed.

Figure 17:
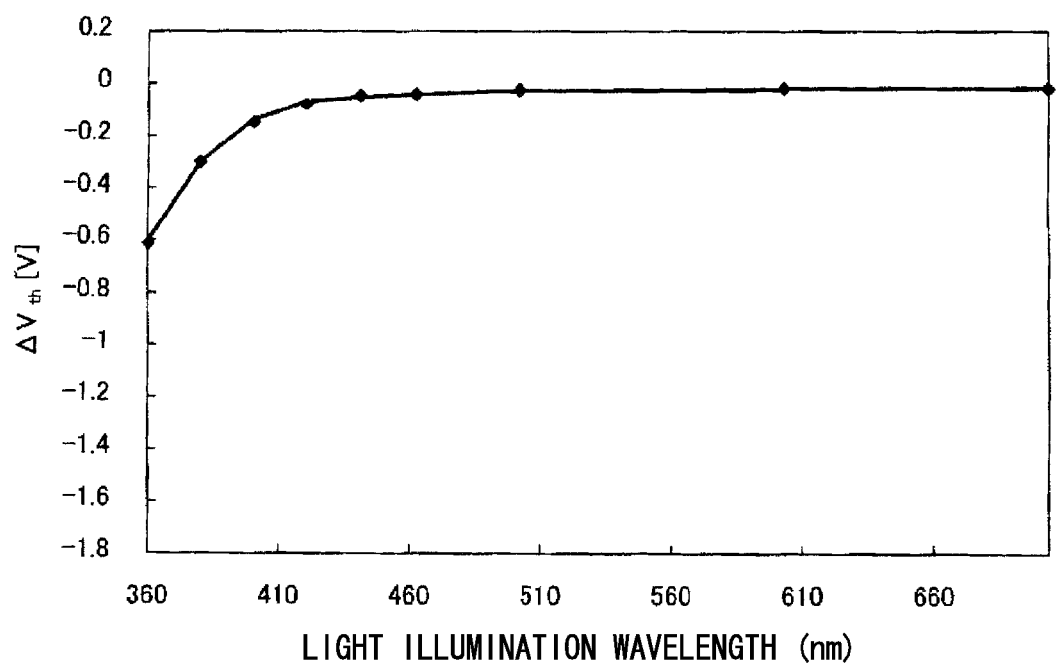
FIG. 17 is a diagram showing results of calculation of ΔVth during light illumination for the sample of Example 1-1.
Figure 18:
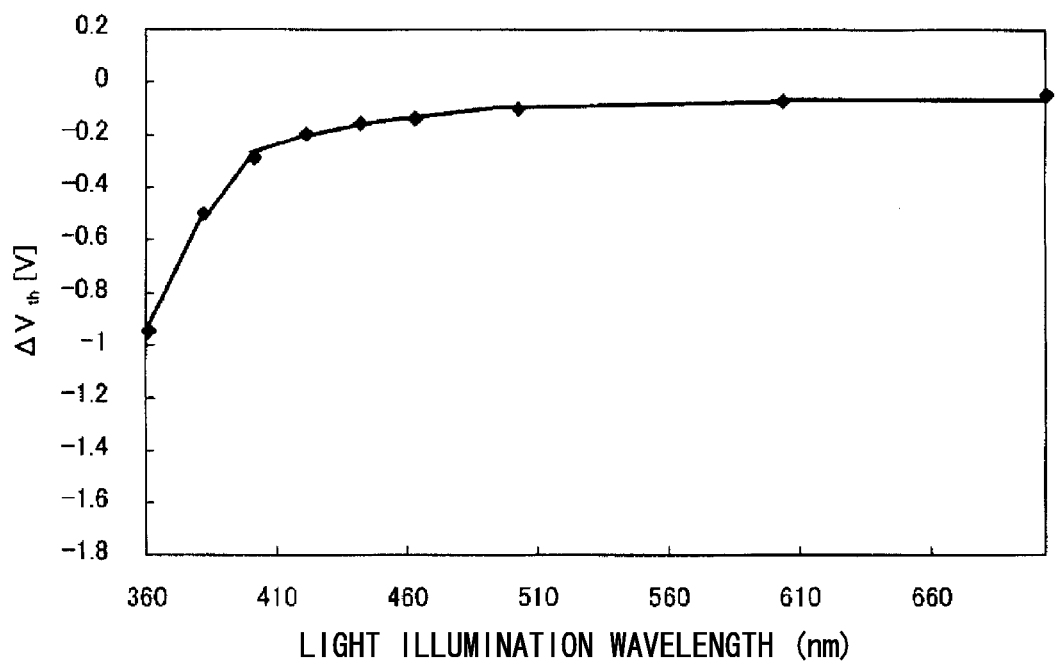
FIG. 18 is a diagram showing results of calculation of ΔVth during light illumination for a sample in which a protective layer is formed by the same method as in Example 1-2 on an exposed surface of an active layer of the sample of Example 1-1.

FIG. 17 is a diagram showing results of the calculation of ΔVth during light illumination for the sample of Example 1-1. FIG. 18 is a diagram showing results of the calculation of ΔVth during light illumination for the sample in which the protective layer is formed by the same process as in Example 1-2 on the exposed surface of the active layer 506 of the sample of Example 1-1. Table 2 summarizes ΔVth and mobility during light illumination for the sample of Example 1-1 (no protective layer), and ΔVth and mobility during light illumination for the sample in which the protective layer is formed by the same method as in Example 1-2 on the exposed surface of the active layer 506 of the sample of Example 1-1.

TABLE 2

| Wavelength (nm) | ΔVth without protective layer (V) | Mobility without protective layer (cm$^2$/(Vs)) | ΔVth with protective layer (V) | Mobility with protective layer (cm$^2$/(Vs)) |
| --- | --- | --- | --- | --- |
| 360 | −0.6 | 11.6 | −0.95 | 11.8 |
| 380 | −0.3 | 11.3 | −0.55 | 11.5 |
| 400 | −0.15 | 11.2 | −0.3 | 11.3 |
| 420 | −0.12 | 11.2 | −0.2 | 11.2 |
| 440 | −0.11 | 11.2 | −0.18 | 11.2 |
| 460 | −0.08 | 11.2 | −0.16 | 11.2 |
| 500 | −0.05 | 11 | −0.15 | 11.2 |
| 600 | 0 | 11 | −0.14 | 11.2 |
| 700 | 0 | 11 | −0.14 | 11.2 |

From the results shown in FIG. 17, FIG. 18 and Table 2, it can be seen that there is a shift in ΔVth when the protective layer that has been verified as necessary is formed at the oxide semiconductor. In particular, it can be seen that the shift in ΔVth increases further in the negative direction for shorter wavelengths. This is likely to be because the surface of the active layer 506 was damaged by the film formation of the protective layer and surface defects of the active layer 506 were more numerous (there were more carriers).

Example 3

Investigation of Light Illumination Characteristics in Accordance with the Thickness of the Protective Layer During the Heat Treatment In Example 3, light illumination characteristics in accordance with the thickness of the protective layer during the heat treatment were investigated using the TFT 600, the same as in Example 1-2, as a sample of Example 3-1 (also referred to as Comparative Example 1) and a TFT as described below as a sample of Example 3-2 (also referred to as Practical Example 1).

Sample Fabrication of Example 3-2

Figure 19:
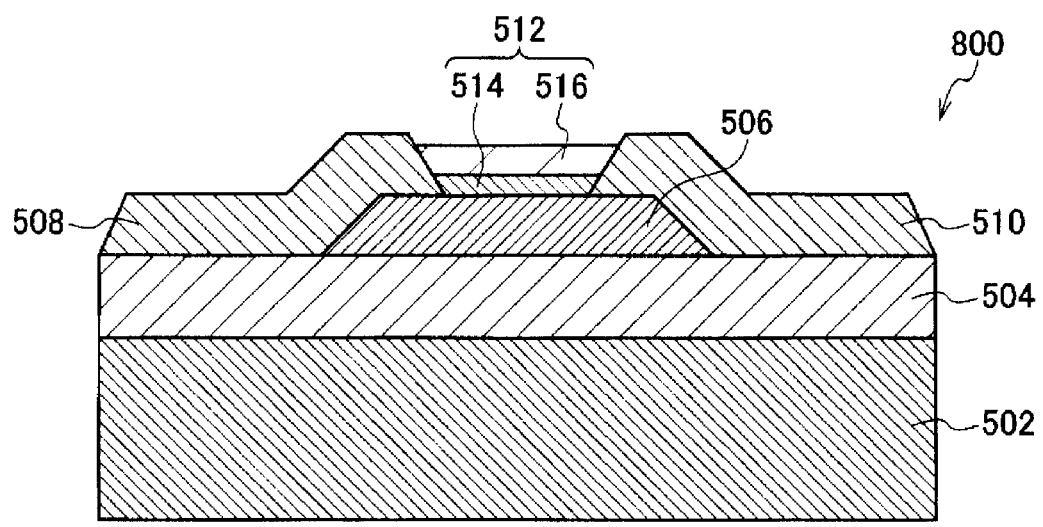
FIG. 19 is a sectional diagram of a TFT obtained by sample fabrication of an Example 3-2.

FIG. 19 is a sectional diagram of a TFT 800 obtained by the sample fabrication of Example 3-2.

In the sample fabrication of Example 3-2, the 50 nm thick protective layer 512 of the TFT 600 is divided into two layers, a first insulation film 514 and a second insulation film 516, and the heat treatment is applied after the formation of the first insulation film 514.

In concrete terms, as shown in FIG. 19, the process of fabrication was the same as that of the TFT 500 relating to Example 1-1 up to the formation of the source and drain electrodes 510 and 512. After the formation of the source and drain electrodes 510 and 512, the first insulation film 514 was formed by RF sputtering on the exposed surface of the active layer 506. The first insulation film 514 was formed of a gallium oxide ($Ga_2O_3$) film with a thickness of 10 nm under the following conditions: back pressure, $5 \times 10^{-6}$ Pa; film formation pressure, 0.4 Pa; argon, 30 sccm ($5.07 \times 10^{-2}$ Pa·m³/s); oxygen, 0.3 sccm ($5.07 \times 10^{-4}$ Pa·m³/s); RF 50 W. This film was also formed by patterned film formation using a metal mask.

Next, the heat treatment was performed in the electric oven capable of atmosphere control. The heat treatment atmosphere was an oxidizing atmosphere of argon (80%) and oxygen (20%) at 1 atm pressure, the heat treatment temperature was 400° C., and the heat treatment duration was 1 hour.

After the heat treatment, the second insulation film 516 was formed by RF sputtering of a gallium oxide film with a thickness of 40 nm under the same conditions as the formation of the first insulation film 514, on the exposed surface of the active layer 506. This film was also formed by patterned film formation using a metal mask.

Thus, the TFT 800 relating to Example 3-2 was fabricated.

—Evaluation of Light Illumination Characteristics—

An evaluation of light illumination characteristics such as the Vg-Id characteristic, ΔVth and the like was applied to the fabricated TFT 600 relating to Example 3-1 and TFT 800 relating to Example 3-2. The evaluation of the light illumination characteristics was carried out using the same method as in Example 2.

Figure 20:
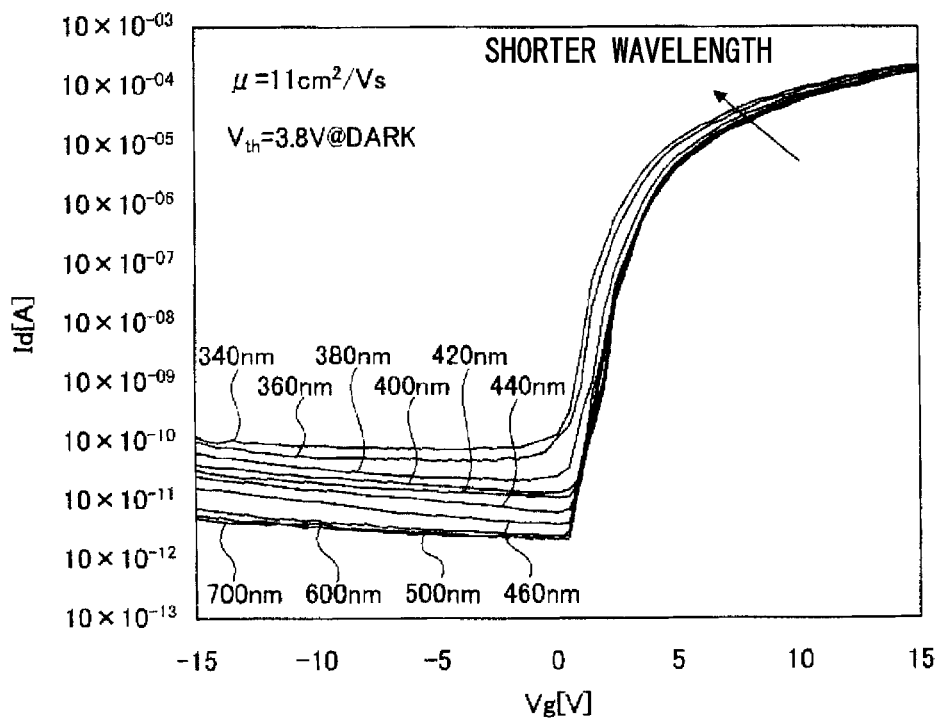
FIG. 20 is a diagram showing results of measurement of the Vg-Id characteristic of a TFT relating to an Example 3-1.
Figure 21:
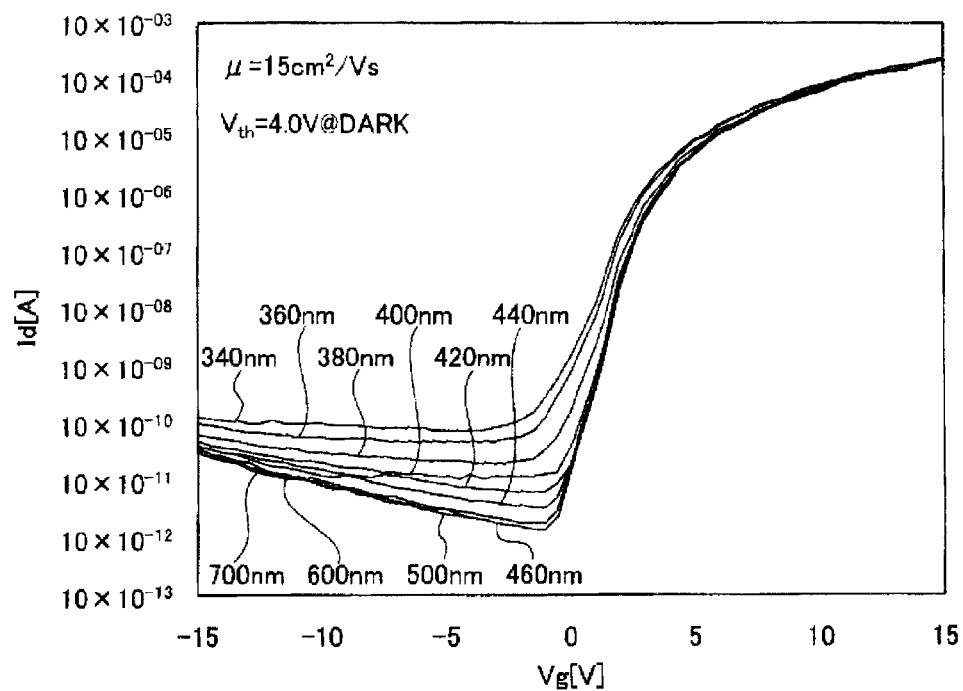
FIG. 21 is a diagram showing results of measurement of the Vg-Id characteristic of the TFT relating to Example 3-2.

FIG. 20 is a diagram showing the results of measurement of the Vg-Id characteristic of the TFT 600 relating to Example 3-1. FIG. 21 is a diagram showing the results of measurement of the Vg-Id characteristic of the TFT 800 relating to Example 3-2.

From FIG. 20, it can be seen that in Example 3-1 (the TFT 600 relating to Comparative Example 1), the shorter the wavelength, the greater the characteristic shift. In contrast, from FIG. 21 it can be seen that in Example 3-2 (the TFT 800 relating to Practical Example 1), characteristic shifts are smaller than for the TFT 600.

Figure 22:
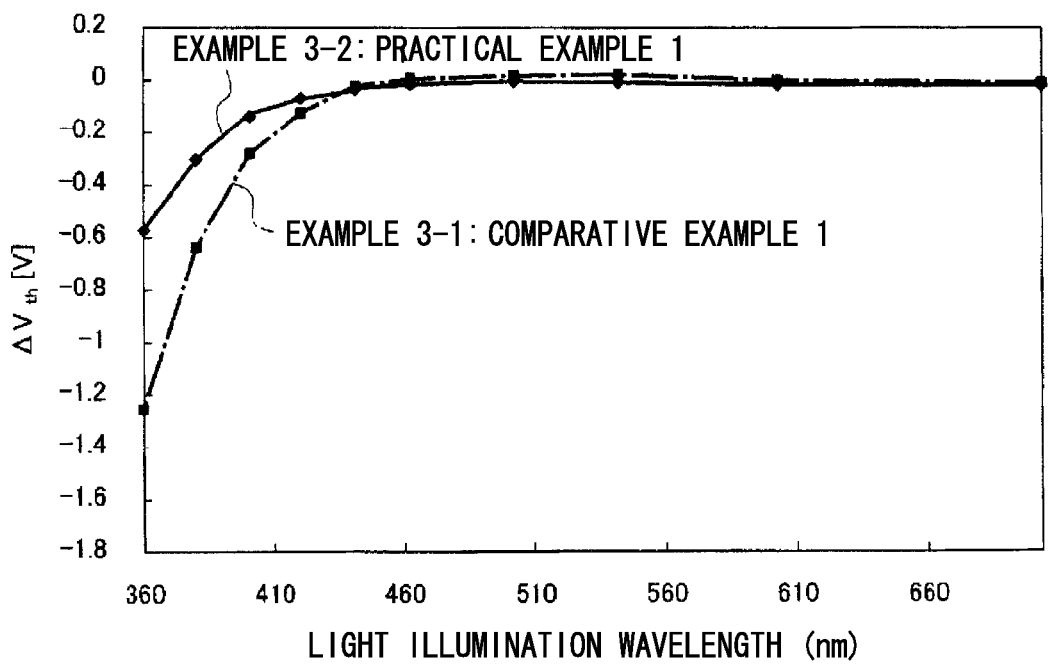
FIG. 22 is a diagram showing results of calculation of ΔVth during light illumination for each of the TFT relating to Example 3-1 and the TFT relating to Example 3-2.

FIG. 22 is a diagram showing results of the calculation of ΔVth during light illumination for each of the TFT 600 relating to Example 3-1 and the TFT 800 relating to Example 3-2.

From FIG. 22, it can be seen that in both Example 3-1 (the TFT 600 relating to Comparative Example 1) and Example 3-2 (the TFT 800 relating to Practical Example 1), there is no difference from ΔVth during light illumination for wavelengths from 700 nm to around 440 nm. However, for wavelengths shorter than 440 nm, the difference is remarkable.

That is, for wavelengths shorter than 440 nm, ΔVth in Example 3-2 (the TFT 800 relating to Practical Example 1) is remarkably improved (approaching 0 V) compared to ΔVth in Example 3-1 (the TFT 600 relating to Comparative Example 1).

This may be supposed to be because, in the fabrication process of Example 3-2 (the TFT 800 relating to Practical Example 1), the thickness of the protective layer 512 during the heat treatment of the third step (just the thickness of the first insulation film 514) was thin at 10 nm, and therefore oxygen was supplied to inside the boundary face of the active layer 18 that was in contact with the first insulation film 514, and surface defects caused by the film formation of the first insulation film 514 were rectified.

Example 4

Investigation of the Oxygen Diffusion Depth in the Heat Treatment of the Third Step Accordingly, in order to verify the above supposition, to what depths oxygen in the oxidizing atmosphere diffused into the protective layer 512 and the active layer 506 in the heat treatment of the third step was investigated in relation to the heat treatment temperature.

Sample Fabrication Relating to Example 4

In the fabrication of a sample relating to Example 4, the process was the same as that of the TFT 500 relating to Example 1-1 up to the formation of the active layer. Then, the source electrode and drain electrode were not formed on the surface of the active layer but a protective layer formed of a gallium oxide film with a thickness of 50 nm was directly formed on the surface of the active layer by the same method as in Example 1-2. These steps were repeated to prepare four samples.

The four prepared samples were subjected to the heat treatment with heat treatment temperatures of 300° C., 350° C., 400° C. and 450° C. in an atmosphere of O18 gas, which is a stable isotope of oxygen (1802 gas, commercially available from TAIYO NIPPON SANSO CORPORATION). The stable isotope of oxygen O18 is expected to diffuse into the protective layer and the active layer with substantially the same diffusion distances as ordinary O16. Herein, the sample subjected to the heat treatment at 300° C. is referred to as the sample of Example 4-1, the sample subjected to the heat treatment at 350° C. is referred to as the sample of Example 4-2, the sample subjected to the heat treatment at 400° C. is referred to as the sample of Example 4-3, and the sample subjected to the heat treatment at 450° C. is referred to as the sample of Example 4-4.

The flow of the heat treatment is the same as in the heat treatment described for Example 1 and the like. However, because the stable isotope of oxygen O18 was used in Example 4, the heat treatment is described more concretely.

Figure 23:
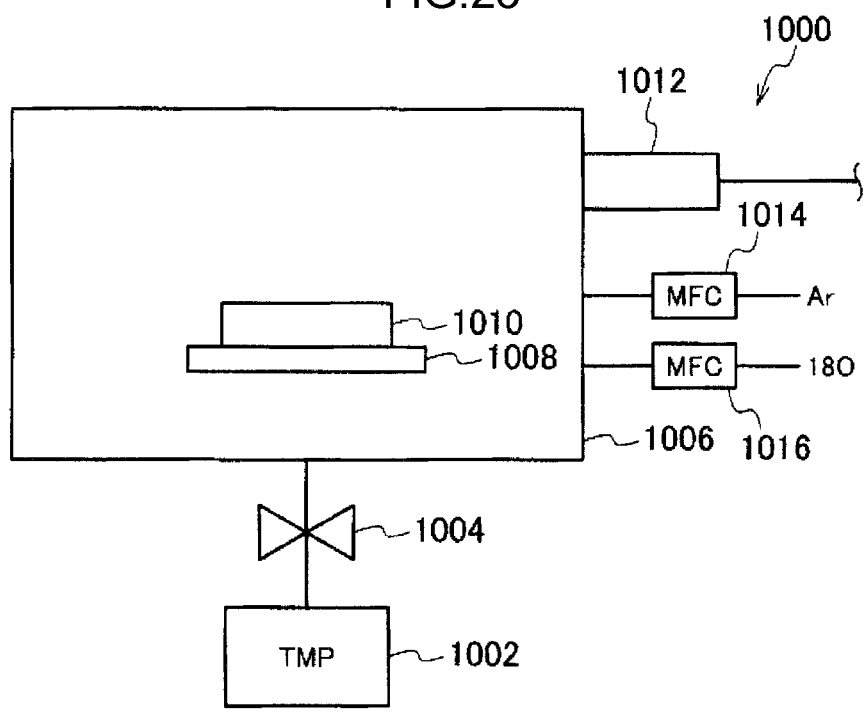
FIG. 23 is a diagram showing a system structure at a time of a heat treatment.

FIG. 23 is a diagram showing a system structure 1000 at the time of the heat treatment.

In the system structure 1000 of the time of the heat treatment, a turbo-molecular pump 1002 is connected to a chamber 1006 via a main valve 1004. A heater 1008 is disposed in the chamber 1006, and a heat treatment target sample 1010 is disposed on the heater 1008. A vacuum gauge 1012, a mass flow controller 1014 and a mass flow controller 1016 are also connected to the chamber 1006.

For the heat treatment, the sample 1010 was placed on the heater 1008 in the chamber 1006 of the system structure 1000.

Then the main valve 1004 was opened and the turbo-molecular pump 1002 operated, evacuating the interior of the chamber 1006. Next, the main valve 1004 was closed and O18 gas was introduced up to a vacuum measurement of approximately 0.02 Pa. Then argon gas was introduced up to atmospheric pressure (0.1 MPa). The heater 1008 was turned on with a rate of temperature rise of 8° C./minute, heated the sample to a target temperature, and thereafter maintained the target temperature for 30 minutes. Finally, the heater 1008 was turned off and the chamber cooled to room temperature, and the sample was removed. Thus, the heat treatment was completed. SIMS analysis was applied to the samples into which the O18 had diffused. To what depth the O18 diffused under a particular heat treatment temperature could be evaluated by detecting the O18 in the SIMS analysis.

—SIMS Analysis—

The SIMS analysis was applied to the fabricated samples of Example 4-1 to Example 4-4. Specifically, the SIMS analysis used the model PHI ADEPT 1010 from ULVAC-PHI, INC. as the SIMS analyzer. The analysis environment was as follows: primary ion, Cs+; primary acceleration voltage, 3.0 kV; detection area 56×56 (μm×μm). Negative polarities of secondary ions from the samples were detected.

Figure 24:
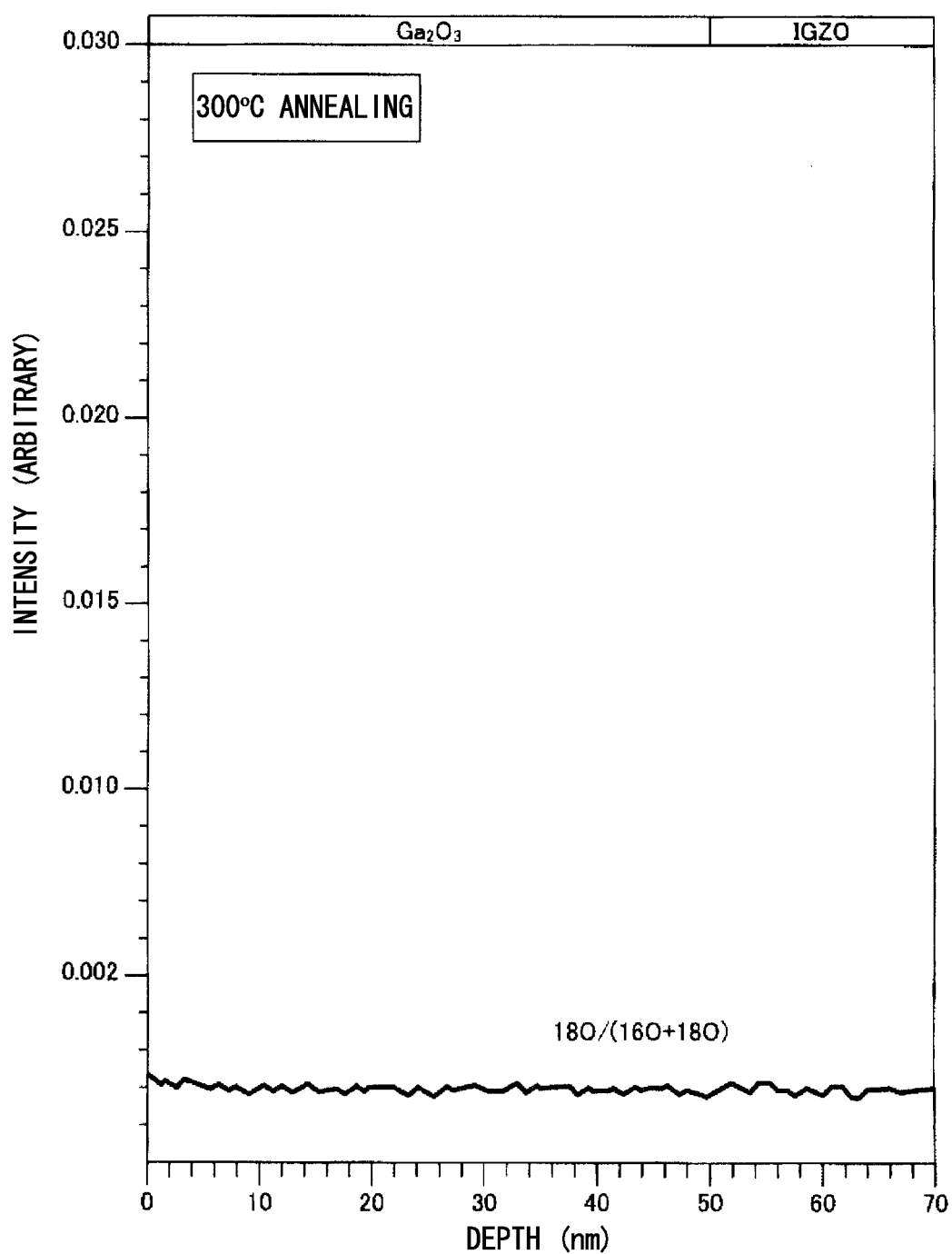
FIG. 24 is a diagram showing SIMS analysis results of a sample of an Example 4-1.
Figure 25:
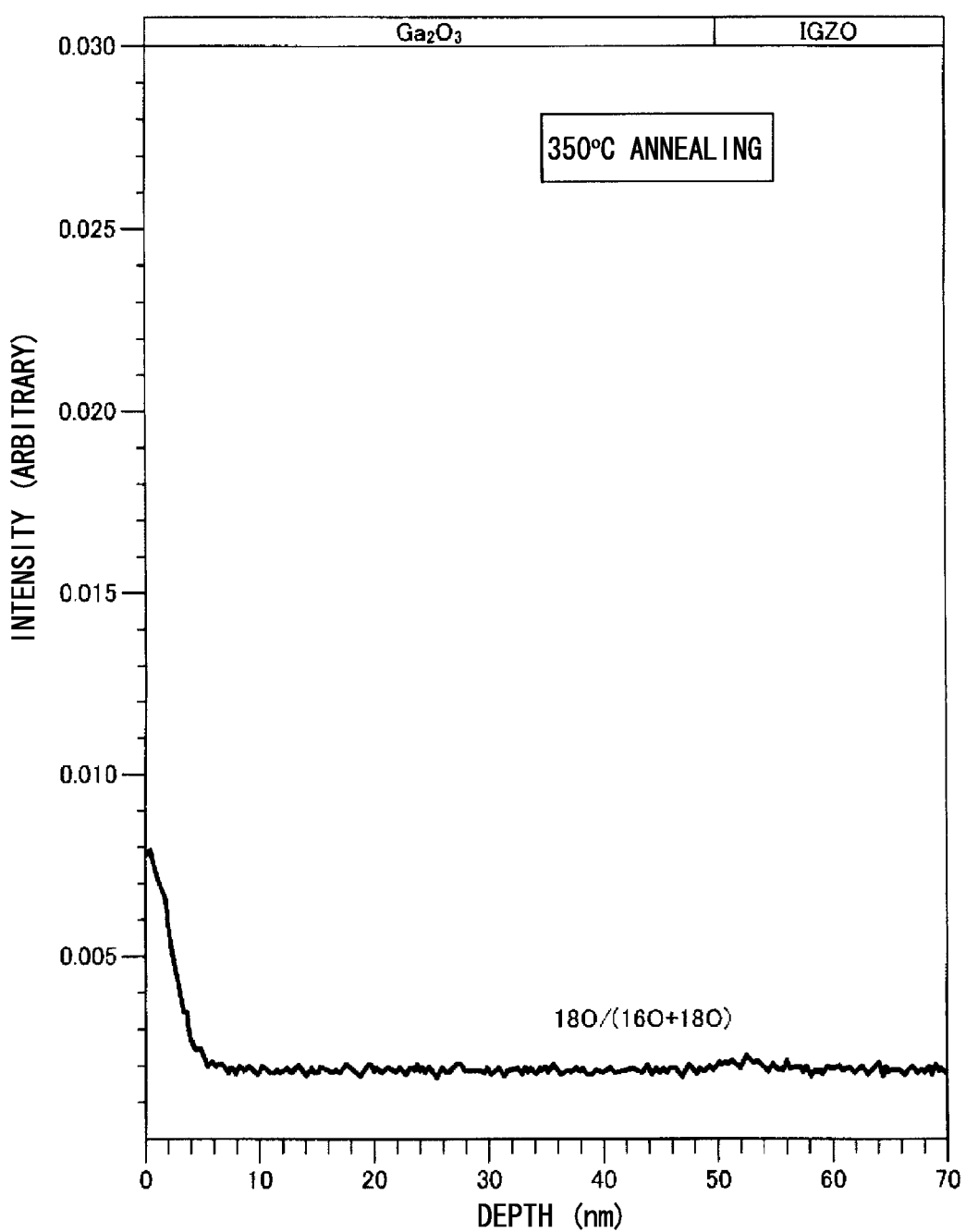
FIG. 25 is a diagram showing SIMS analysis results of a sample of an Example 4-2.
Figure 26:
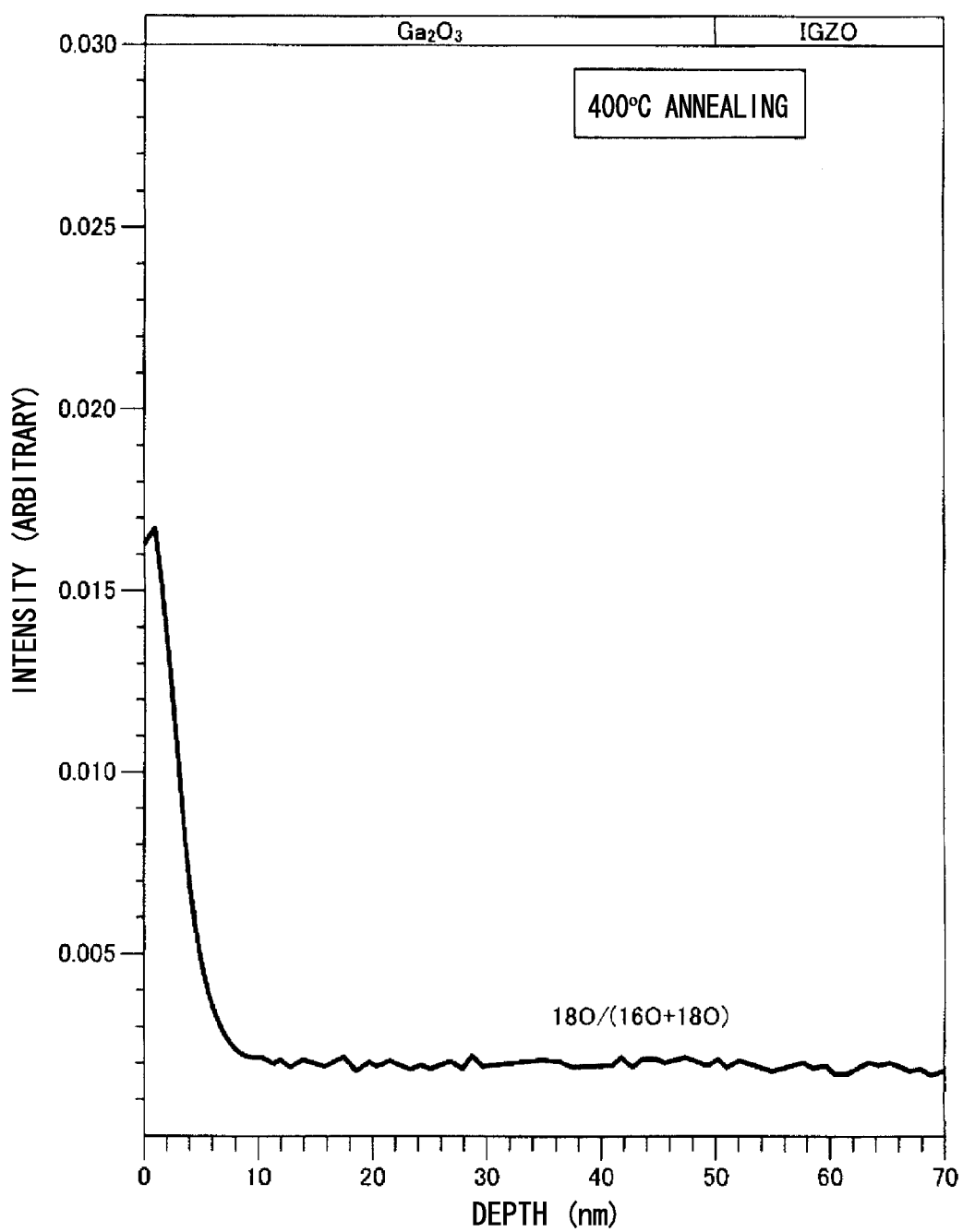
FIG. 26 is a diagram showing SIMS analysis results of a sample of an Example 4-3.
Figure 27:
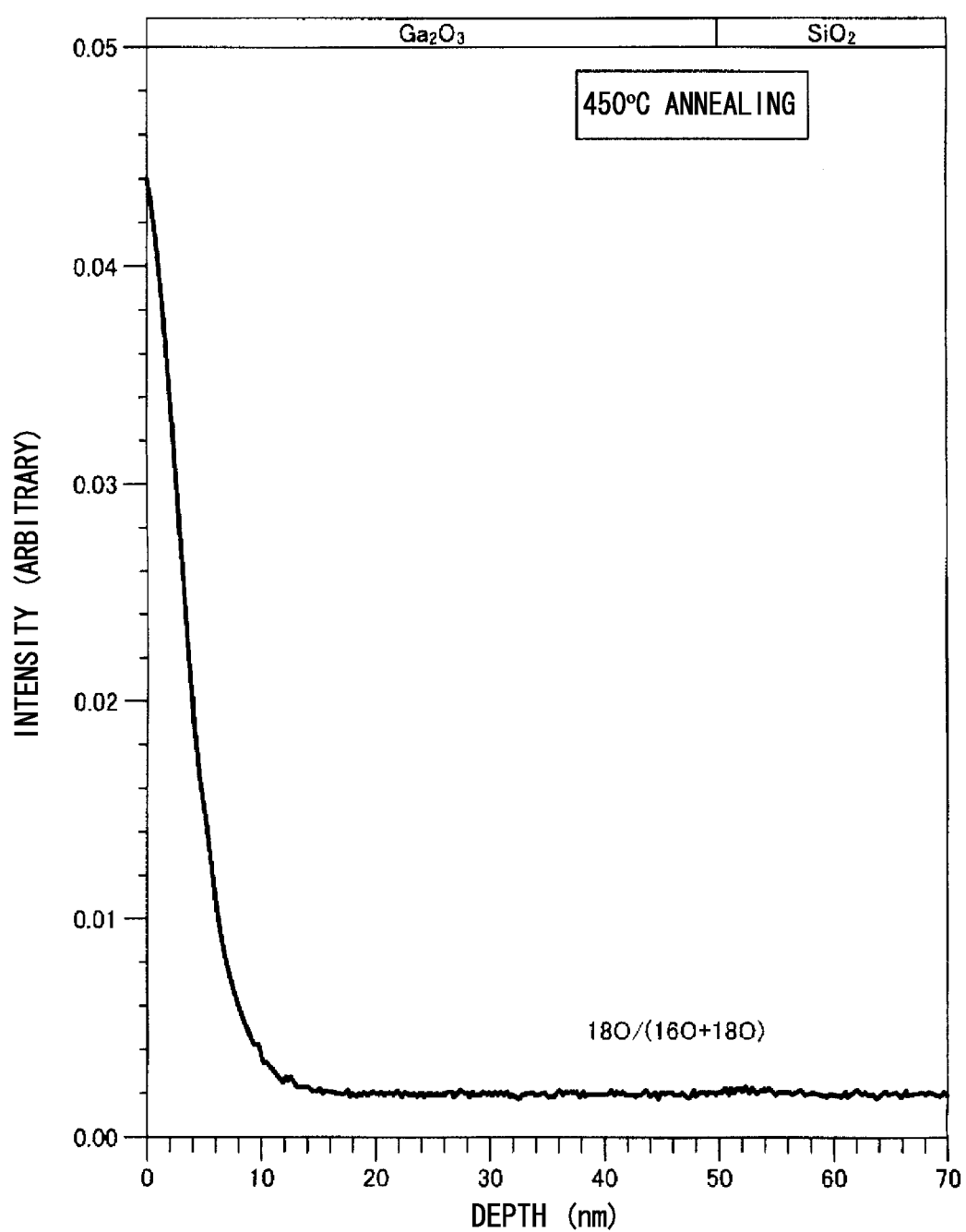
FIG. 27 is a diagram showing SIMS analysis results of a sample of an Example 4-4.

FIG. 24 is a diagram showing SIMS analysis results of the sample of Example 4-1. FIG. 25 is a diagram showing SIMS analysis results of the sample of Example 4-2. FIG. 26 is a diagram showing SIMS analysis results of the sample of Example 4-3. FIG. 27 is a diagram showing SIMS analysis results of the sample of Example 4-4.

From FIG. 24, it can be seen that in the sample of Example 4-1, with the heat treatment at 300° C., the oxygen did not actually diffuse (enter into the protective layer and the like). Looking at FIG. 25 to FIG. 27, it can be seen that the oxygen diffusion distance L increased as the heat treatment temperature rose.

Thus, from the analysis results in FIG. 24 to FIG. 27, a depth at which the intensity of $^{18}O/(O16+O18)$ started to rise, which is to say the diffusion distance L (nm) of O18 (=O16) was found for each heat treatment temperature, and these are summarized in Table 3.

TABLE 3

| Heat treatment temperature (° C.) | Diffusion distance L (nm) |
|---|---|
| 300 | 0 |
| 350 | 8 |
| 400 | 12 |
| 450 | 18 |

Figure 28:
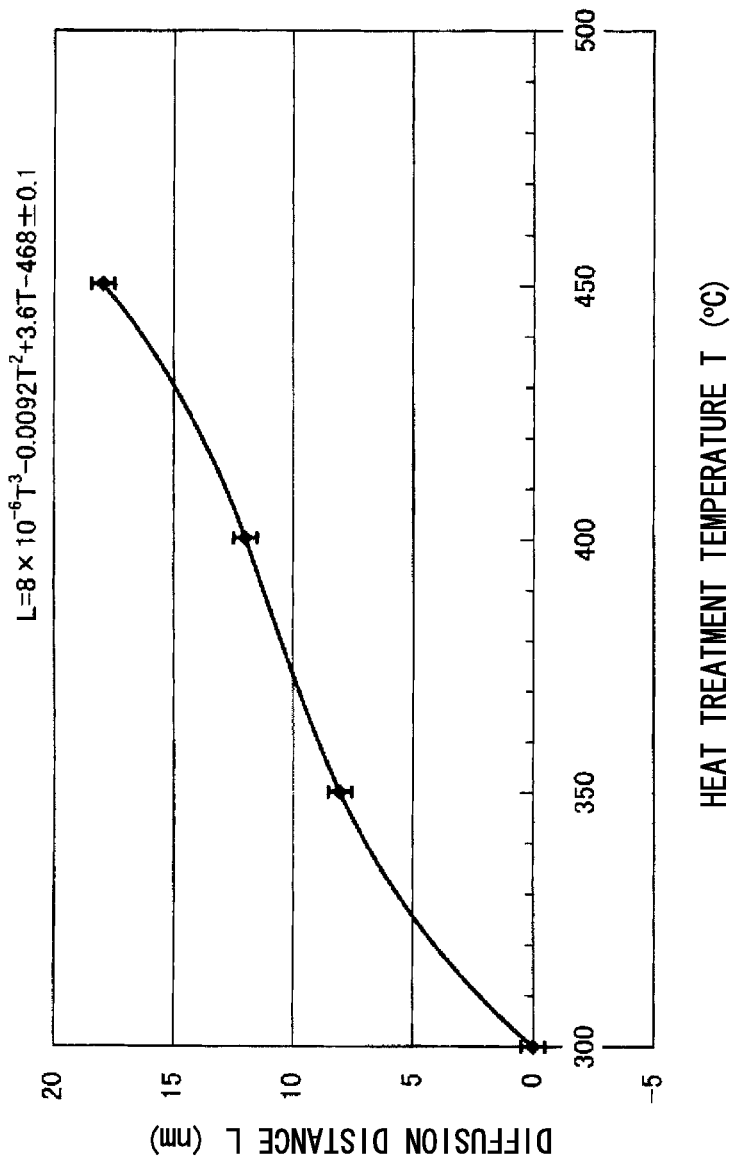
FIG. 28 is a graph plotting a relationship found between an oxygen diffusion distance L and a heat treatment temperature.

Next, a relationship between the oxygen diffusion distances L that had been found and the heat treatment temperatures T were plotted on a graph. FIG. 28 is the graph plotting the relationship found between the oxygen diffusion distance L and the heat treatment temperature.

Based on the plot in FIG. 28, an approximation curve of a third order relationship representing the relationship between the oxygen diffusion distance L and the heat treatment temperature was calculated. The results of this calculation provided the relational expression $L=8\times10^{-6}\times T^3-0.0092\times T^2+3.6\times T-468\pm0.1$. Here, "±0.1" represents measurement (and calculation) errors. Error bars are shown in the graph, but are shown as being greater than ±0.1 so as to be easily visible.

From the results described above, if the case in which, for example, the heat treatment temperature is 400° C. is taken as an example, then as shown in FIG. 26, it can be seen that the O18 from the oxidizing atmosphere diffused (embedded) to about 12 nm into the gallium oxide film. Therefore, because the thickness of the protective layer at the time of the heat treatment in Example 3-1 was 50 nm, it can be seen from the relationship with the oxygen diffusion distance L (12 nm) that the oxygen did not reach the active layer boundary face. That is, it is likely that surface defects of the active layer that were caused by the formation of the protective layer (and may also have been caused by the formation of the active layer) could not be restored.

In contrast, because the thickness of the protective layer (the first insulation film 514) at the time of the heat treatment in Example 3-2 was 10 nm, it can be seen from the relationship with the oxygen diffusion distance L (12 nm) that the oxygen reached to around 2 nm inside the active layer boundary face that was in contact with the first insulation film 514. That is, it is likely that surface defects of the active layer that were caused by the formation of the protective layer (and may also have been caused by the formation of the active layer) could be restored.

Now, if the oxygen diffusion distance L changes in accordance with the material of the protective layer and the material of the active layer or the like, the results as described above may not occur. Accordingly, a sample of Example 4-5 was fabricated by the same method as the TFT 500 relating to Example 1-1 up to the formation of the active layer. Then the heat treatment was applied with the same heat treatment conditions as in Example 4-4 (with a heat treatment temperature of 400° C.), and the SIMS analysis was carried out without the protective layer being formed.

Figure 29:
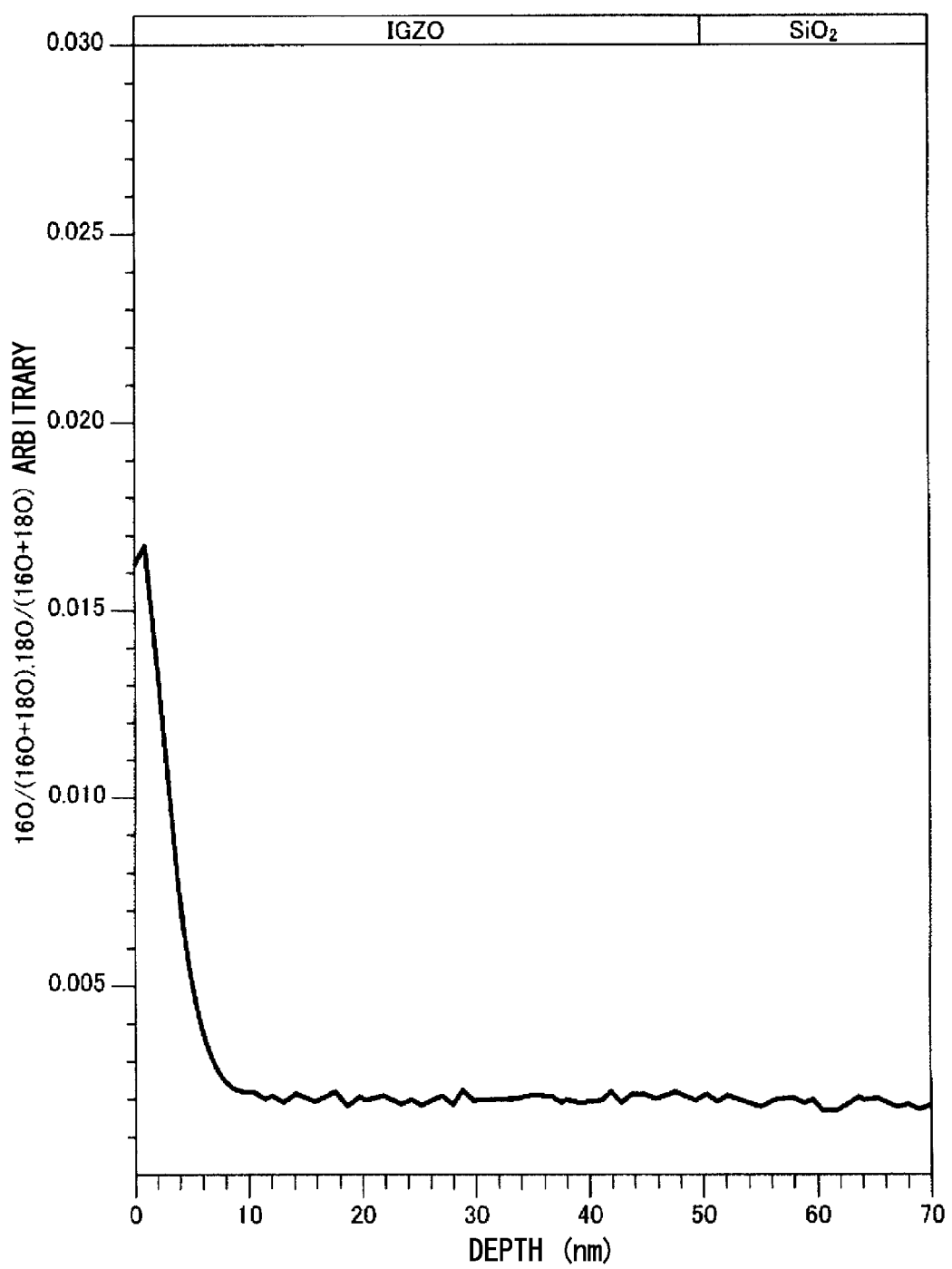
FIG. 29 is a diagram showing SIMS analysis results of a sample of an Example 4-5.

FIG. 29 is a diagram showing SIMS analysis results of a sample of Example 4-5.

From the results shown in FIG. 29, it can be seen that the O18 from the oxidizing atmosphere diffused (embedded) to about 12 nm into the IGZO film (active layer). This is the same result as in the case of Example 4-4, in which O18 from the oxidizing atmosphere diffused to about 12 nm into the gallium oxide film. Therefore, it seems that the oxygen diffusion distance L does not change with different materials in the protective layer and the active layer. This also provides a confirmation that the oxygen diffusion distance L does not change with film formation methods of the protective layer and active layer. For example, the oxygen diffusion distance L does not change whether a method using a single target for sputtering is used or co-sputtering is used.

From the above observations and conclusions and the results shown in Table 3, it can be concluded that oxygen reaches to inside the boundary face of the active layer that is in contact with the first insulation film 514 if the thickness Z of the first insulation film 514 satisfies the relational expression $Z<L=8\times10^{-6}\times T^3-0.0092\times T^2+3.6\times T-468\pm0.1$. The reason the condition $Z=L$ is not included in this relational expression is that it can be supposed that oxygen merely reaching the active layer boundary face may not satisfactorily repair surface defects inside the active layer.

Example 5

Investigation of the Level of Repair

Accordingly, to verify the above suppositions, an investigation was conducted into the extent to which surface defects inside the active layer were repaired, in relation to thicknesses of the protective layer (the first insulation film 514) with the heat treatment conditions being fixed (the heat treatment temperature being fixed at 400° C.), and ΔVth and the mobility were found for each thickness of the first insulation film 514.

Fabrication of Samples Relating to Example 5

For the fabrication of samples relating to Example 5, the same method was used as in the sample fabrication of Example 3-2 to fabricate TFT samples as shown in FIG. 19, with the thickness of the second insulation film 516 being fixed at 20 nm and the thickness of the first insulation film 514 being altered between 8 nm, 10 nm, 11 nm, 12 nm, 20 m and 50 nm. The sample in which the thickness of the first insulation film 514 was 8 nm is referred to as the sample relating to Example 5-1 (also referred to as Practical Example 2), the sample in which the thickness of the first insulation film 514 was 10 nm is referred to as the sample relating to Example 5-2 (also referred to as Practical Example 3), the sample in which the thickness of the first insulation film 514 was 11 nm is referred to as the sample relating to Example 5-3 (also referred to as Practical Example 4), the sample in which the thickness of the first insulation film 514 was 12 nm is referred to as the sample relating to Example 5-4 (also referred to as Comparative Example 2), the sample in which the thickness of the first insulation film 514 was 20 nm is referred to as the sample relating to Example 5-5 (also referred to as Comparative Example 3), and the sample in which the thickness of the first insulation film 514 was 50 nm is referred to as the sample relating to Example 5-6 (also referred to as Comparative Example 4).

—Evaluation of Light Illumination Characteristics—

An evaluation of light illumination characteristics was applied to the fabricated samples relating to Examples 5-1 to 5-6, measuring the Vg-Id characteristic, finding ΔVth and mobility, and the like. The evaluation of the light illumination characteristics was carried out using the same method as in Example 2.

Figure 30:
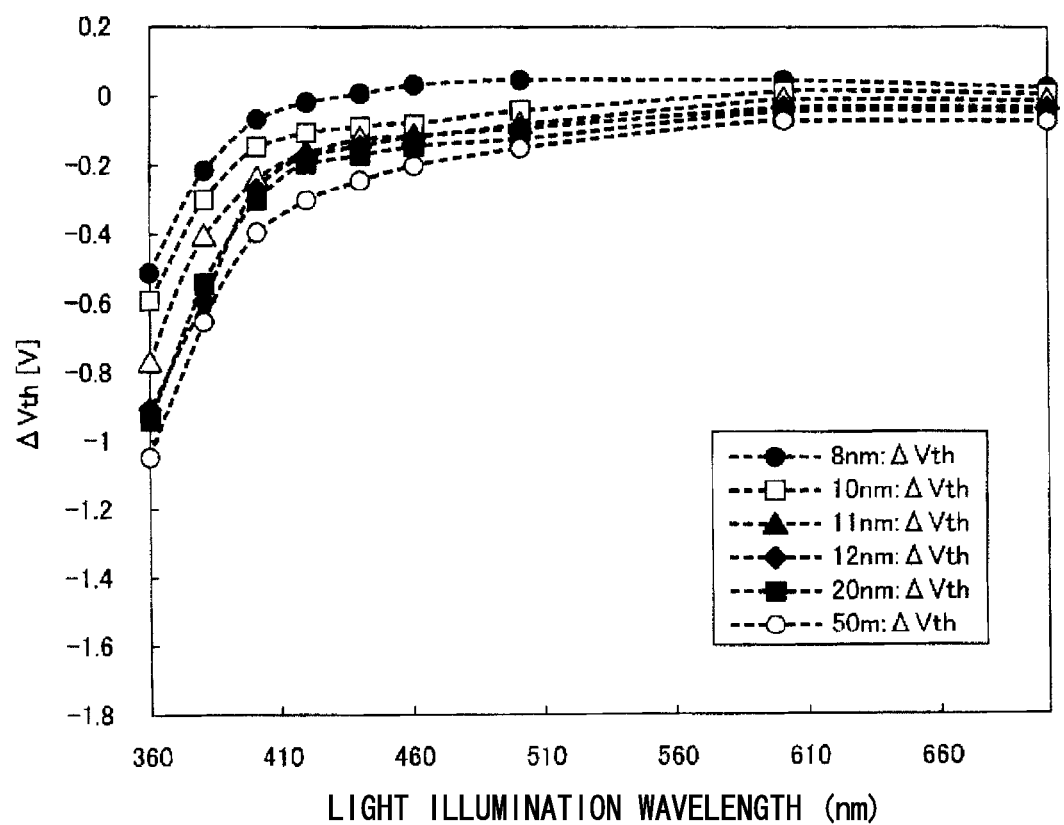
FIG. 30 is a diagram showing a relationship between wavelengths of light illuminated at samples relating to Examples 5-1 to 5-6 and ΔVth.

FIG. 30 is a diagram showing relationships between wavelengths of light illuminated at the samples relating to Examples 5-1 to 5-6 and ΔVth.

From the results shown in FIG. 30, ΔVth decreased (improved) as the thickness of the first insulation film 514 thinned from 50 nm to 8 nm. More particularly, the shorter the wavelength of illuminated light, the higher the level of improvement in ΔVth.

From the relationship with the oxygen diffusion distance L as investigated in Example 4 (12 nm in the case of a heat treatment temperature of 400° C.), there seems to be a question over the matter of ΔVth improving in the samples of Examples 5-3 to 5-5 in which oxygen is not expected to reach to inside the active layer boundary face. That is, there seems to be a question over the correctness of the supposition that whether or not surface defects inside the active layer can be mended depends on whether or not oxygen in the oxidizing atmosphere reaches through the first insulation film 514 to inside the active layer boundary face.

Figure 31:
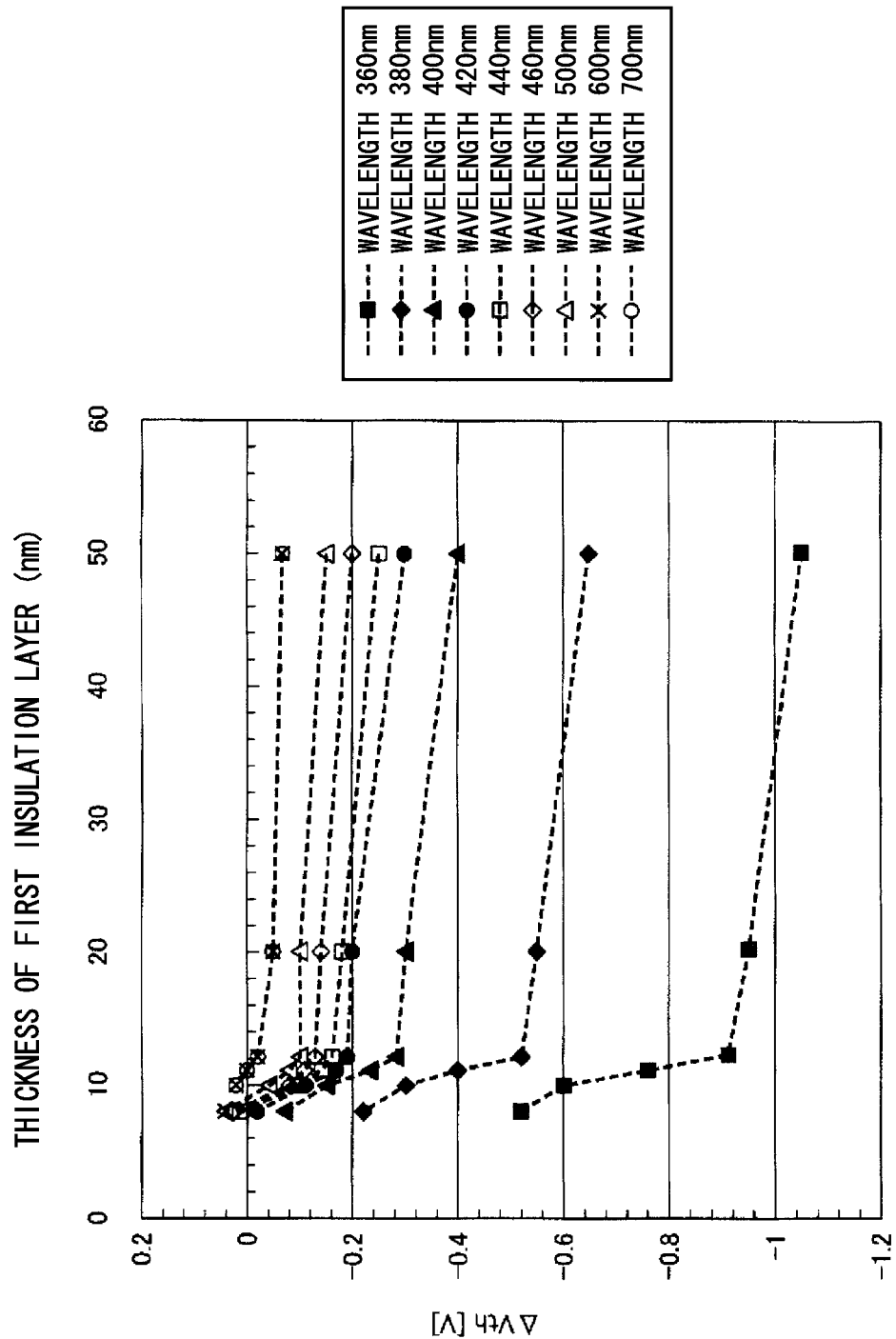
FIG. 31 is a diagram showing a relationship between thicknesses Z of first insulation layers in the samples relating to Examples 5-1 to 5-6 and ΔVth during light illumination.

Accordingly, the plots in FIG. 30 are redrawn as relationships between the thickness Z of the first insulation film 514 and ΔVth. FIG. 31 is a diagram showing the relationships between the thicknesses Z of the first insulation layer 514 in the samples relating to Examples 5-1 to 5-6 and ΔVth during light illumination. The values of ΔVth and mobility of the samples found in the above evaluation are summarized in Table 4 to Table 6.

TABLE 4

| | | Wavelength: 360 nm | | Wavelength: 380 nm | | Wavelength: 400 nm | |
|---|---|---|---|---|---|---|---|
| | Film thickness (nm) | ΔVth (V) | Mobility ($cm^2/V \cdot s$) | ΔVth (V) | Mobility ($cm^2/V \cdot s$) | ΔVth (V) | Mobility ($cm^2/V \cdot s$) |
| Practical Example 2 | 8 | −0.52 | 11.3 | −0.22 | 11.2 | −0.07 | 11.2 |
| Practical Example 3 | 10 | −0.6 | 11.4 | −0.3 | 11.3 | −0.15 | 11.2 |
| Practical Example 4 | 11 | −0.76 | 11.6 | −0.4 | 11.5 | −0.23 | 11.2 |
| Comparative Example 2 | 12 | −0.91 | 11.85 | −0.52 | 11.54 | −0.28 | 11.23 |
| Comparative Example 3 | 20 | −0.95 | 11.9 | −0.55 | 11.6 | −0.3 | 11.3 |
| Comparative Example 4 | 50 | −1.05 | 12.01 | −0.65 | 11.8 | −0.4 | 11.5 |

TABLE 5

| | | Wavelength: 420 nm | | Wavelength: 440 nm | | Wavelength: 460 nm | |
|---|---|---|---|---|---|---|---|
| | Film thickness (nm) | ΔVth (V) | Mobility ($cm^2/V \cdot s$) | ΔVth (V) | Mobility ($cm^2/V \cdot s$) | ΔVth (V) | Mobility ($cm^2/V \cdot s$) |
| Practical Example 2 | 8 | −0.02 | 11.1 | 0.01 | 11 | 0.03 | 11 |
| Practical Example 3 | 10 | −0.11 | 11.2 | −0.09 | 11.2 | −0.08 | 11.1 |
| Practical Example 4 | 11 | −0.17 | 11.2 | −0.14 | 11.2 | −0.12 | 11.2 |
| Comparative Example 2 | 12 | −0.19 | 11.2 | −0.16 | 11.2 | −0.13 | 11.1 |

TABLE 5-continued

| | Film thickness (nm) | Wavelength: 420 nm | | Wavelength: 440 nm | | Wavelength: 460 nm | |
|---|---|---|---|---|---|---|---|
| | | ΔVth (V) | Mobility (cm$^2$/V·s) | ΔVth (V) | Mobility (cm$^2$/V·s) | ΔVth (V) | Mobility (cm$^2$/V·s) |
| Comparative Example 3 | 20 | −0.2 | 11.2 | −0.18 | 11.2 | −0.14 | 11.1 |
| Comparative Example 4 | 50 | −0.3 | 11.5 | −0.25 | 11.5 | −0.2 | 11.3 |

TABLE 6

| | Film thickness (nm) | Wavelength: 500 nm | | Wavelength: 600 nm | | Wavelength: 700 nm | |
|---|---|---|---|---|---|---|---|
| | | ΔVth (V) | Mobility (cm$^2$/V·s) | ΔVth (V) | Mobility (cm$^2$/V·s) | ΔVth (V) | Mobility (cm$^2$/V·s) |
| Practical Example 2 | 8 | 0.04 | 10.9 | 0.04 | 10.8 | 0.03 | 10.8 |
| Practical Example 3 | 10 | −0.04 | 11.1 | 0.02 | 11 | 0.02 | 11 |
| Practical Example 4 | 11 | −0.08 | 11.1 | 0 | 11.1 | 0 | 11.1 |
| Comparative Example 2 | 12 | −0.1 | 11.1 | −0.02 | 11.2 | −0.02 | 11.1 |
| Comparative Example 3 | 20 | −0.1 | 11.2 | −0.05 | 11.2 | −0.05 | 11.1 |
| Comparative Example 4 | 50 | −0.15 | 11.3 | −0.07 | 11.2 | −0.07 | 11.3 |

From the results shown in FIG. 31 and Table 4 to Table 6, for the samples of Examples 5-4 to 5-6 (the samples referred to as Comparative Examples 2 to 4 in which the thickness Z of the first insulation film 514 was 12, 20 and 50 nm), in which oxygen is not expected to reach to inside the active layer boundary face according to the relationship with the oxygen diffusion distance L as investigated in Example 4 (12 nm when the heat treatment temperature is 400° C.), it can be seen that ΔVth hardly improved at all when the thickness Z of the first insulation film 514 was reduced within that range. For example, ΔVth only improved at the level of the third or fourth decimal place for each 1 nm reduction in thickness. It can be seen that the same conclusion applies even if the wavelength of light illumination is altered.

In contrast, when the thickness Z of the first insulation film 514 was the other side of 12 nm, in the samples of Examples 5-1 to 5-3 (the samples referred to as Practical Examples 2 to 4 in which the thickness Z of the first insulation film 514 was 8, 10 and 11 nm), it can be seen that ΔVth improved rapidly as the thickness Z of the first insulation film 514 was reduced within that range. Thus, ΔVth improves (approaching 0 V) remarkably, at the level of the first or second decimal place for each 1 nm reduction in thickness. In particular, in cases of light illumination with short wavelengths of 400 nm or less, ΔVth improves at the level of the first decimal place per 1 nm, which is even more rapid (and remarkable).

Specifically, in the case of light illumination with the short wavelength of 400 nm, when the thickness of the first insulation film 514 was 12 nm or more, the rate of improvement in ΔVth per nanometer was only about 0.003 V/nm, and when the thickness of the first insulation film 514 was less than 12 nm, the improvement was dramatic at about 0.16 V/nm.

In a case of light illumination at a wavelength of 700 nm or more, ΔVth went from a negative value through zero to a positive value within the above range of thicknesses Z of the first insulation film 514 (Z=8, 10 or 11 nm). Therefore, it can be seen that light illumination with wavelengths of less than 700 nm is preferable.

From the results described above, it can be seen that, even if the thickness Z of the first insulation film 514 is not adjusted in relationship with the heat treatment temperature T (even if the thickness Z is made thicker), when a heat treatment over at least 300° C. is applied, ΔVth during light illumination may be improved (TFT characteristics may be stabilized) by, rather than oxygen in the oxidizing atmosphere, oxygen in the first insulation film 514 or oxygen passing through portions other than the first insulation film 514 (side faces and the like) being supplied to inside the boundary face of the active layer 18 that is in contact with the first insulation layer 24, but this improvement is very slight. As in the questions raised hereabove, in answer to the question over the correctness of the supposition that whether or not surface defects inside the active layer can be restored depends on whether or not oxygen in the oxidizing atmosphere reaches through the first insulation film 514 to inside the active layer boundary face, levels of improvement of ΔVth clearly differ between the samples to one side and the other of the sample of Example 5-4 (Comparative Example 2), which satisfies the condition L=Z=12 at which oxygen in the oxidizing atmosphere just reaches through the first insulation film 514 to the active layer boundary face. Therefore, the conclusion that whether surface defects inside the active layer can be satisfactorily repaired depends on whether oxygen in the oxidizing atmosphere reaches through the first insulation film 514 to inside the active layer boundary face stands.

Further, although the heat treatment temperature T was fixed at 400° C., it is likely that the above conclusion does not change even with other heat treatment temperatures. Ultimately, the conclusion is reached that, if the thickness of the first insulation film 514 and the heat treatment temperature are adjusted such that—if the thickness of the first insulation film 514 is represented by Z (nm), the heat treatment temperature in the third step is represented by T (° C.) and the diffusion distance of oxygen is represented by L (nm)—the relational expression $0<Z<L=8\times10^{-6}\times T^3-0.0092\times T^2+3.6\times T-468\pm0.1$ is satisfied, then oxygen in the oxidizing atmosphere may be supplied through the first insulation film to inside the surface of the active layer, surface defects of the active layer damaged by the film formation of the second step may be satisfactorily rectified, and element characteristics such as ΔVth during light illumination and the like may be stabilized remarkably.

Further yet, from the results shown in FIG. 31 and Table 4 to Table 6, it can be seen that if the heat treatment temperature T is 400° C., it is preferable to adjust the thickness Z of the first insulation film 514 to 11 nm or less, that is, to adjust the thickness of the first insulation film 514 and the heat treatment temperature so as to satisfy the relational expression $Z\leq(L-1.0)=8\times10^{-6}\times T^3-0.0092\times T^2+3.6\times T-468\pm0.1-1.0$. This is because, when the thickness of the first insulation film 514 is thinner within this range, ΔVth improves even more remarkably, and ΔVth is improved to above −0.8 V for any wavelength of illuminated light at 360 nm or above.

Further again, from the results shown in FIG. 31 and Table 4 to Table 6, it can be seen that if the heat treatment temperature T is 400° C., it is preferable to adjust the thickness Z of the first insulation film 514 to 10 nm or less, that is, to adjust the thickness of the first insulation layer 514 and the heat treatment temperature so as to satisfy the relational expression $Z\leq(L-2.0)=8\times10^{-6}\times T^3-0.0092\times T^2+3.6\times T-468\pm0.1-2.0$. With wavelengths of light illumination above 360 nm, ΔVth is improved to not less than −0.6 V whatever the wavelength. This is because ΔVth is thus improved to −0.6 V or higher for any wavelength of illuminated light at 360 nm or above.

Figure 32:
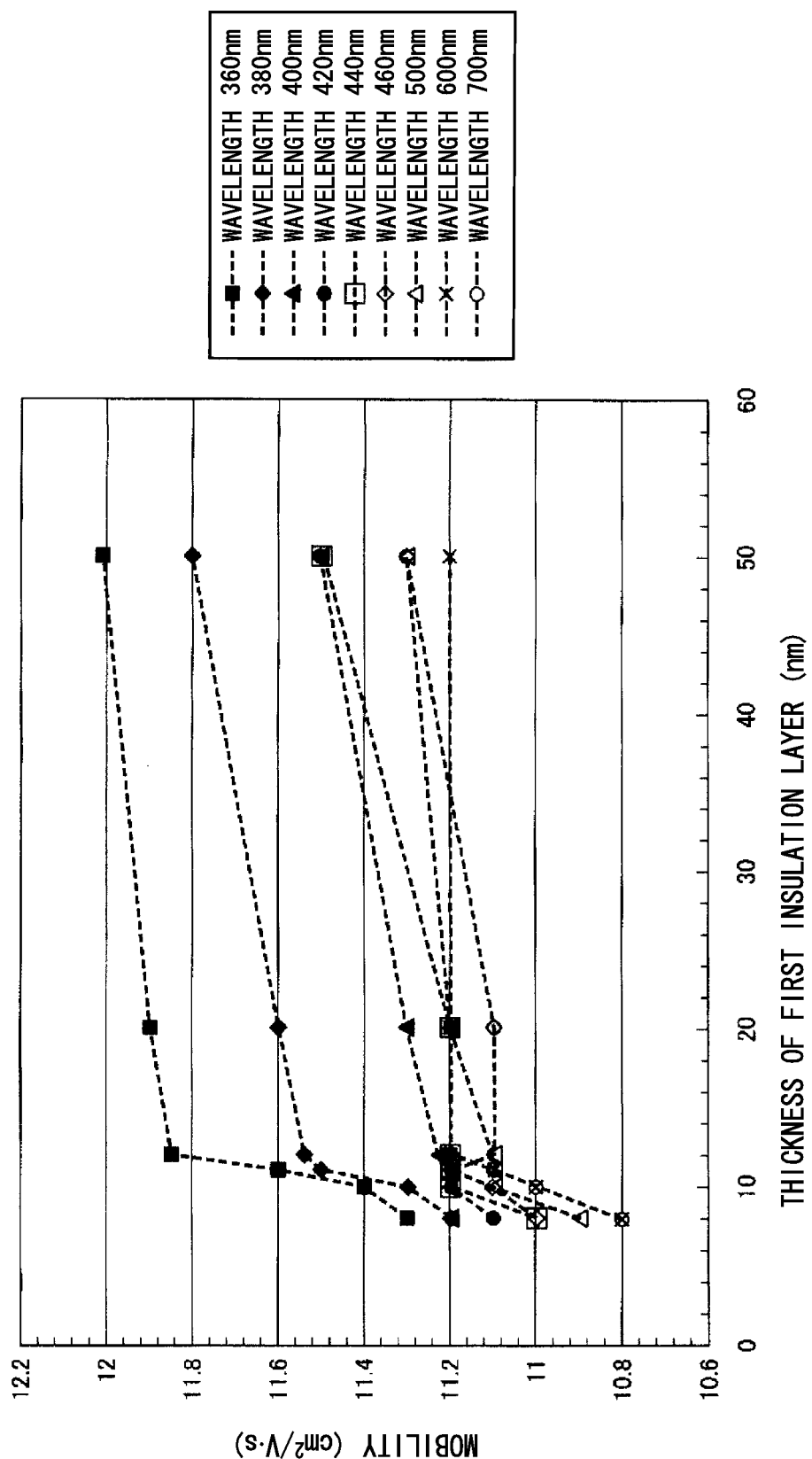
FIG. 32 is a diagram showing a relationship between thicknesses Z of first insulation layers in the samples relating to Examples 5-1 to 5-6 and mobility during light illumination.

FIG. 32 is a diagram showing relationships between the thicknesses Z of the first insulation film 514 in the samples relating to Examples 5-1 (Practical Example 2) to 5-6 (Comparative Example 4) and mobility during light illumination.

In regard to mobility, from FIG. 32 and Table 4 to Table 6, it can be seen that, at short wavelength of less than 420 nm, in contrast with ΔVth, the mobility rapidly declined when the thickness Z of the first insulation film 514 was reduced past 12 nm. This is evidence that surface defects of the active layer, which operate as carriers, are rectified by oxygen being supplied through the first insulation film 514 to inside the active layer boundary face.

This decrease in mobility is remarkable and is not preferable for TFTs. Therefore, in order to avoid this decrease, it can be seen that it is preferable to at least adjust the thickness of the first insulation film 514 to 7 nm or more in the case in which the heat treatment temperature is 400° C., that is, to adjust the thickness of the first insulation film 514 and the heat treatment temperature so as to satisfy the relational expression $(L-5.0)=8\times10^{-6}\times T^3-0.0092\times T^2+3.6\times T-468\pm0.1-5.0\leq Z$.

For light wavelengths of 420 nm and above, the rapid decrease in mobility is bounded where the thickness Z of the first insulation film 514 is 10 nm or 11 nm. Therefore, it can be seen that it is preferable to adjust the thickness to at least 10 nm or more in the case of 400° C., that is, to adjust the thickness of the first insulation film 514 and the heat treatment temperature so as to satisfy the relational expression $(L-2.0)=8\times10^{-6}\times T^3-0.0092\times T^2+3.6\times T-468\pm0.1-2.0\leq Z$. With light illumination at longer wavelengths, the mobility in the active layer does not substantially change (decrease).

Given that the mobility does not change with further changes of the wavelength, in a case in which the heat treatment temperature is 400° C., it is preferable to adjust the thickness to at least 11 nm or more, that is, to adjust the thickness of the first insulation film 514 and the heat treatment temperature so as to satisfy the relational expression $(L-1.0)=8\times10^{-6}\times T^3-0.0092\times T^2+3.6\times T-468\pm0.1-2.0\leq Z$.

If Table 4 to Table 6 in which the heat treatment was applied at 400° C. after the formation of the first insulation film 514 are compared with Table 2 showing the results when the heat treatment was applied at 400° C. just after the active layer was formed and a protective layer such as the first insulation film 514 or the like was not formed, it can be seen that ΔVth when the first insulation film 514 was formed to a thickness Z of 10 nm and the heat treatment was applied was substantially equal to ΔVth when the heat treatment was applied at 400° C. directly after the active layer was formed. In other words, it can be seen that substantially 100% of surface defects produced when the first insulation film 514 was formed were rectified. Furthermore, it can be seen that ΔVth when the first insulation film 514 was formed to a thickness Z of 8 nm and the heat treatment was applied was even better than when the heat treatment was applied at 400° C. directly after the active layer was formed. This is likely to be because the supply of oxygen also rectified surface defects produced when the active layer was formed.

Example 6

Investigation of Zinc Diffusion

Figure 33:
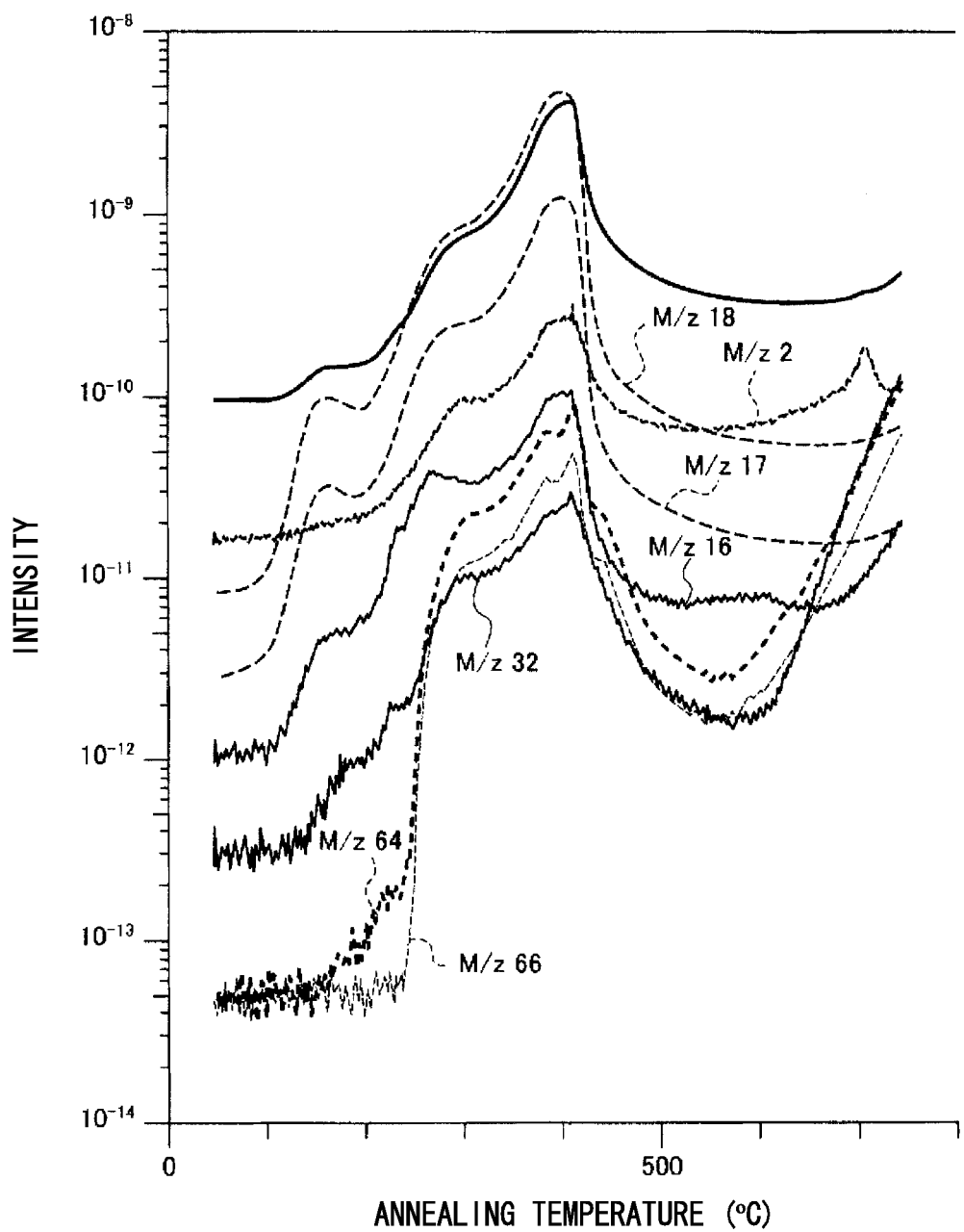
FIG. 33 is a diagram showing results of thermal desorption analysis in an Example 6.

Finally, a technique of verification based on zinc diffusion may be posited as a technique for verifying, after the completion of a TFT, whether or not the TFT has been fabricated using the fabrication method according to the Examples of the present invention (adjusting the thickness of the first insulation film 514 and the heat treatment temperature so as to satisfy the relational expression $0<Z<L=8\times10^{-6}\times T^3-0.0092\times T^2+3.6\times T-468\pm0.1$). This is because, for a sample in which an IGZO film is formed to 200 nm on a non-doped silicon substrate, states in which zinc in the IGZO (M/Z 64) is dispersed by low temperatures of 250° C. and above can be detected by thermal desorption analysis (see FIG. 33).

Accordingly, SIMS analysis was used to investigate whether or not zinc from the IGZO dispersed into other layers in contact with the IGZO film. A sample used for this analysis was, to be specific, formed by the same method as the TFT 500 relating to Example 1-1 up to the formation of the IGZO film that is the active layer, as shown in FIG. 19. The source electrode and drain electrode were not formed but a gallium oxide film with a thickness of 100 mm was formed to act as a protective layer. Then respective SIMS analyses were carried out with and without the heat treatment. Details of the analysis method are the same as in Example 4, so are not described here.

Figure 34:
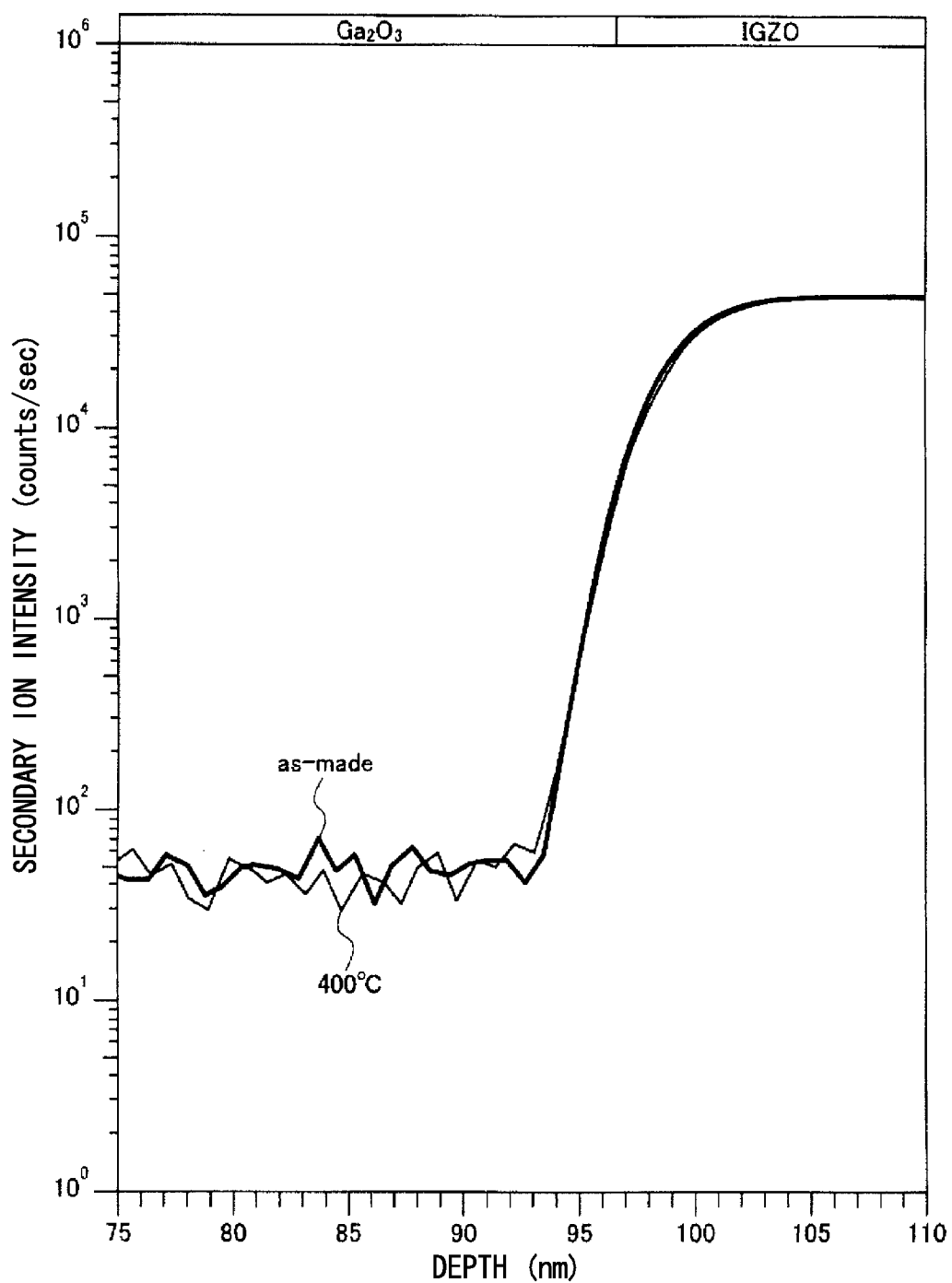
FIG. 34 is a diagram showing indium depths and secondary ion intensities according to SIMS analysis.
Figure 35:
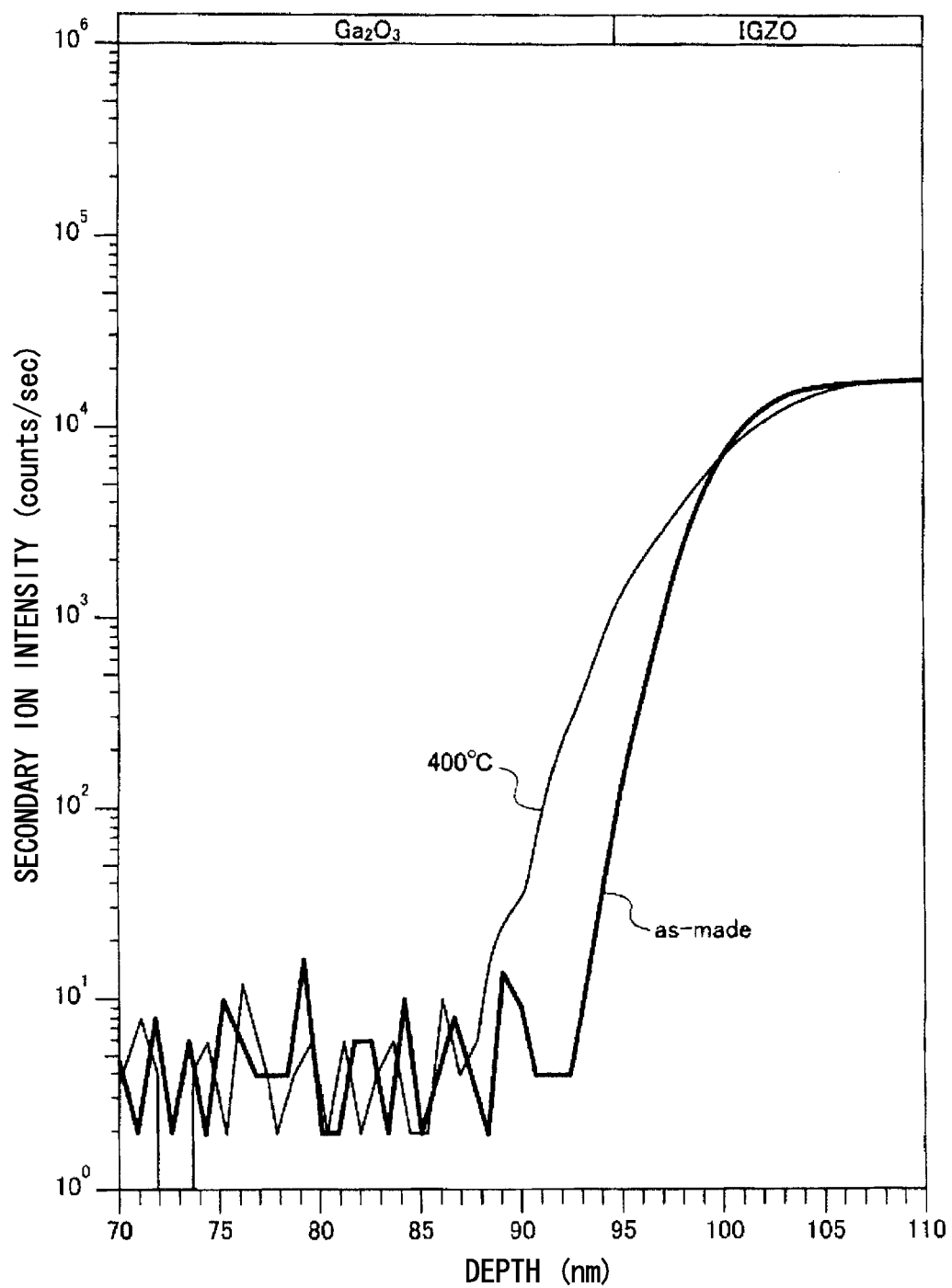
FIG. 35 is a diagram showing zinc depths and secondary ion intensities according to SIMS analysis.

FIG. 34 is a diagram showing indium depths and secondary ion intensities according to the SIMS analysis. FIG. 35 is a diagram showing zinc depths and secondary ion intensities according to the SIMS analysis.

From the results shown in FIG. 34, it can be seen that indium in the IGZO film did not substantially diffuse into the gallium oxide even with the heat treatment. In contrast, it can be seen that zinc in the IGZO film diffused into the gallium oxide film when the heat treatment was applied.

From the results described above, it seems that a verification technique based on zinc diffusion is useful as a technique for verifying, after a TFT is completed, whether or not the TFT has been fabricated using the fabrication method according to the Examples of the present invention (adjusting the thickness of the first insulation film 514 and the heat treatment temperature so as to satisfy the relational expression $0<Z<L=8\times10^{-6}\times T^3-0.0092\times T^2+3.6\times T-468\pm0.1$). A technique such as, for example, identifying whether or not there is a line (or a change in contrast) indicating zinc in a region corresponding to the first insulation film 514 in a sectional TEM observation, or the like can also be mentioned.

Example 7

Investigation of the Applicability of the Relational Expression to Other Materials Next, the aforementioned matter of "it seems that the oxygen diffusion distance L does not change with different materials in the protective layer" was investigated. That is, simply applying the above relational expression based on FIG. 28, $L=8\times10^{-6}\times T^3-0.0092\times T^2+3.6\times T-468\pm0.1$, when the first insulation film is not gallium oxide but another material such as, for example, a metal oxide was investigated.

Figure 36:
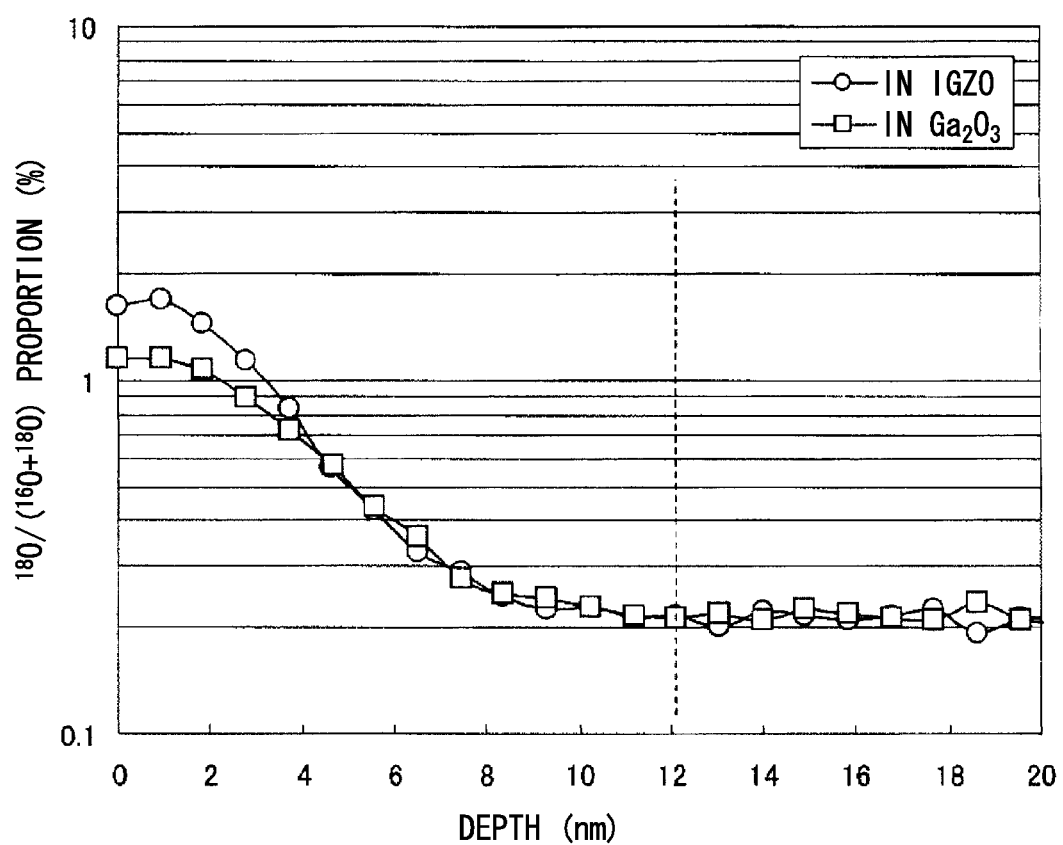
FIG. 36 is a diagram showing SIMS analysis results of the sample of Example 4-3 including a gallium oxide film and SIMS analysis results of the sample of Example 4-5 including an IGZO film (In:Ga:Zn=1:0.9:0.7).

FIG. 36 is a diagram showing SIMS analysis results of the sample of Example 4-3 with the gallium oxide film and SIMS analysis results of the sample of Example 4-5 with an IGZO film (In:Ga:Zn=1:0.9:0.7).

Figure 37:
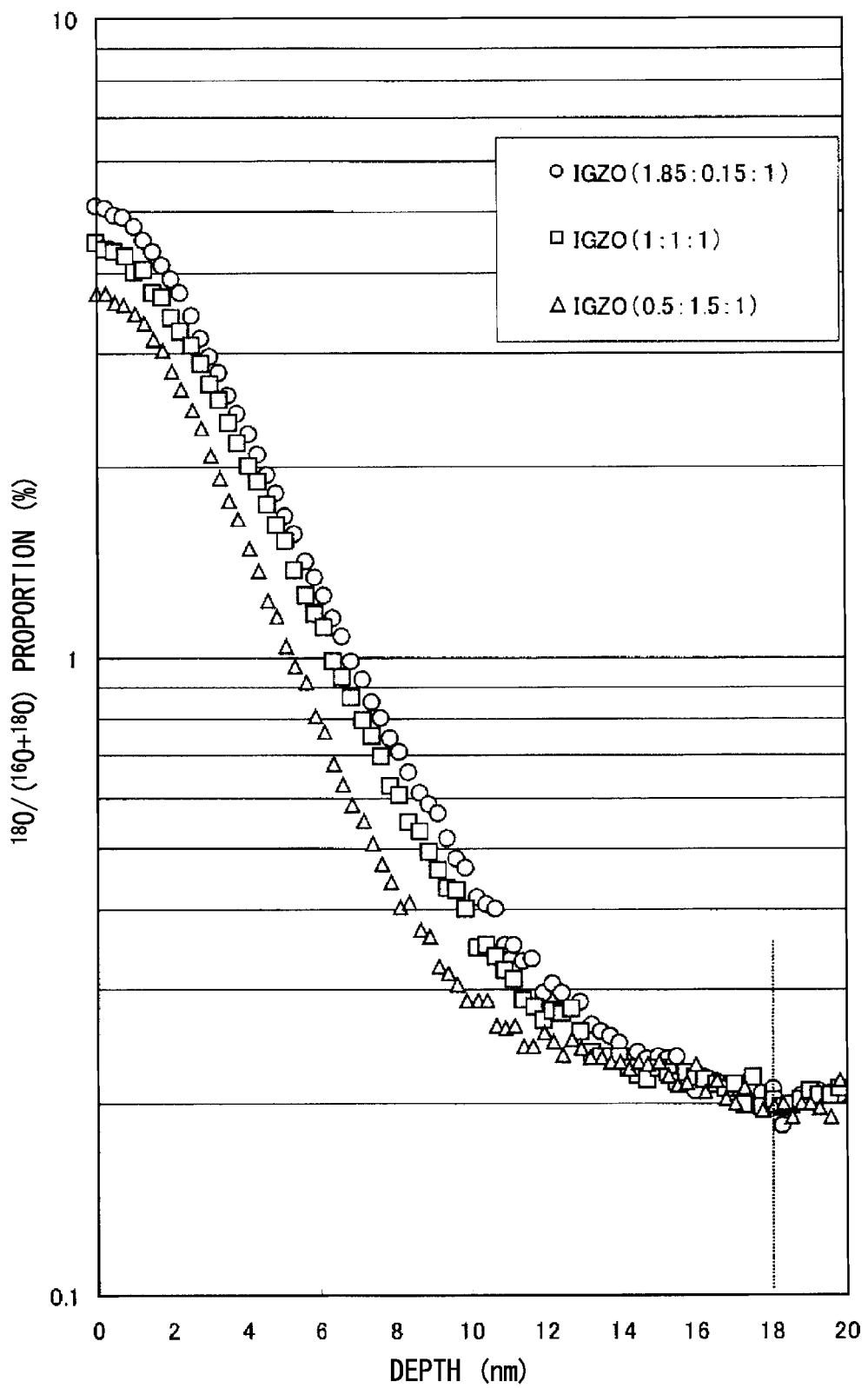
FIG. 37 is a diagram showing respective SIMS analysis results of three samples in which IGZO films are heat-treated under the same conditions as in Example 4-3 (with a heat treatment temperature of 450° C.), in which the composition ratios of indium, gallium and zinc are In:Ga:Zn=1.85:0.15:1, In:Ga:Zn=1:1:1 and In:Ga:Zn=0.5:1.5:1.

FIG. 37 is a diagram showing respective SIMS analysis results of three samples in which the heat treatment is applied to IGZO films under the same conditions as in Example 4-3 (with a heat treatment temperature of 450° C.), in which the composition ratios of indium, gallium and zinc are In:Ga:Zn=1.85:0.15:1, In:Ga:Zn=1:1:1 and In:Ga:Zn=0.5:1.5:1.

Figure 38:
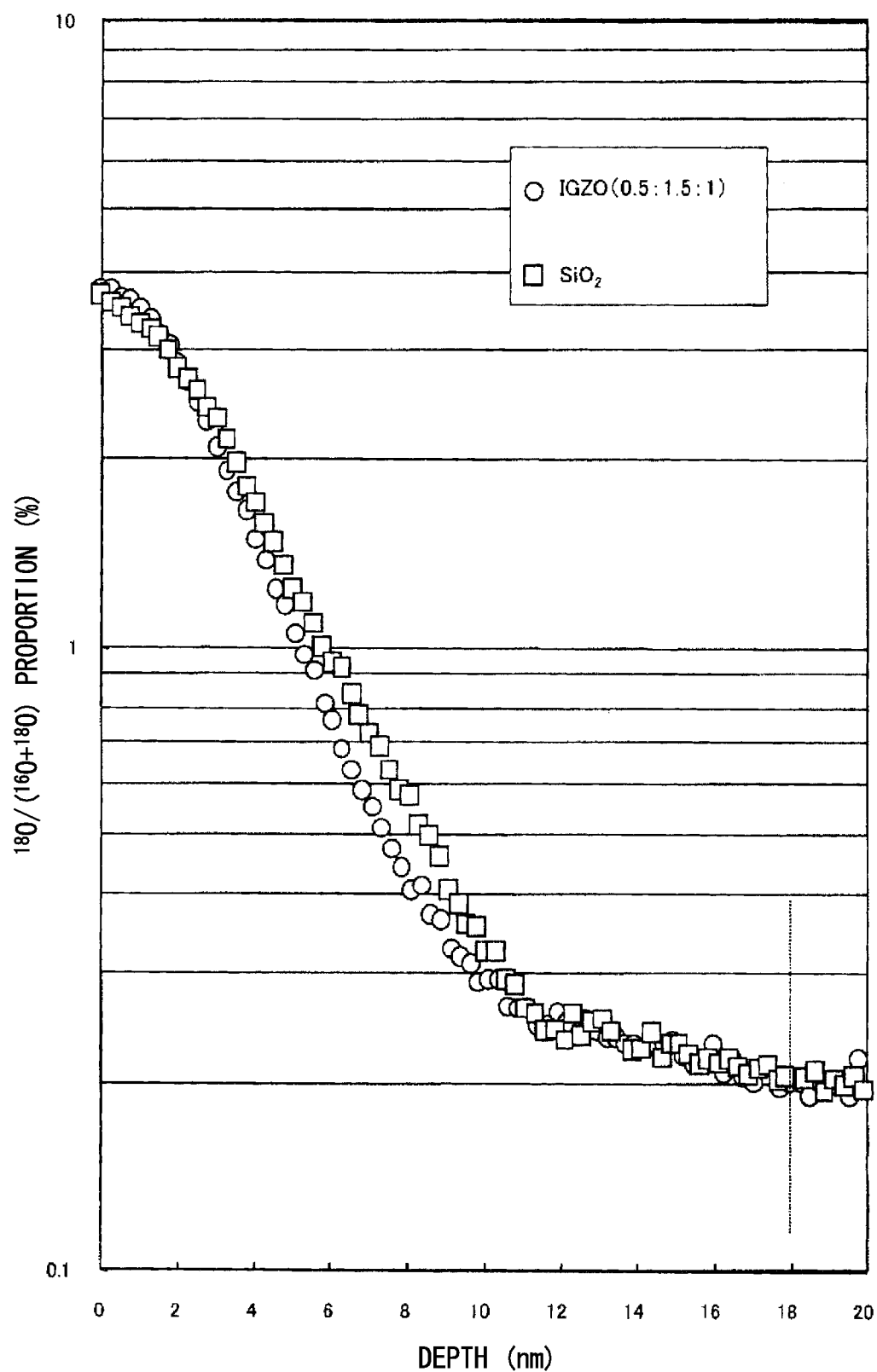
FIG. 38 is a diagram showing SIMS analysis results of a sample in which an IGZO film with a composition ratio of In:Ga:Zn=0.5:1.5:1 is heat-treated under the same conditions as in Example 4-3 (with a heat treatment temperature of 450° C.) and SIMS analysis results of a sample in which an $SiO_2$ film is heat-treated under the same conditions as in Example 4-3 (with a heat treatment temperature of 450° C.).

FIG. 38 is a diagram showing SIMS analysis results of a sample in which the heat treatment is applied to an IGZO film with a composition ratio of In:Ga:Zn=0.5:1.5:1 under the same conditions as in Example 4-3 (with a heat treatment temperature of 450° C.) and SIMS analysis results of a sample in which the heat treatment is applied to an $SiO_2$ film under the same conditions as in Example 4-3 (with a heat treatment temperature of 450° C.).

The SIMS analyses of the samples relating to FIG. 37 and FIG. 38 were carried out using the same method as the SIMS analyses described above.

From the SIMS analysis results shown in FIG. 36, it can be seen that, although the proportion $^{18}O/(^{16}O+^{18}O)$ differed between the experimental data relating to gallium oxide and the experimental data relating to IGZO, the distance from the surface at which the proportion $^{18}/(^{16}+^{18}O)$ started to be constant was the same. That is, from the experimental data, it can be seen that the diffusion distance L of $^{18}O$ (=$^{16}O$) into the gallium oxide film and the diffusion distance L of $^{18}O$ (=$^{16}O$) into the IGZO film (In:Ga:Zn=1:0.9:0.7) were the same, at 12 nm.

From this experimental evidence, the conclusion can be reached that the oxygen diffusion distance L is the same in a gallium oxide film and an IGZO film, and that the diffusion distance L is represented by $L=8\times10^{-6}\times T^3-0.0092\times T^2+3.6\times T-468\pm0.1$.

From the SIMS analysis results shown in FIG. 37, it can be seen that, even though the composition ratio of indium, gallium and zinc in the IGZO was changed between In:Ga:Zn=1.85:0.15:1, In:Ga:Zn=1:1:1 and In:Ga:Zn=0.5:1.5:1, the distance L from the surface at which the proportion $^{18}O/(^{16}O+^{18}O)$ started to be constant was the same, at 18 nm.

From this experimental evidence, the conclusion can be reached that the oxygen diffusion distance L is the same even when composition ratios of an IGZO film are different, and that the diffusion distance L is represented by $L=8\times10^{-6}\times T^3-0.0092\times T^2+3.6\times T-468\pm0.1$.

From the SIMS analysis results shown in FIG. 38, it can be seen that, although the proportion $^{18}O/(^{16}O+^{18}O)$ differed between the experimental data relating to IGZO (0.5:1.5:1) and the experimental data relating to $SiO_2$, the distance from the surface at which the proportion $^{18}O/(^{16}O+^{18}O)$ started to be constant was the same. That is, from the experimental data, it can be seen that the diffusion distance L of $^{18}O$ into the $SiO_2$ film and the diffusion distance L of $^{18}O$ (=$^{16}O$) into the IGZO film (In:Ga:Zn=0.5:1.5:1) were the same, at 18 nm.

If all the above experimental evidence of FIG. 36 to FIG. 38 is combined, the conclusion can be reached that the diffusion distance L of $^{18}O$, oxygen, does not change (there is no difference) provided the material is a material such as silicon dioxide, IGZO, gallium oxide or the like, and particularly a metal oxide, and is represented by the relational expression $L=8\times10^{-6}\times T^3-0.0092\times T^2+3.6\times T-468\pm0.1$.

That is, a conclusion can be reached that, if the oxygen diffusion distance L in a gallium oxide film is represented by $L=8\times10^{-6}\times T^3-0.0092\times T^2+3.6\times T-468\pm0.1$, this relational expression can be applied without modification even when the first insulation film is constituted by another material different from gallium oxide.

What is claimed is:

1. A method of manufacturing a semiconductor element, the method comprising:
    a first step of forming a semiconductor film of which a principal constituent is an oxide semiconductor;
    after the first step, a second step of forming a first insulation film on a surface of the semiconductor film;
    after the second step, a third step of applying a heat treatment in an oxidizing atmosphere; and,
    after the third step, a fourth step of forming a second insulation film on a surface of the first insulation film,
    wherein, during the second step and the third step, a thickness of the first insulation film and a temperature of the heat treatment in the third step are adjusted such that, if the thickness of the first insulation film is represented by Z (nm), the heat treatment temperature is represented by T (° C.) and a diffusion distance of oxygen into the first insulation film and the semiconductor film is represented by L (nm), the relational expression $0<Z<L=8\times10^{-6}\times T^3-0.0092\times T^2+3.6\times T-468\pm0.1$ is satisfied, and
    further comprising, after the fourth step, a fifth step of applying a heat treatment in an oxidizing atmosphere at a lower temperature than the heat treatment temperature of the third step.

2. The method according to claim 1 wherein, during the second step and the third step, the thickness of the first insulation film and the heat treatment temperature are adjusted such that the relational expression $Z\leq L-1.0$ is satisfied.

3. The method according to claim 2, wherein, during the second step and the third step, the thickness of the first insulation film and the heat treatment temperature are adjusted such that the relational expression $Z\leq L-2.0$ is satisfied.

4. The method according to claim 1, wherein, during the second step and the third step, the thickness of the first insulation film and the heat treatment temperature are adjusted such that the relational expression $L-5.0\leq Z$ is satisfied.

5. The method according to claim 1, wherein, during the second step and the third step, the thickness of the first insulation film and the heat treatment temperature are adjusted such that the relational expression $L-2.0\leq Z$ is satisfied.

6. The method according to claim 1, wherein, during the second step, the thickness Z of the first insulation film is adjusted to be at least 2 nm.

7. The method according to claim 1, wherein, during the second step and the fourth step, the first insulation film and the second insulation film are formed using a film formation technique that produces plasma.

8. The method according to claim 7, wherein, in the second step:
- a film formation rate is lower and a plasma potential is lower than in the film formation of the fourth step, or
- a film formation pressure is higher than in the film formation of the fourth step, or
- a combination thereof.

9. The method according to claim 7, wherein, in the second step, the first insulation film is formed at a film formation rate of 20 nm/minute or less.

10. The method according to claim 7, wherein, in the second step, the first insulation film is formed in a film formation duration that is shorter than a film formation duration in which the second insulation film is formed in the fourth step.

11. The method according to claim 1, wherein, in the first step, the thickness of the semiconductor film is formed to be at least 5 nm.

12. The method according to claim 1, wherein the temperature of the heat treatment of the fifth step is at least 100° C.

13. The method according to claim 12, wherein the temperature of the heat treatment of the fifth step is at least 300° C.

14. The method according to claim 1, wherein, in the fourth step, the second insulation film is formed with a greater thickness than the first insulation film.

15. The method according to claim 1, wherein the oxide semiconductor is a non-crystalline oxide including at least one of indium, gallium or zinc.

16. The method according to claim 1, wherein the heat treatment temperature in the third step is less than 600° C.

17. The method according to claim 1, wherein, in the second step, the first insulation film is formed on the entire surface of the semiconductor film.

18. The method according to claim 1, wherein:
- a constituent material of the second insulation film includes a metal, and
- the first insulation film includes both at least one metal portion of the constituent material of the second insulation film and at least one metal portion of a constituent material of the semiconductor film.

19. A method of manufacturing a field effect transistor, the method comprising:
- an electrode formation step of forming a gate electrode, a source electrode and a drain electrode; and
- before or during the electrode formation step, a non-electrode formation step of, using the semiconductor element manufacturing method according to claim 1, forming
  - the semiconductor film, which serves as an active layer, and
  - the first insulation film and the second insulation film, which serve as a protective layer of the semiconductor film, a gate insulation layer or a combination thereof.

20. The method according to claim 19, wherein the electrode formation step and the non-electrode formation step are carried out in a sequence such that the gate electrode is of a bottom gate type, and the first insulation film and the second insulation film are formed to serve as the protective layer of the semiconductor film.

21. The method according to claim 20, wherein a total thickness of the first insulation film and the second insulation film is at least 30 nm.

22. The method according to claim 19, wherein the formation of the source electrode and the drain electrode in the electrode formation step is carried out between the first step and the second step such that the source electrode and the drain electrode are of a top contact type, and
- a thickness of the source electrode and the drain electrode and the heat treatment temperature are adjusted such that, if the thickness of the source electrode and the drain electrode is represented by Y, the relational expression $0 < Y < L = 8 \times 10^{-6} \times T^3 - 0.0092 \times T^2 + 3.6 \times T - 468 \pm 0.1$ is satisfied.

23. The method according to claim 19, wherein the formation of the source electrode and the drain electrode in the electrode formation step is carried out before the first step such that the source electrode and the drain electrode are of a bottom contact type.

* * * * *